US006673512B1

(12) United States Patent
Uenishi et al.

(10) Patent No.: US 6,673,512 B1
(45) Date of Patent: Jan. 6, 2004

(54) NEGATIVE-WORKING RESIST COMPOSITION

(75) Inventors: Kazuya Uenishi, Shizuoka (JP); Yutaka Adegawa, Shizuoka (JP); Koji Shirakawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 23 days.

(21) Appl. No.: 09/760,806

(22) Filed: Jan. 17, 2001

(30) Foreign Application Priority Data

| | | |
|---|---|---|
| Jan. 17, 2000 | (JP) | P2000-008229 |
| May 23, 2000 | (JP) | P2000-151477 |
| Aug. 3, 2000 | (JP) | P2000-235949 |

(51) Int. Cl.[7] ........ G03F 7/003
(52) U.S. Cl. ........ 430/270.1; 430/296; 430/967
(58) Field of Search ........ 430/967, 270.1, 430/921, 914, 296

(56) References Cited

U.S. PATENT DOCUMENTS

| | | | | |
|---|---|---|---|---|
| 5,376,498 A | * | 12/1994 | Kajita et al. | 430/191 |
| 5,529,885 A | * | 6/1996 | Ochiai et al. | 430/270.1 |
| 5,534,381 A | * | 7/1996 | Ali et al. | 430/156 |
| 6,048,666 A | | 4/2000 | Niwa et al. | |
| 6,110,639 A | * | 8/2000 | Masuda et al. | 430/270.1 |
| 6,365,321 B1 | * | 4/2002 | Chen et al. | 430/270.1 |
| 2001/0006758 A1 | * | 7/2001 | Kai et al. | 430/270.1 |

FOREIGN PATENT DOCUMENTS

| | | | |
|---|---|---|---|
| EP | 0 633 499 A1 | | 1/1995 |
| EP | 0 898 201 A1 | | 2/1999 |
| EP | 1 076 261 A1 | | 2/2001 |
| JP | 01293339 | * | 11/1989 |
| JP | A-2-150848 | | 6/1990 |
| JP | A-6-67431 | | 3/1994 |
| JP | A-6-199770 | | 7/1994 |
| JP | A-7-311463 | | 11/1995 |
| JP | B-2505033 | | 4/1996 |
| JP | A-8-152717 | | 6/1996 |
| JP | A-10-10733 | | 1/1998 |
| JP | 10-16423 | | 1/1998 |
| JP | 10-254135 | * | 9/1998 |
| JP | 2000089459 | * | 3/2000 |

OTHER PUBLICATIONS

English translation of JP10–254135, Sep. 1998.*
Chemical Abstracts AN 1998:627436.*
Chemical Abstract 112:207982 (1990:207982), JP 01293339, Nov. 1989.*
Derwent Abstract of JP 2000089459, Mar. 2000.*
JPAB Abstract of JP 2000089459, Mar. 2000.*
Patent Abstracts of Japan (2000089459).
Patent Abstracts of Japan (01293339).
XP–002163990 (Feb. 26, 1993).
European Search Report.

* cited by examiner

*Primary Examiner*—Rosemary Ashton
(74) *Attorney, Agent, or Firm*—Sughrue Mion, PLLC

(57) ABSTRACT

A chemical amplification system negative-working resist composition for an electron beam and/or an X-ray, which is excellent in sensitivity and resolution and has a rectangular profile, comprising an alkali-soluble resin having structural units represented by the following general formula (a), a compound generating an acid by irradiation of the electron beam or the X-ray, and a crosslinking agent which initiates crosslinking by the acid:

(a)

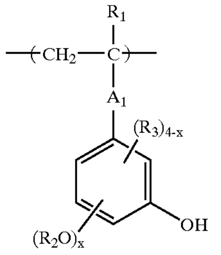

41 Claims, No Drawings

NEGATIVE-WORKING RESIST COMPOSITION

FIELD OF THE INVENTION

The present invention relates to a negative-working resist composition suitably used in an ultramicrolithography process or another photofabrication process for the production of VLSIs (very large scale integration) or high capacity microchips. More particularly, the invention relates to a negative-working photo resist composition which can form highly miniaturized patterns by use of X-rays or electron beams, and especially to a negative-working resist composition which can be suitably used in miniaturization processing of semiconductor devices by use of high energy beams such as electron beams.

BACKGROUND OF THE INVENTION

Integrated circuits have been progressively increased in their integration degree, and therefore processing of ultramicro patterns having a line width of a half micron or less has become necessary in the production of semiconductor substrates for VLSIs. For fulfilling this necessity, the wavelength of light used in an exposure apparatus employed for photolithography becomes progressively shorter, and now, far ultraviolet light and excimer laser light (such as XeCl, KrF or ArF) has been studied. Further, the formation of more micro patterns with electron beams or X-rays has been studied.

In particular, electron beams or X-rays are placed as advanced or further advanced technology of pattern formation, and the development of negative resists which can attain high sensitivity, high resolution and a rectangular profile has been desired.

Electron beam lithography is technology in which accelerated electron beams emit energy in the course of colliding with atoms constituting resist materials to cause scattering, thereby exposing the resist materials. The use of highly accelerated electron beams increases the rectilinear propagation and reduces the influence of electron scattering, which makes it possible to form rectangular patterns having high resolution. On the other hand, it increases the permeability of electron beams, resulting in lowered sensitivity. As described above, in the electron beam lithography, there is the trade-off relationship between the sensitivity and the resolution/resist shape, and it has been a problem how to allow them to be compatible with each other.

With respect to chemical amplification type negative resists, various alkali-soluble resins have hitherto been proposed. JP-A-8-152717 (the term "JP-A" as used herein means an "unexamined published Japanese patent application) discloses partially alkyl etherified polyvinylphenol, JP-A-6-67431 and JP-A-10-10733 disclose copolymers of vinylphenol and styrene, Japanese Patent No. 2505033 discloses novolak resins, and JP-A-7-311463 and JP-A-8-292559 disclose monodisperse polyvinylphenol. However, these alkali-soluble resins have not allowed the sensitivity under irradiation of electron beams or X-rays to be compatible with the resolution/resist shape.

In addition, with respect to chemical amplification type negative resists, various acid generating agents have hitherto been proposed. JP-B-8-3635 (the term "JP-B" as used herein means an "examined Japanese patent publication") discloses organic halogen compounds, JP-A-2-150848 and JP-A-6-199770 disclose iodonium salts and sulfonium salts, JP-A-2-52348, JP-A-4-367864 and JP-A-4-367865 disclose acid generating agents containing Cl or Br, JP-A-4-210960 and JP-A-4-217249 disclose diazodisulfone and diazosulfone compounds, JP-A-4-226454 discloses triazine compounds, and JP-A-3-87746, JP-A-4-291259, JP-A-6-236024 and U.S. Pat. No. 5,344,742 disclose sulfonate compounds. However, these acid generating agents have failed to overcome the trade-off relationship between the sensitivity and the resolution/resist shape under irradiation of electron beams.

Further, as to crosslinking agents, methylolmelamine, resol resins, epoxidated novolak resins and urea resins have hitherto been used. However, these crosslinking agents are unstable to heat, so that they have a problem with regard to storage stability when used in resist solutions. Furthermore, they have failed to satisfy required characteristics of high sensitivity, high resolution and rectangular resist shape under irradiation of electron beams.

SUMMARY OF THE INVENTION

It is therefore an object of the invention to solve the problems in respect to techniques for improving the original performance in miniaturization processing of semiconductor devices using electron beams or X-rays, and to develop chemical amplification system negative-working resist compositions for electron beams or X-rays satisfying the characteristics of sensitivity and resolution/resist shape to the use of the electron beams or the X-rays.

As a result of intensive studies, the present inventors have known that the above-mentioned various objects of the invention are attained by the use of specific alkali-soluble resins, depending on the type of radiation-sensitive composition, thus completing the invention.

That is to say, these and other objects of the invention are attained by the following:

(1) A chemical amplification system negative-working resist composition for an electron beam and/or an X-ray comprising an alkali-soluble resin having structural units represented by the following general formula (a), a compound generating an acid by irradiation of the electron beam or the X-ray, and a crosslinking agent which initiates crosslinking by the acid:

(a)

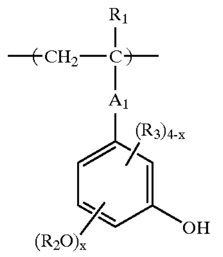

wherein $R_1$ represents a hydrogen atom, a halogen atom, a cyano group, or an alkyl, oxyalkyl or haloalkyl group which may have a substituent; X represents an integer of from 0 to 3; $R_2$ represents a hydrogen atom, or an alkyl, cycloalkyl, alkenyl, aralkyl, aryl or acyl group which may have a substituent, wherein a plurality of $R_2$'s are present, they maybe the same or different; $R_3$ represents a hydrogen atom, a halogen atom, a cyano atom, or an alkyl, cycloalkyl, alkenyl, aralkyl or aryl group which may have a substituent, wherein a plurality of $R_3$'s are present, they may be the same or different; two of the plurality of $R_2$'s, two of the plurality of $R_3$'s, or $R_2$ and $R_3$ may combine with each other to form a ring; $A_1$ represents a single bond, or a divalent alkylene, alkenylene, cycloalkylene or arylene group which may have a substituent, or —O—, —$SO_2$—, —O—CO—$R_5$—, —CO—O—$R_6$— or —CO—N($R_7$)—$R_8$—, wherein $R_5$, $R_6$ and $R_8$, which may be the same or different, each represents a single bond, or a divalent alkylene, alkenylene, cycloalkylene or arylene group which may have an ether group, an ester group, an amido group, a urethane group or a ureido group and may further have a substituent, and $R_7$ represents a hydrogen atom, or an alkyl, cycloalkyl, aralkyl or aryl group which may have a substituent;

(2) The negative-working resist composition described in the above (1), wherein the alkali-soluble resin is a resin containing structural units represented by the following general formula (1):

(1)

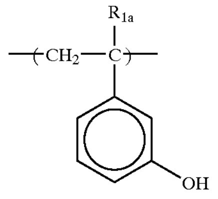

wherein $R_{1a}$ represents a hydrogen atom or a methyl group;

(3) The negative-working resist composition described in the above (1), wherein the alkali-soluble resin is a resin represented by the following general formula (2):

(2)

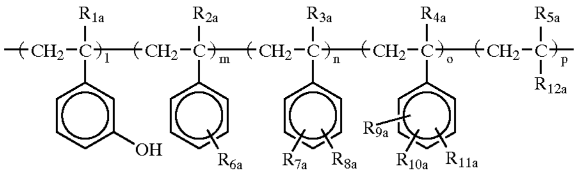

wherein $R_{1a}$ to $R_{5a}$ each independently represents a hydrogen atom or a methyl group; $R_{6a}$ to $R_{11a}$ each represents a hydrogen atom, an alkyl or alkoxyl group having from 1 to 4 carbon atoms, a hydroxyl group or —C(=O)O—$R_{14a}$, wherein $R_{4a}$ represents a hydrogen atom or an alkyl group having from 1 to 4 carbon atoms; $R_{12a}$ represents —$COOR_{15a}$, wherein $R_{15a}$ represents a hydrogen atom or an alkyl group having from 1 to 4 carbon atoms; and $0<l\leq 100$, $0\leq m,n,o,p<100$ and $l+m+n+o+p=100$;

(4) The negative-working resist composition described in the above (1), (2) or (3), wherein the radiation-sensitive acid generating agent contains at least one of compounds represented by the following general formulas (I) to (III):

(I)

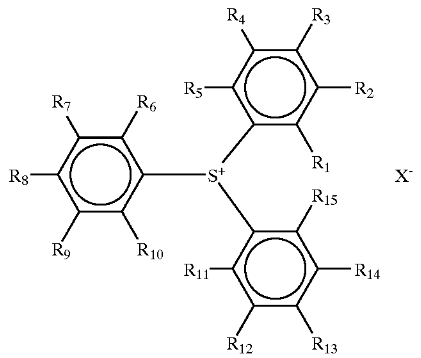

(II)

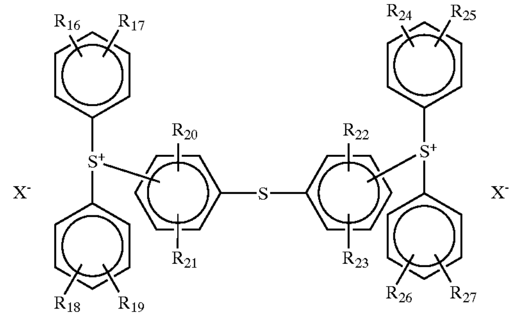

(III)

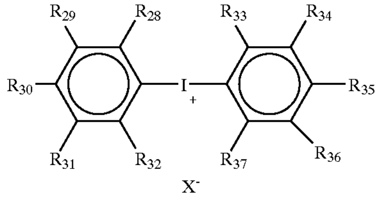

wherein $R_1$ to $R_{37}$ each represents a hydrogen atom, an alkyl group, an alkoxyl group, a hydroxyl group, a halogen atom or a group indicated by —S—$R_{38}$, wherein $R_{38}$ represents an alkyl group or an aryl group; $R_1$ to $R_{38}$ may be the same or different; for $R_1$ to $R_{15}$, two or more selected therefrom may be combined with each other directly at their ends or through an element selected from the group consisting of oxygen, sulfur and nitrogen to form a ring structure, for $R_{16}$ to $R_{27}$, a ring structure may also be formed similarly, and for $R_{28}$ to $R_{37}$, a ring structure may also be formed similarly; and $X^-$ represents an anion of an acid selected from the group consisting of benzenesulfonic acid, naphthalenesulfonic acid and anthracenesulfonic acid, or an acid having at least one organic group selected from the group consisting of an alkyl group, an alkoxyl group, an acyl group, an acyloxyl group, a sulfonyl group, a sulfonyloxy group, a sulfonylamino group, an aryl group, an aralkyl group and an alkoxycarbonyl group;

(5) The negative-working resist composition described in any one of the above (1) to (4), wherein the crosslinking agent which initiates crosslinking by the acid is a phenol derivative having from 3 to 5 benzene ring atomic groups in its molecule and a molecular weight of 1200 or less, each of the benzene ring atomic groups having two or more hydroxymethyl groups and/or alkoxymethyl groups;

(6) The negative-working resist composition described in any one of the above (1) to (5), which further comprises an organic basic compound;

(7) The negative-working resist composition described in any one of the above (1) to (6) which further comprises a fluorine and/or silicon surfactant;

(8) The negative-working resist composition described in any one of the above (1) to (7), wherein the alkali-soluble resin has a molecular weight distribution (Mw/Mn) of from 1.0 to 1.5; and (9) The negative-working resist composition described in any one of the above (1) to (8), wherein the alkali-soluble resin has a weight average molecular weight (Mw) of from 2000 to 9000.

DETAILED DESCRIPTION OF THE INVENTION

The compounds used in the invention are described below.

(1) Alkali-Soluble Resins Used in the Invention

The alkali-soluble resins used in the invention are compounds containing structural units represented by the following general formula (a):

(a)

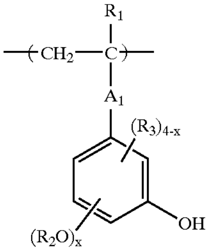

wherein $R_1$ represents a hydrogen atom, a halogen atom, a cyano group, or an alkyl, oxyalkyl or haloalkyl group which may have a substituent; x represents an integer of from 0 to 3; $R_2$ represents a hydrogen atom, or an alkyl, cycloalkyl, alkenyl, aralkyl, aryl or acyl group which may have a substituent, wherein a plurality of $R_2$'s are present, they maybe the same or different; $R_3$ represents a hydrogen atom, a halogen atom, a cyano atom, or an alkyl, cycloalkyl, alkenyl, aralkyl or aryl group which may have a substituent, wherein a plurality of $R_3$'s are present, they may be the same or different; and two of the plurality of $R_2$'s, two of the plurality of $R_3$'s, or $R_2$ and $R_3$ may combine with each other to form a ring.

$A_1$ represents a single bond, or a divalent alkylene, alkenylene, cycloalkylene or arylene group which may have a substituent, or —O—, —$SO_2$—, —O—CO—$R_5$—, —CO—O—$R_6$— or —CO—N($R_7$)—$R_8$—, wherein $R_5$, $R_6$ and $R_8$, which may be the same or different, each represents a single bond, or a divalent alkylene, alkenylene, cycloalkylene or arylene group which may have an ether group, an ester group, an amido group, a urethane group or a ureido group and may further have a substituent, and $R_7$ represents a hydrogen atom, or an alkyl, cycloalkyl, aralkyl or aryl group which may have a substituent.

The alkyl group for $R_1$ to $R_3$ and $R_7$ is preferably an alkyl group having 1 to 8 carbon atoms, and examples thereof include methyl, ethyl, propyl, n-butyl, sec-butyl, hexyl, 2-ethylhexyl and octyl. The cycloalkyl group for $R_2$, $R_3$ and $R_7$ may be either monocyclic or polycyclic. The monocyclic group is preferably a group having from 3 to 8 carbon atoms, such as cyclopropyl, cyclopentyl or cyclohexyl. The polycyclic group is preferably, for example, adamantly, norbornyl, isobornyl, camphanyl, cyclopentyl, α-pinel or tricyclodecanyl.

The alkenyl group for $R_2$ and $R_3$ is preferably an alkenyl group having from 2 to 8 carbon atoms, such as vinyl, allyl, butenyl or cyclohexenyl. The aryl group for $R_2$, $R_3$ and $R_7$ is preferably an aryl group having from 6 to 15 carbon atoms, such as phenyl, tolyl, dimethylphenyl, 2,4,6-trimethylphenyl, naphthyl or anthryl. The aralkyl group for $R_2$, $R_3$ and $R_7$ is preferably an aralkyl group having from 7 to 12 carbon atoms, such as benzyl, phenethyl or naphthylmethyl.

The oxyalkyl group for $R_1$ is preferably an oxyalkyl group having from 1 to 4 carbon atoms. Examples thereof include an alkoxyl group having from 1 to 4 carbon atoms, such as hydroxyl, methoxy, ethoxy or butoxy, and an oxymethyl, oxyethyl, oxypropyl or oxybutyl group substituted by an acyl group having from 1 to 4 carbon atoms, such as acetoxy, propanoyloxy or butanoyloxy. The haloalkyl group for $R_1$ is preferably a haloalkyl group having from 1 to 4 carbon atoms, such as chloromethyl, chloroethyl, chloropropyl, chlorobutyl, bromomethyl or bromoethyl. The acyl group for $R_2$ is preferably an acyl group having from 1 to 10 carbon atoms, such as formyl, acetyl, propanoyl, butanoyl, pivaloyl or benzoyl.

The alkylene group for $A_1$, $R_5$, $R_6$ and $R_8$ is preferably an alkylene group having from 1 to 8 carbon atoms, such as methylene, ethylene, propylene, butylenes, hexylene or octylene. The alkenylene group is preferably an alkenylene group having from 2 to 6 carbon atoms, such as ethenylene, propenylene or butenylene. The cycloalkylene group is preferably a cycloalkylene group having from 5 to 8 carbon atoms, such as cyclopentylene or cyclohexylene. The arylene group is preferably an arylene group having from 6 to 12 carbon atoms, such as phenylene, tolylene, xylylene or naphthylene.

These groups may further have substituents. The substituents include, for example, an active hydrogen-containing group such as amino, amido, ureido, urethane, hydroxyl or carboxyl, a halogen atom (fluorine, chlorine, bromine or iodine), an alkoxyl group (methoxy, ethoxy, propoxy or butoxy), a thioether group, an acyl group (acetyl, propanoyl or benzoyl), an acyloxy group (acetoxy, propanoyloxy or benzoyloxy), an alkoxycarbonyl group (methoxycarbonyl, ethoxycarbonyl or propoxycarbonyl), a cyano group and a nitro group. In particular, the active hydrogen-containing group such as amino, hydroxyl or carboxyl is preferred.

The ring formed by combination of two of the plurality of $R_2$'s, two of the plurality of $R_3$'s, or $R_2$ and $R_3$ is selected from 4- to 7-membered rings that may contain heteroatoms (such as oxygen, nitrogen and sulfur). Preferred examples of the ring structures formed include a benzofuran ring, a benzodioxonol ring, a benzopyran ring, an indole ring, a benzimidazole ring, a benzopyrazole ring and a benzothiophene ring.

The structural units of the invention represented by general formula (a) are preferably structural units represented by general formula (1).

The alkali-soluble resin of the invention may consist of only the structural units represented by general formula (a) or (1). However, for improving the performance of the negative-working resist of the invention, another polymerizable monomer may be copolymerized.

The following monomers can be used herein as the comonomers. For example, they are compounds each having one addition-polymerizable unsaturated bond, selected from acrylates, acrylamide compounds, methacrylates, methacrylamide compounds, allyl compounds, vinyl ethers, vinyl esters, styrene compounds and crotonates.

Specifically, the acrylates include, for example, alkyl (preferably, alkyl has from 1 to 10 carbon atoms) acrylates (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate and tetrahydrofurfuryl acrylate), and aryl acrylates (e.g., phenyl acrylate).

The methacrylates include, for example, alkyl (preferably, alkyl has from 1 to 10 carbon atoms) methacrylates (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentylmethacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate), and aryl methacrylates (e.g., phenyl methacrylate, cresyl methacrylate and naphthyl methacrylate).

The acrylamide compounds include, for example, acrylamide, N-alkylacrylamides (alkyl has from 1 to 10 carbon atoms, such as methyl, ethyl, propyl, butyl, t-butyl, heptyl, octyl, cyclohexyl, benzyl or hydroxyethyl), N-arylacrylamides (aryl includes, for example, phenyl, tolyl, nitrophenyl, naphthyl, cyanophenyl, hydroxyphenyl and carboxyphenyl), N,N-dialkylacrylamides (alkyl has from 1 to 10 carbon atoms, such as methyl, ethyl, butyl, isobutyl, ethylhexyl or cyclohexyl), N,N-diarylacrylamides (aryl is, for example, phenyl), N-methyl-N-phenylacrylamide, N-hydroxyethyl-N-methylacrylamide and N-2-acetamidoethyl-N-acetylacrylamide.

The methacrylamide compounds include, for example, methacrylamide, N-alkylmethacrylamides (alkyl has from 1 to 10 carbon atoms, such as methyl, ethyl, t-butyl, ethylhexyl, hydroxyethyl or cyclohexyl), N-arylmethacrylamides (aryl is, for example, phenyl), N,N-dialkylmethacrylamides (alkyl is ethyl, propyl or butyl), N,N-diarylmethacrylamides (aryl is, for example, phenyl), N-hydroxyethyl-N-methylmethacrylamide, N-methyl-N-phenylmethacrylamide and N-ethyl-N-phenylmethacrylamide. The allyl compounds include, for example, allyl esters (e.g., allyl acetate, allyl caproate, allyl caprylate, allyl laurate, allyl palmitate, allyl stearate, allyl benzoate, allyl acetoacetate and allyl lactate), and allyloxyethanol.

The vinyl ethers include, for example, alkyl vinyl ethers (e.g, hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether) and vinyl aryl ethers (e.g., vinyl phenyl ether, vinyl tolyl ether, vinyl chlorophenyl ether, vinyl-2,4-dichlorophenyl ether, vinyl naphthyl ether and vinyl anthranyl ether).

The vinyl esters include, for example, vinyl butylate, vinyl isobutylate, vinyltrimethyl acetate, vinyldiethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-p-phenylbutyrate, vinyl cyclohexylcarboxylate, vinyl benzoate, vinyl salicylate, vinyl chlorobenzoate, vinyl tetrachlorobenzoate and vinyl naphthoate.

The styrene compounds include, for example, styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (e.g., methoxystyrene, 4-methoxy-3-methylstyrene and dimethoxystyrene), halogen styrenes (e.g., chlorostyrene, dichlorostyrene, trichlorostyrene, tetrachlorostyrene, pentachlorostyrene, bromostyrne, dibromostyrne, iodostyrene, fluorostyrene, trifluorostyrene, 2-bromo-4-trifluoromethylstyrene and 4-fluoro-3-trifluoromethylstyrene), carboxystyrene and vinylnaphthalene.

The crotonates include, for example, alkyl crotonates (e.g., butyl crotonate, hexyl crotonate and glycerol monocrotonate). The comonomers also include dialkyl itaconates (e.g., dimethyl itaconate, diethyl itaconate and dibutyl itaconate), dialkyl esters of maleic acid or fumaric acid (e.g., dimethyl maleate and dibutyl fumarate), maleic anhydride, maleimide, acrylonitrile, methacrylonitrile and maleylonitrile. In addition, the comonomers may generally be any as long as they are addition-polymerizable unsaturated compounds that are copolymerizable.

Of these, monomers improving alkali solubility, for example, carboxyl group-containing monomers such as carboxystyrene, N-(carboxyphenyl)acrylamide and N-(carboxyphenyl)methacrylamide, and maleimide, are preferred as the copolymerization components.

The content of the polymerizable monomers in the resins in the invention is preferably 50 mol % or less, and more preferably 30 mol % or less, based on the total repeating units.

Specific examples of the resins having repeating structural units represented by general formula (a) are shown below, but the present invention is not limited thereby.

(1)

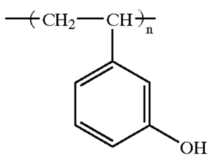

(2)

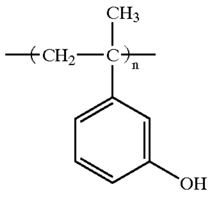

(3)

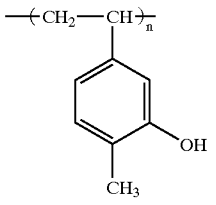

-continued
(4)
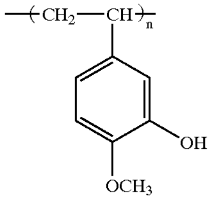
(5)
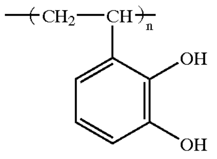
(6)
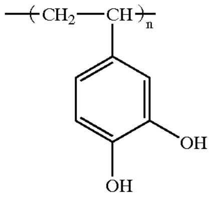
(7)
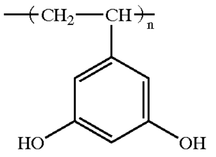
(8)
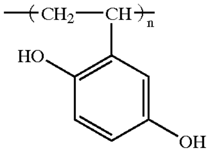
(9)
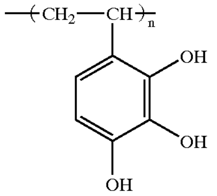
(10)
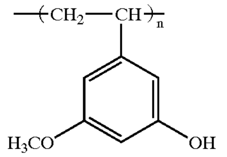
(11)
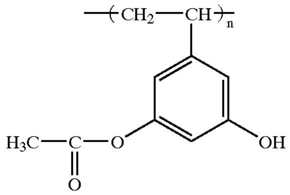
-continued
(12)
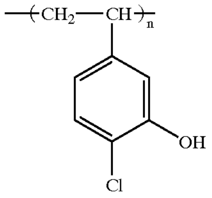
(13)
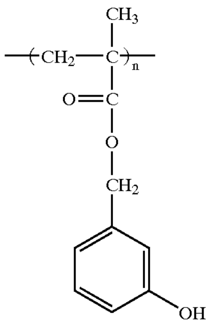
(14)
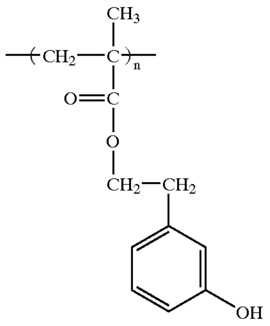
(15)
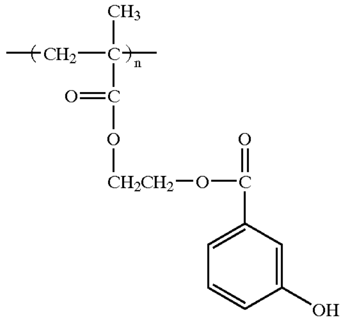
(16)
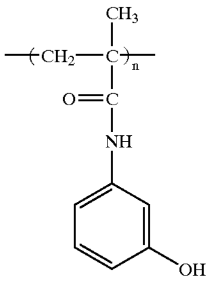

-continued
(17)
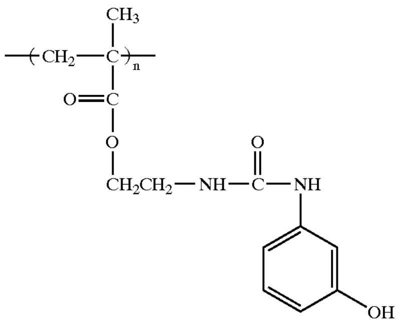
(18)
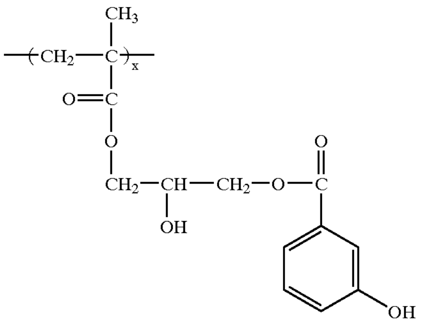
(19)
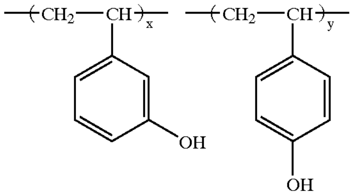
(20)
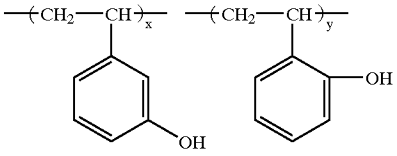
(21)
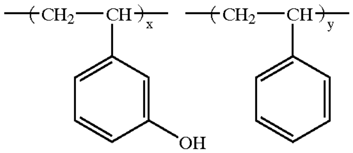
(22)
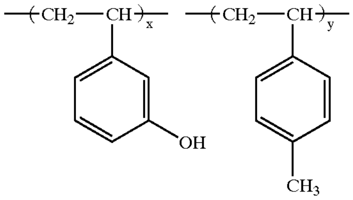
(23)
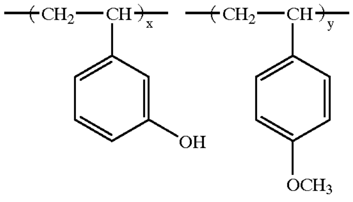
-continued
(24)
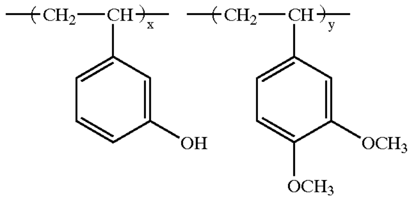
(25)
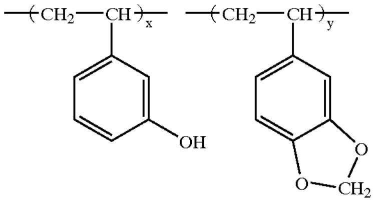
(26)
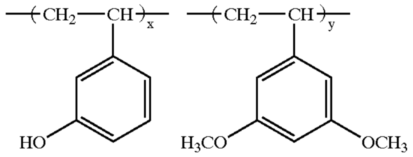
(27)
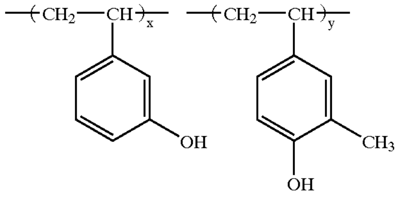
(28)
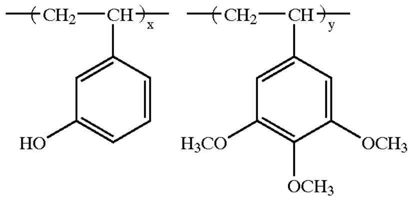
(29)
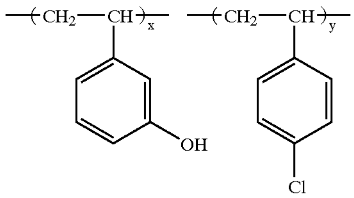
(30)
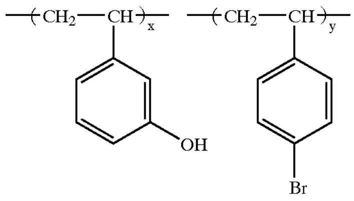
(31)
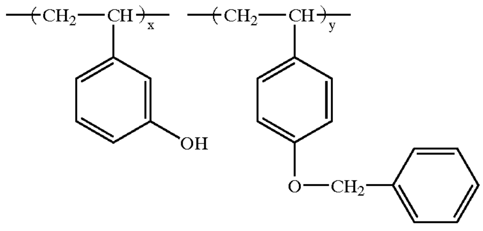

-continued
(32)
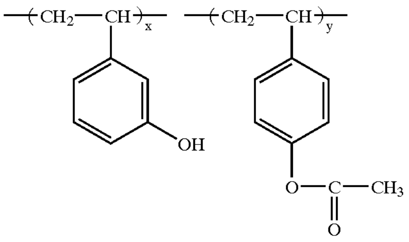
(33)
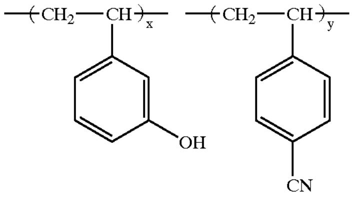
(34)
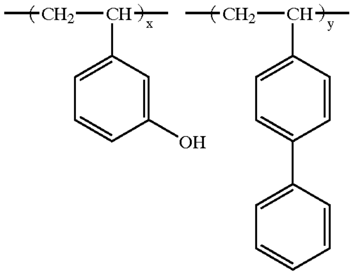
(35)
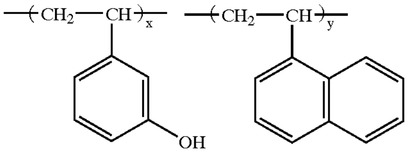
(36)
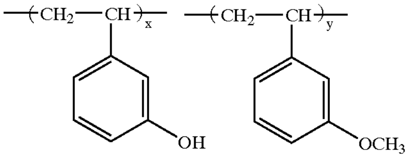
(37)
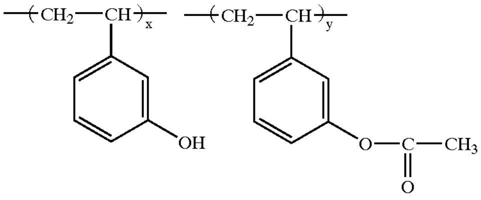
(38)
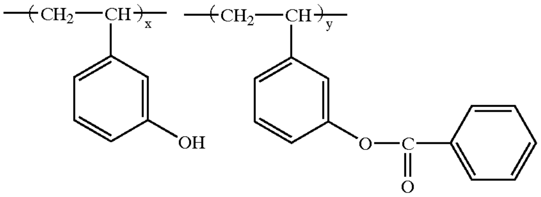
-continued
(39)
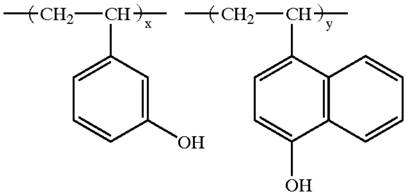
(40)
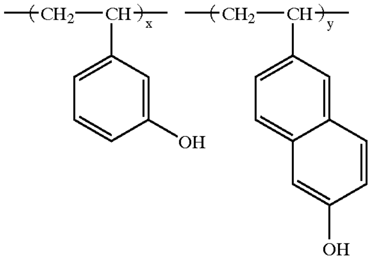
(41)
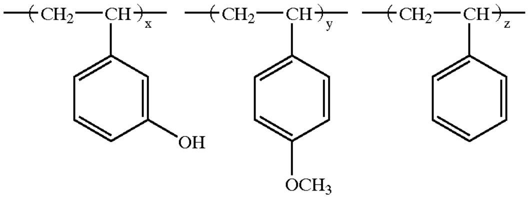
(42)
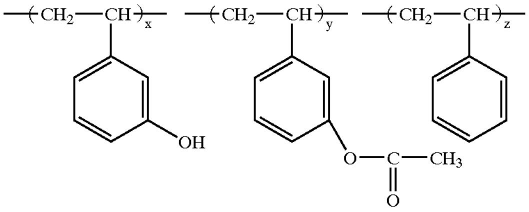
(43)
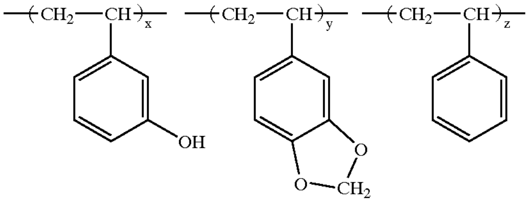
(44)
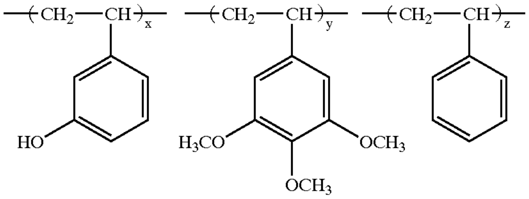
(45)
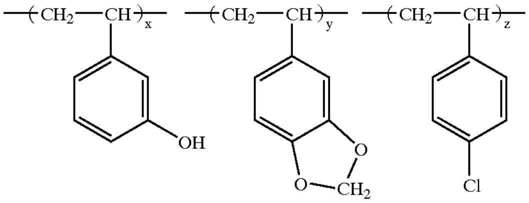

-continued
(46)
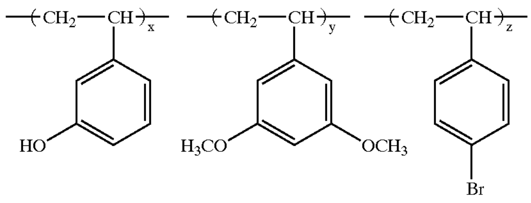
(47)
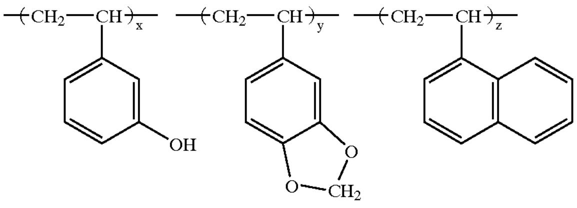
(48)
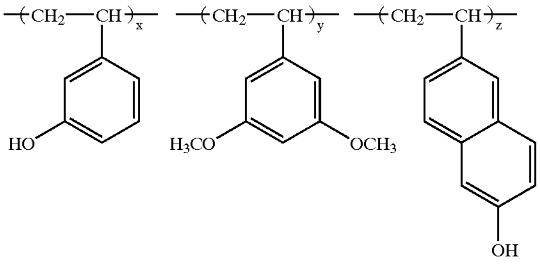
(49)
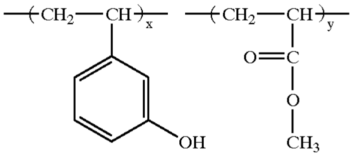
(50)
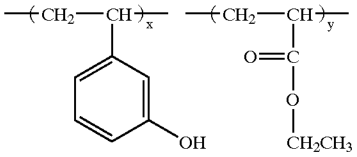
(51)
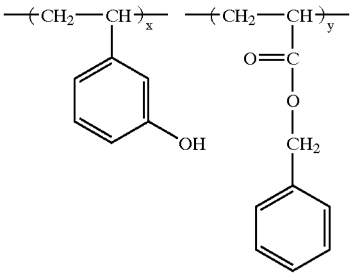
-continued
(52)
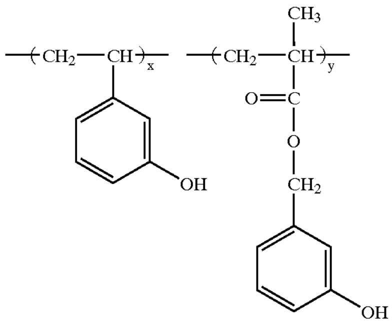
(53)
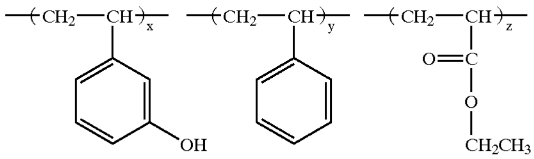
(54)
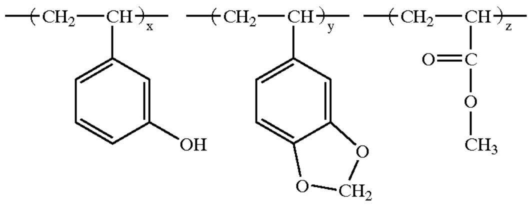
(55)
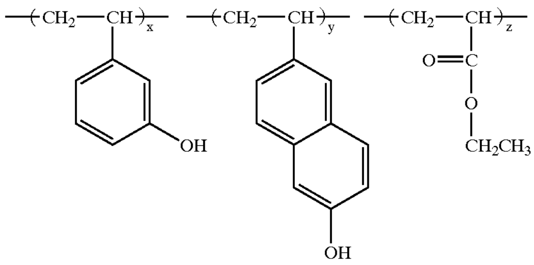
(56)
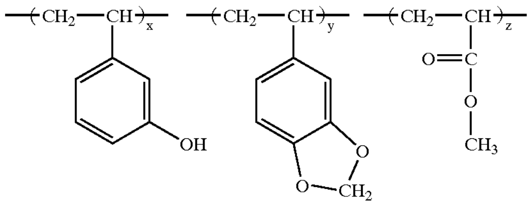
(57)
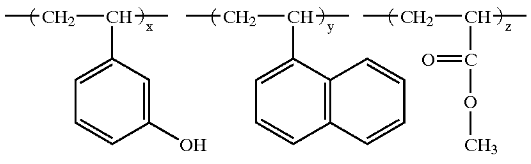

-continued
(58)
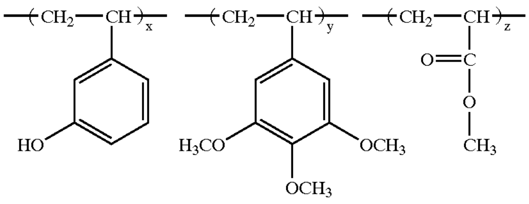
(59)
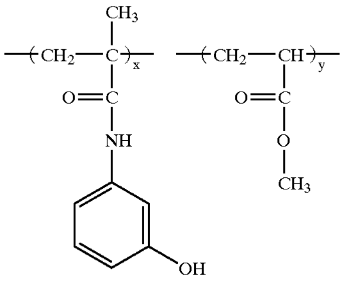
(60)
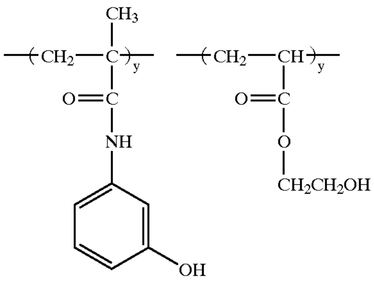
(61)
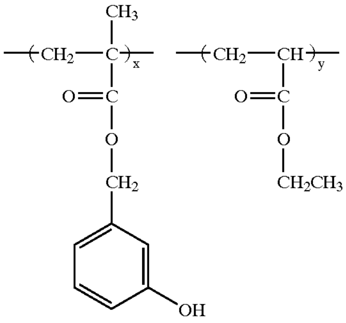
(62)
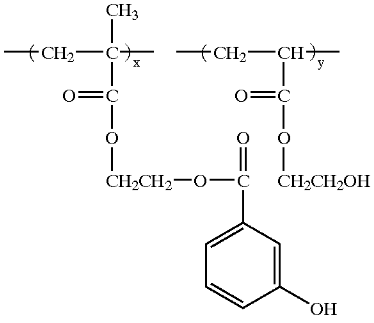
-continued
(63)
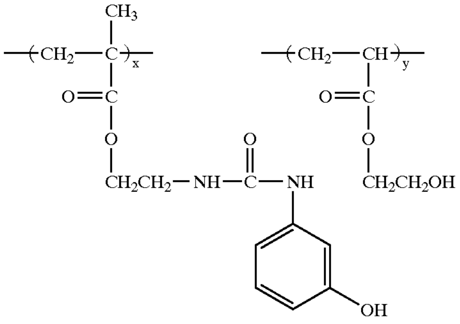
(64)
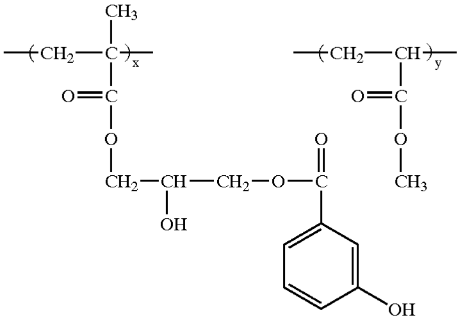
(65)
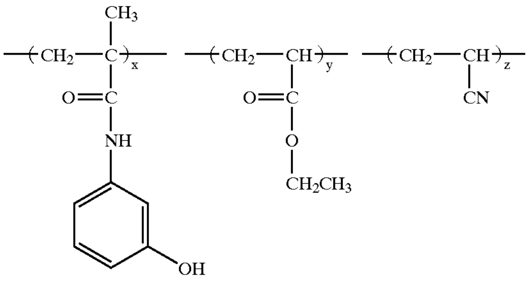
(66)
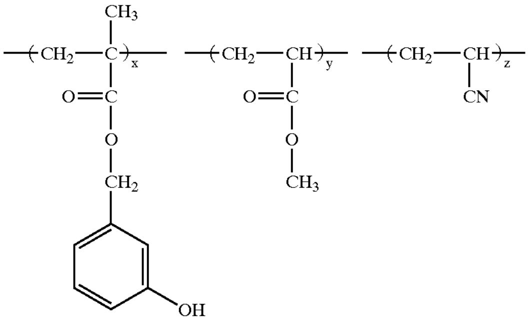
(67)
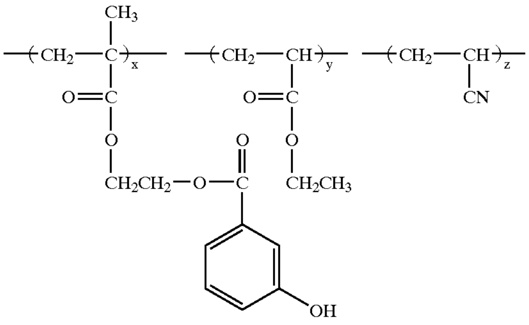

-continued (68)

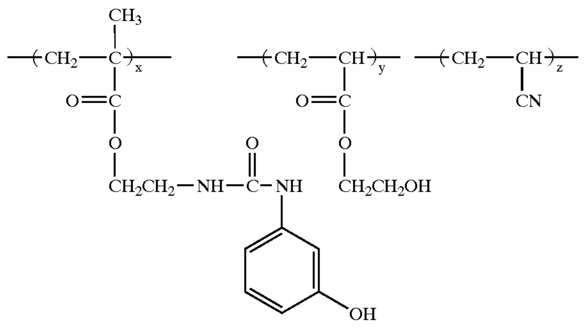

(69)

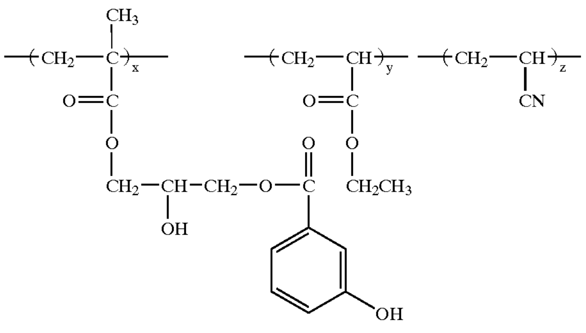

n in the above-mentioned specific examples indicates a positive integer. X, y and z indicate molar ratios of resin composition. In a two-component resin, x ranging from 30 to 95 and y ranging from 5 to 70 are used, and preferably, x ranging from 50 to 90 and y ranging from 10 to 50 are used. In a three-component resin, x ranging from 30 to 90, y ranging from 5 to 65 and z ranging from 5 to 65 are used, and preferably, x ranging from 50 to 90, y ranging from 5 to 45 and z ranging from 5 to 45 are used.

The alkali-soluble resins of the invention may contain other repeating structural units, as well as the structural units represented by general formula (a) or (1). The copolymerization components which may be contained are preferably repeating structural units corresponding to the following monomers (4) to (7).

The alkali-soluble resins having the repeating units represented by general formula (1) used in the invention can be obtained by radical polymerization or living anion polymerization of the following monomer (3), optionally with the following monomers (4) to (7):

(3)

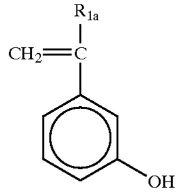

-continued (4)

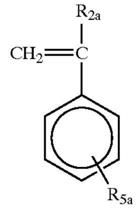

(5)

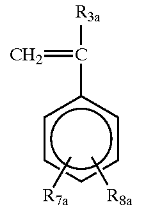

(6)

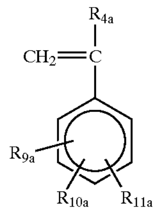

(7)

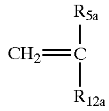

In the above, $R_{1a}$ to $R_{12a}$ have the same meanings as described above. Of the above, when a monomer having a hydroxyl group in its molecule is used, a process is preferred in which the hydroxyl group is previously protected, and the protecting group is removed after polymerization.

In the invention, the content of the repeating structural units represented by the above-mentioned general formula (1) in the resin may be any as long as the effect of the invention can be produced. Specifically, the content thereof is preferably from 30 mol % to 100 mol %, and more preferably from 50 mol % to 90 mol %.

In the invention, the alkali-soluble resins are preferably resins represented by general formula (2), whereby the effect of the invention becomes more significant.

$R_{1a}$ to $R_{5a}$ of general formula (2) each represents a hydrogen atom or a methyl group. An alkyl group or alkoxyl group having from 1 to 4 carbon atoms for $R_{6a}$ to $R_{11a}$, $R_{14a}$ and $R_{15a}$ may be either straight-chain or branched. The alkyl groups include methyl, ethyl, propyl, isopropyl, butyl, isobutyl and t-butyl, and the alkoxyl groups include methoxy, ethoxy, propoxy, isopropoxy, butoxy, isobutoxy and t-butoxy.

$R_{16a}$ represents a branched or cyclic alkyl group, which may be substituted, having from 1 to 10 carbon atoms (specifically, such as ethyl, propyl, isopropyl, butyl, isobutyl, t-butyl, cyclohexyl, cyclohexylethyl or phenoxyethyl), an aryl group, which may be substituted, having from 6 to 20 carbon atoms (specifically, such as phenyl, tolyl, xylyl, biphenyl, naphthyl, halogen-substituted phenyl or nitro-substituted phenyl), or an aralkyl group, which may be substituted, having from 7 to 20 carbon atoms (specifically, such as benzyl, phenetyl or phenylpropyl).

In general formula (2), 1 is from more than 1 to 100, preferably from more than 30 to 100, and more preferably from more then 50 to 90. m, n, o and p are each from 0 to less than 100, preferably from 20 to 70, and more preferably from 30 to 50. l+m+n+o+p is 100.

It is preferred that the alkali-soluble resins thus obtained have a weight average molecular weight ranging from 1,000 to 30,000. Less than 1,000 causes an increase in the film decrease of exposed areas after development, whereas exceeding 30,000 results in decreased developing speed. The more preferred range is from 2,000 to 20,000, and the particularly preferred range is from 2,500 to 15,000.

The weight average molecular weight of the alkali-soluble resins particularly preferred in that the sensitivity is especially excellent ranges from 2,000 to 9,000, preferably from 2,500 to 9,000, and more preferably from 3,000 to 9,000.

The molecular weight distribution (Mw/Mn) of the alkali-soluble resins is preferably from 1.0 to 1.5 (monodisperse polymers), because development residues are decreased. The molecular weight distribution of the alkali-soluble resins particularly preferred in that the sensitivity is especially excellent ranges from 1.0 to 1.4, preferably from 1.0 to 1.3, and more preferably from 1.0 to 1.2.

The weight average molecular weight as used herein is defined as a polystyrene-converted value of gel permeation chromatography.

The resins used in the invention can be synthesized by methods described, for example, in JP-A-4-195138, JP-A-4-350657, JP-A-4-350658, JP-A-6-41222, JP-A-6-65333, *Polym. J.,* 18, 1037 (1986), *Polym. J.,* 22, 386 (1990) and *Makromol. Chem. Suppl.,* 15, 167 (1989). That is to say, the desired alkali-soluble resins can be obtained by so-called living anion polymerization. Further, the resins can also be obtained by molecular weight fractionation of resins obtained by radical polymerization, according to a combination of a good solvent and a poor solvent, or by gel chromatography fractionation thereof.

These resins may be used either alone or as a mixture of a plurality of them.

The living anion polymerization is described in New Experimental Chemistry Course, 19, Polymer Chemistry (I), pages 59 to 73 (Maruzen), and the molecular weight fractionation is described in New Experimental Chemistry Course, 19, Polymer Chemistry (II), pages 522 to 527 (Maruzen).

The rate of alkali dissolution of the alkali-soluble resins is preferably 20 Å/second or more, and particularly preferably 200 Å/second or more, when measured in 0.261 N tetramethylammonium hydroxide (TMAH) at 23° C.

The alkali-soluble resins of the invention may be used alone or in combination with other alkali-soluble resins. As to the ratio of them used, the other alkali-soluble resin other than the alkali-soluble resin of the invention can be used in combination with the alkali-soluble resin of the invention in an amount up to 100 parts by weight, based on 100 parts by weight of the alkali-soluble resin of the invention. The alkali-soluble resins that can be used in combination with the alkali-soluble resins of the invention are exemplified below.

Examples thereof include but are not limited to novolak resins, hydrogenated novolak resins, acetone-pyrogallol resins, poly-o-hydroxystyrene, poly-p-hydroxystyrene, hydrogenated poly-hydroxystyrene, halogen- or alkyl-substituted polyhydroxystyrenes, hydroxystyrene-N-substituted maleimide copolymers, o/p-hydroxystyrene copolymers, products partially O-alkylated to hydroxyl groups of polyhydroxystyrene (e.g., 5 to 30 mol % O-methylated products, O-(1-methoxy)ethylated products, O-(1-ethoxy)ethylated products, O-2-tetrahydropyranylated products and O-(t-butoxycarbonyl)methylated products), or O-acylated products (e.g., 5 to 30 mol % O-acetylated products and O-(t-butoxy) carbonylated products), styrene-maleic anhydride copolymers, styrene-hydroxystyrene copolymers, α-methylstyrene-hydroxystyrene copolymers, carboxyl group-containing methacrylic resins and derivatives thereof.

The amount of all alkali-soluble resins used is usually from 30% to 95% by weight, preferably from 40% to 90% by weight, and more preferably from 50% to 80%, based on the total weight of resist composition (excluding solvents).

(2) Compounds Generating Acids by Irradiation of Electron Beams or X-Rays (Hereinafter also Referred to as Acid Generating Agents)

The acid generating agents are used together with the alkali-soluble resins. The acid generating agents used together with the alkali-soluble resins may be any compounds as long as they generate acids by irradiation of radiation.

Specifically, photoinitiators for cationic photopolymerization, photoinitiators for radical photopolymerization, photodecoloring agents and photodiscoloring agents for dyes, or compounds generating acids with known light used in micro resists (ultraviolet rays of 400 nm to 200 nm, far ultraviolet rays, particularly preferably g-line, h-line, i-line and KrF excimer laser beams), ArF excimer laser beams, electron beams, X-rays, molecular beams or ion beams, and mixtures thereof can be appropriately selected to use them.

Other compounds used in the invention which generate acids by irradiation of electron beams or X-rays include, for example, onium salts such as diazonium salts described in S. I. Schlesinger, *Photogr. Sci. Eng.,* 18, 387 (1974) and T. S. Bal et al., *Polymer,* 21, 423 (1980), ammonium salts described in U.S. Pat. Nos. 4,069,055, 4,069,056 and Re 27,992, and JP-A-3-140140, phosphonium salts described in D. C. Necker et al., *Macromolecules,* 17, 2468 (1984), C. S. Wen et al., *Teh. Proc. Conf. Rad. Curing ASIA*, p. 478, Tokyo, Oct. (1988), U.S. Pat. Nos. 4,069,055 and 4,069,056, iodonium salts described in J. V. Crivello et al., *Macromolecules,* 10 (6), 1307 (1977), *Chem. & Eng. News, Nov.* 28,31 (1988), European Patents 104,143, 339,049 and 410,201, JP-A-2-150848 and JP-A-2-296514, sulfonium salts described in J. V. Crivello et al., *Polymer, J.* 17, 73 (1985), J. V. Crivello et al., *J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 20 1141 (1981), J. V. Crivello et al., *J. Polymer Sci., Polymer Chem. Ed.,* 17, 2877 (1979), European Patents 370,693, 161,811, 410,201, 339,049, 233,567, 297,443 and 297,442, U.S. Pat. Nos. 4,933,377, 3,902,114, 4,760,013, 4,734,444 and 2,833,827, German Patents 2,904,626, 3,604,580 and 3,604,581, selenonium salts described in J. V. Crivello et al., *Macromolecules,* 10 (6), 1307 (1977) and J. V. Crivello et al., *J. Polymer Sci., Polymer chem. Ed.,* 17, 1047 (1979) and arsonium salts described in C. S. Wen et al., *Teh. Proc. Conf. Rad. Curing ASIA*, p. 478, Tokyo, October (1988); organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metal/organic halides described in K. Meier et al., *J. Rad. Curing,* 13 (4), 26 (1986), T. P. Gill et al., *Inorg. Chem.,* 19, 3007 (1980), D. Astruc, *Acc. Chem. Res.,* 19 (12), 377 (1896) and JP-A-2-161445, photo acid generators having o-nitrobenzyl type protecting groups described in S. Hayase et al., *J. Polymer Sci.,* 25, 753 (1987), E. Reichmanis et al., *J. Polymer Sci., Polymer Chem. Ed.,* 23, 1 (1985), Q. Q. Zhu et al., *J. Photochem.,* 36, 85, 39, 317 (1987), B. Amit et al., *Tetrahedron Lett., (*24), 2205 (1973), D. H. R. Barton et al., *J. Chem. Soc.,* 3571 (1965), P. M. Collins et al., *J. Chem. Soc., Perkin I,* 1695 (1975), M. Rudinstein et al., *Tetrahedron Lett., (*17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Soc., Chem. Commun.,* 532 (1972), S. Hayase et al., *Macromolecules,* 18, 1799 (1985) E. Reichmanis et al., *J. Electrochem. Soc., Solid State Sci. Technol.,* 130 (6), F. M. Houlihan et al., *Macromolecules,* 21, 2001 (1988), European Patents 0290,750, 046,083, 156,535, 271,851 and 0,388,343, U.S. Pat. Nos. 3,901,710 and 4,181, 531, JP-A-60-198538 and JP-A-53-133022; compounds producing sulfonic acids by photolysis which are represented by iminosulfonates described in M. Tunooka et al., *Polymer Preprints Japan,* 35 (8), G. Berner et al., *J. Rad. Curing,* 13 (4), W. J. Mijs et al., *Coating Technol.,* 55 (697), 45 (1983), Akzo, H. Adachi et al., *Polymer Preprints Japan,* 37 (3), European Patents 0199,672, 84,515, 044,115, 618, 564 and 0101,122, U.S. Pat. Nos. 4,371,605 and 4,431,774, JP-A-64-18143, JP-A-2-245756 and JP-A-3-140109; and disulfone compounds described in JP-A-61-166544 and JP-A-2-71270, and disulfone compounds described in JP-A-61-166544.

Further, compounds in which these groups or compounds generating acids with light are introduced into their main chains or side chains can be used. Examples of such compounds are described in M. E. Woodhouse et al., *J. Am. Chem. Soc.,* 104, 5586 (1982), S. P. Pappas et al., *J. Imaging Sci.,* 30 (5), 218 (1986), S. Kondo et al., *Makromol. Chem., Rapid Commun.,* 9, 625 (1988), Y. Yamada et al., *Makromol. Chem.,* 152, 153, 163 (1972), J. V. Crivello et al., *J. Polymer Sci., Polymer Chem. Ed.,* 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Further, compounds generating acids with light can also be used which are described in V. N. R. Pillai, *Synthesis*, (1) 1 (1980), A. Abadet al., *Tetrahedron Lett.*, (47), 4555 (1971), D. H. R. Barton et al., *J. Chem. Soc.*, (C), 329 (1970), U.S. Pat. No. 3,779,778 and European Patent 126,712.

Of the above-mentioned compounds that are decomposed by irradiation of electron beams or X-rays to generate acids, compounds particularly effectively used are described below.

(1) Oxazole derivatives substituted by trihalomethyl groups, which are represented by the following general formula (PAG1), or S-triazine derivatives represented by the following general formula (PGA2):

(PAG1)

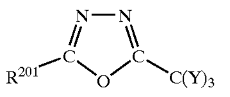

(PAG2)

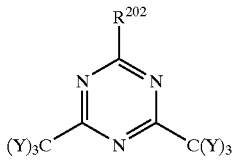

wherein $R^{201}$ represents a substituted or unsubstituted aryl or alkenyl group; $R^{202}$ represents a substituted or unsubstituted aryl, alkenyl or alkyl group, or $—C(Y)_3$; and Y represents a chlorine atom or a bromine atom.

Specific examples thereof include but are not limited to the following compounds:

(PAG1-1)

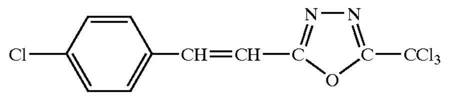

(PAG1-2)

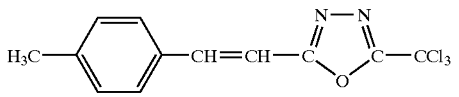

(PAG1-3)

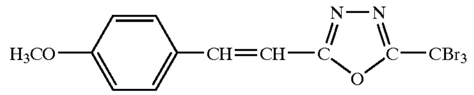

(PAG1-4)

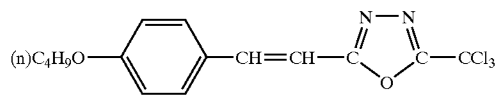

(PAG1-5)

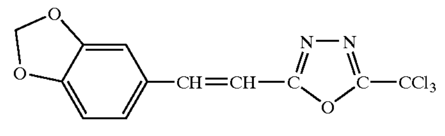

(PAG1-6)

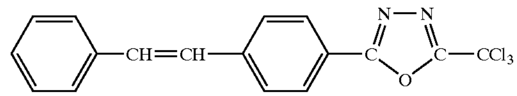

(PAG1-7)

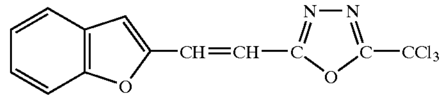

(PAG1-8)

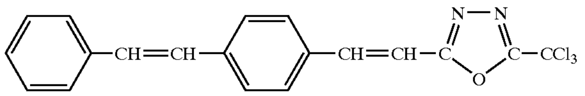

(PAG2-1)

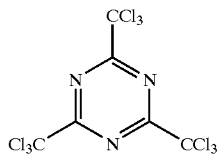

(PAG2-2)

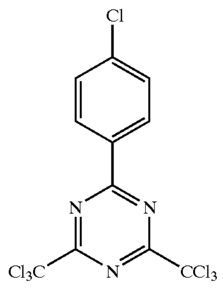

-continued
(PAG2-3)
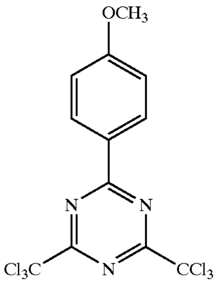
(PAG2-4)
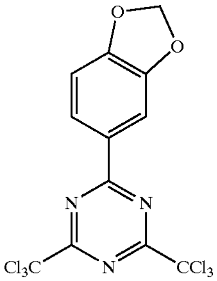
(PAG2-5)
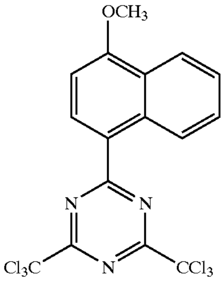
(PAG2-6)
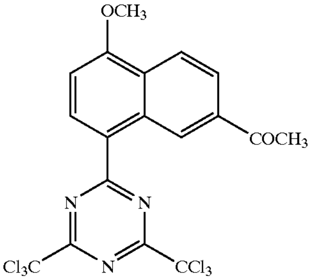
(PAG2-7)
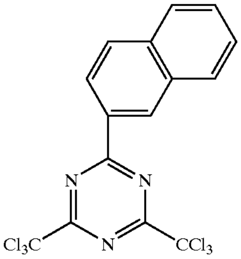
-continued
(PAG2-8)
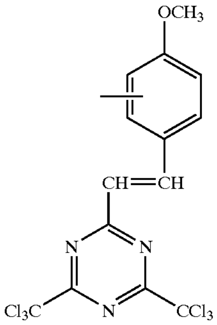
(PAG2-9)
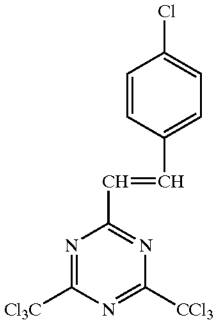
(PAG2-10)
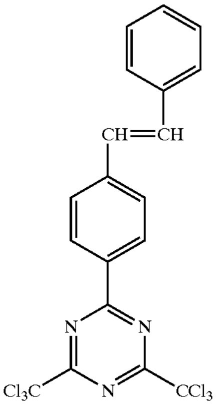
(2) Iodonium salts represented by the following general formula (PAG3) or sulfonium salts represented by the following general formula (PAG4):
(PAG3)
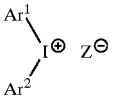
(PAG4)
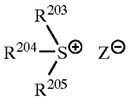

wherein $Ar^1$ and $Ar^2$ each independently represents a substituted or unsubstituted aryl group. Preferred examples of the substituents include alkyl, haloalkyl, cycloalkyl, aryl, alkoxyl, nitro, carboxyl, alkoxycarbonyl, hydroxyl, mercapto and halogen atoms.

$R^{203}$, $R^{204}$ and $R^{205}$ each independently represents a substituted or unsubstituted alkyl or aryl group, and preferably an aryl group having from 6 to 14 carbon atoms, an alkyl group having from 1 to 8 carbon atoms or a substituted derivative thereof. Preferred examples of the substituents for aryl include alkoxyl of from 1 to 8 carbon atoms, alkyl of from 1 to 8 carbon atoms, cycloalkyl, nitro, carboxyl, mercapto, hydroxyl and halogen atoms, and preferred examples thereof for alkyl include alkoxyl of from 1 to 8 carbon atoms, carboxyl and alkoxycarbonyl.

$Z^-$ represents an anion. Specific examples of the anions include substituted or unsubstituted alkylsulfonic acids, cycloalkylsulfonic acids, perfluoroalkylsulfonic acids and arylsulfonic acids (for example, substituted or unsubstituted benzenesulfonic acid, naphthalenesulfonic acid and anthracenesulfonic acid).

Two of $R^{203}$, $R^{204}$ and $R^{205}$, and $Ar_1$ and $Ar_2$ may each combine together through each single bond or substituent.

Specific examples thereof include but are not limited to the following compounds:

(PAG3-1)

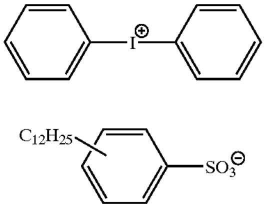

(PAG3-2)

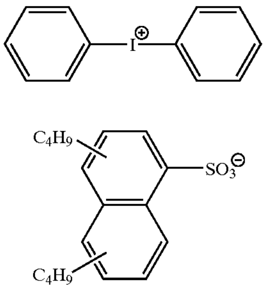

(PAG3-3)

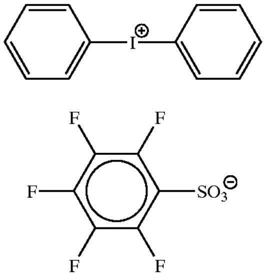

-continued (PAG3-4)

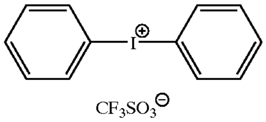

(PAG3-5)

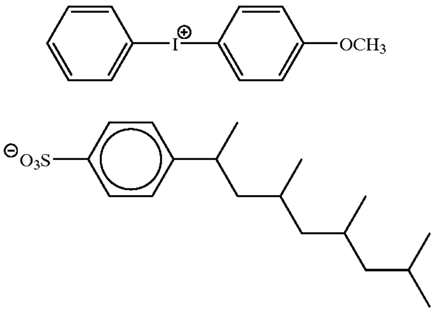

(PAG3-6)

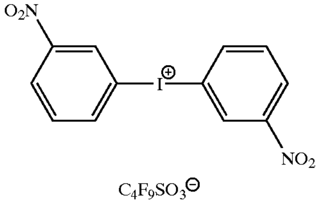

(PAG3-7)

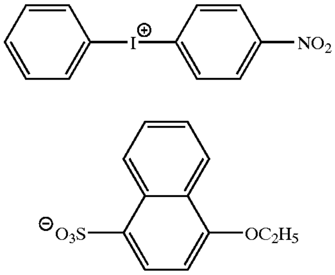

(PAG3-8)

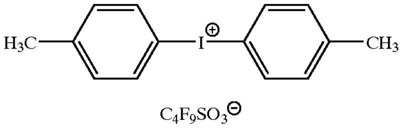

(PAG3-9)

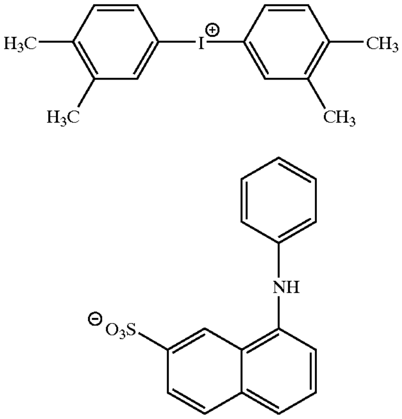

-continued
(PAG3-10)
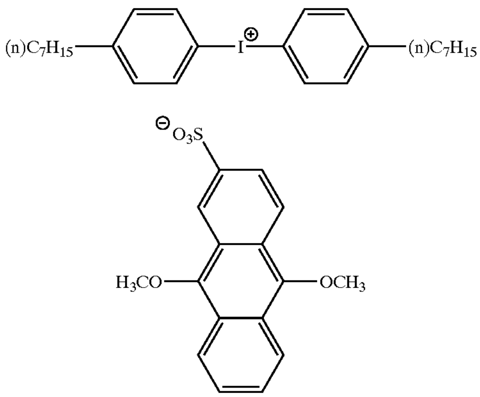
(PAG3-11)
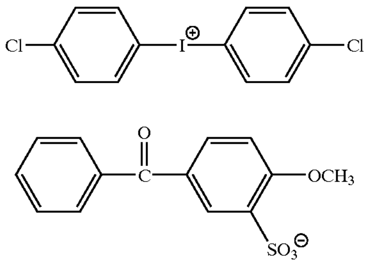
(PAG3-12)
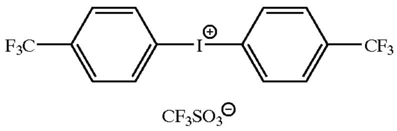
(PAG3-13)
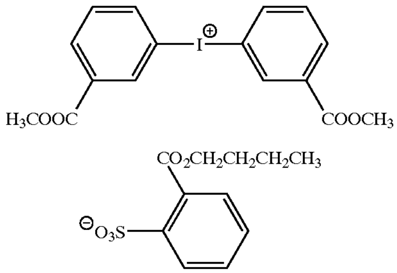
(PAG3-14)
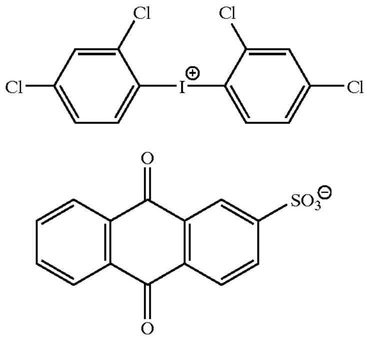
-continued
(PAG3-15)
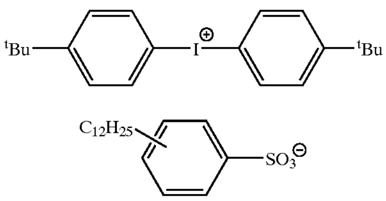
(PAG3-16)
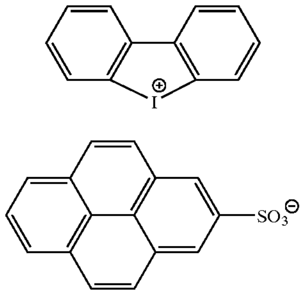
(PAG3-17)
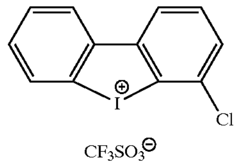
(PAG3-18)
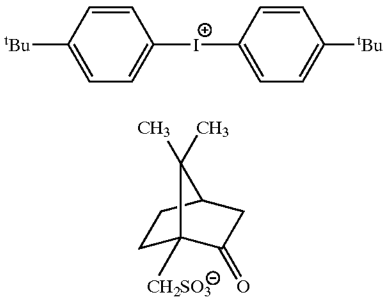
(PAG3-19)
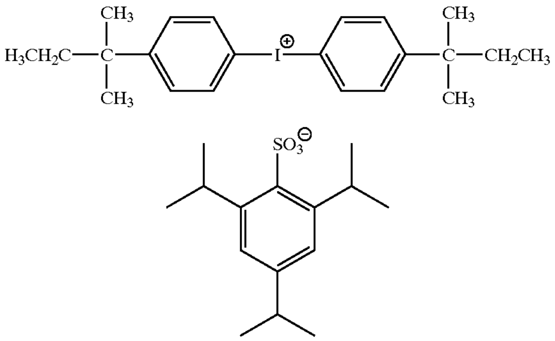
(PAG3-20)
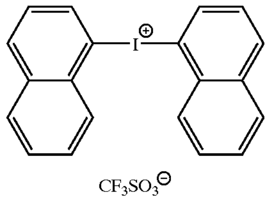

-continued
(PAG3-21)
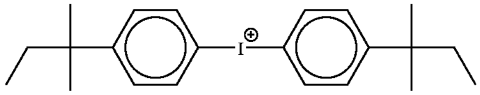
$C_4F_9SO_3^{\ominus}$
(PAG3-22)
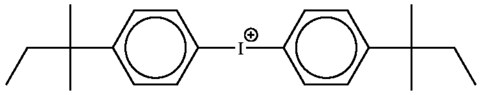
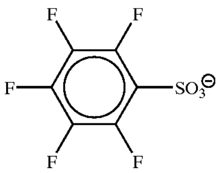
(PAG4-1)
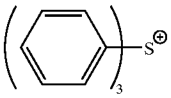
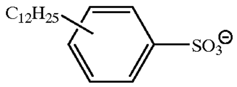
(PAG4-2)
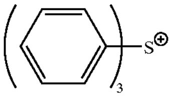
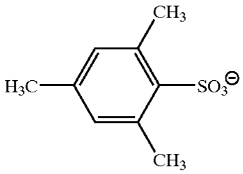
(PAG4-3)
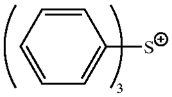
$C_4F_9SO_3^{\ominus}$
(PAG4-4)
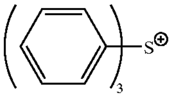
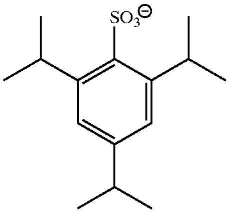
(PAG4-5)
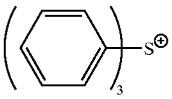
$CF_3SO_3^{\ominus}$
-continued
(PAG4-6)
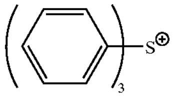
$C_8F_{17}SO_3^{\ominus}$
(PAG4-7)
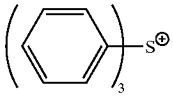
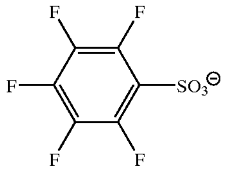
(PAG4-8)
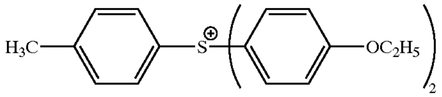
$CF_3SO_3^{\ominus}$
(PAG4-9)
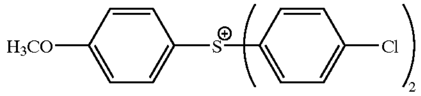
$CF_3SO_3^{\ominus}$
(PAG4-10)
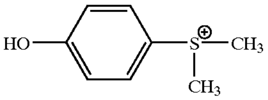
$C_4F_9SO_3^{\ominus}$
(PAG4-11)
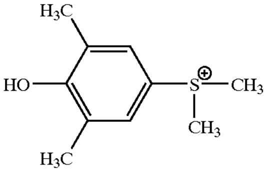
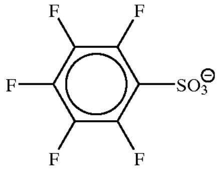
(PAG4-12)
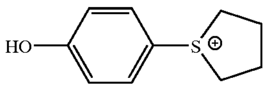
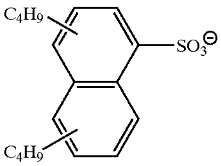

-continued
(PAG4-13)
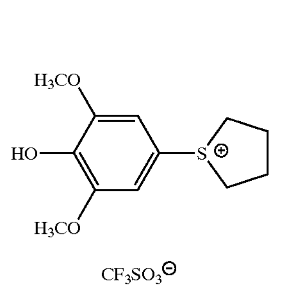
(PAG4-14)
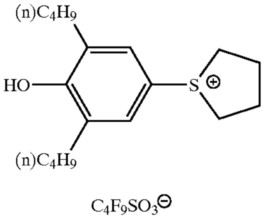
(PAG4-15)
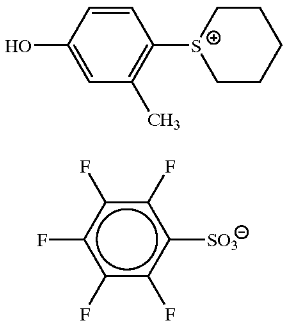
(PAG4-16)
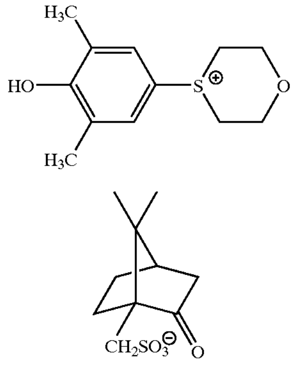
(PAG4-17)
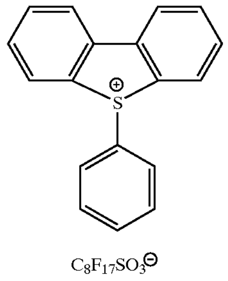
-continued
(PAG4-18)
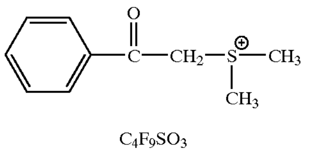
(PAG4-19)
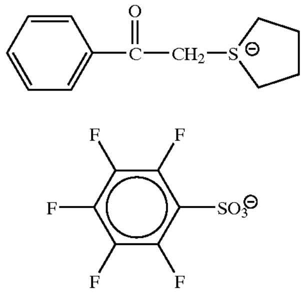
(PAG4-20)
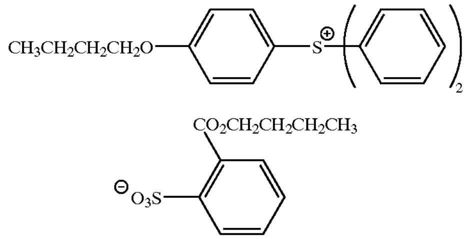
(PAG4-21)
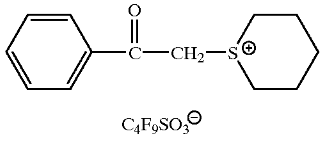
(PAG4-22)
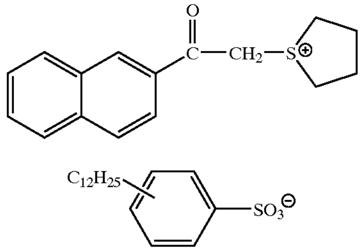
(PAG4-23)
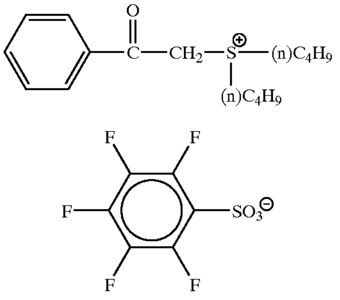
(PAG4-24)
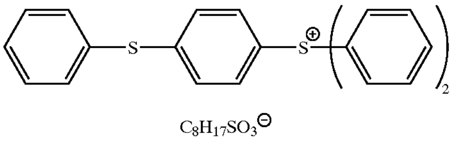

-continued (PAG4-25)

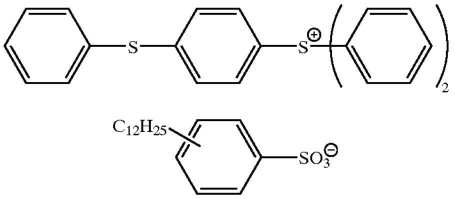

(PAG4-26)

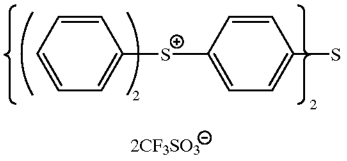

(PAG4-27)

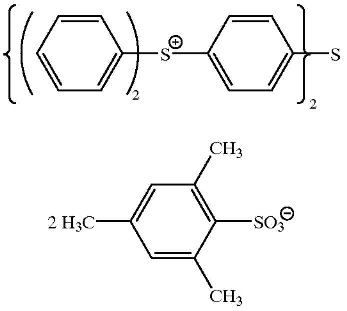

(PAG4-28)

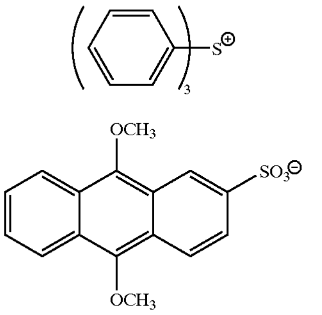

(PAG4-29)

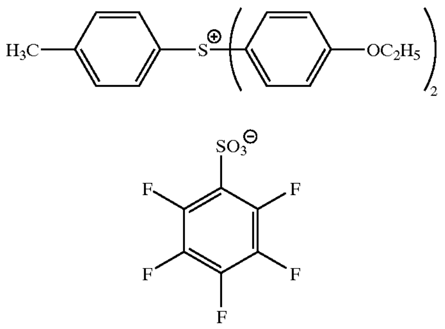

-continued (PAG4-30)

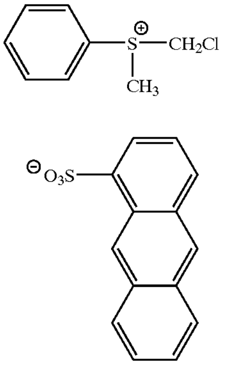

(PAG4-31)

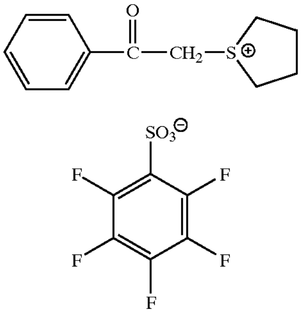

(PAG4-32)

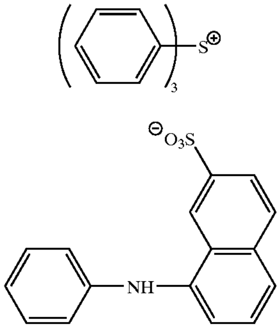

The above-mentioned onium salts represented by general formulas (PAG3) and (PAG4) are known, and can be synthesized, for example, by methods described in J. W. Knapczyk et al., *J. Am. Chem. Soc.,* 91, 145 (1969), A. L. Maycok et al., *J. Org. Chem.,* 35, 2532 (1970), E. Goethas et al., *Bull. Soc. Chem. Belg.,* 73, 546 (1964), H. M. Leicester, *J. Am. Chem. Soc.,* 51, 3587 (1929), J. V. Crivello et al., *J. Polymer Chem. Ed.,* 18, 2677 (1980), U.S. Pat. Nos. 2,807,648 and 4,247,473, and JP-A-53-101331.

(3) Disulfone derivatives represented by the following general formula (PAGS) or iminosulfonate derivatives represented by the following general formula (PAG6):

(PAG5)

$$Ar^3—SO_2—SO_2—Ar^4$$

(PAG6)

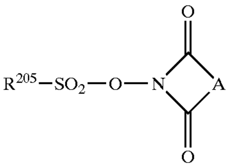

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples thereof include but are not limited (PAG5-1)

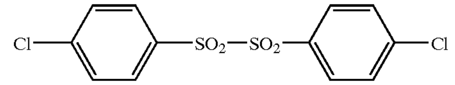

(PAG5-2)

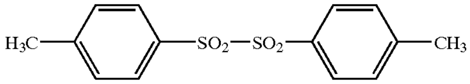

(PAG5-3)

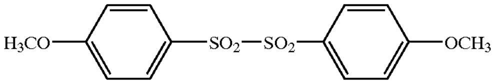

(PAG5-4)

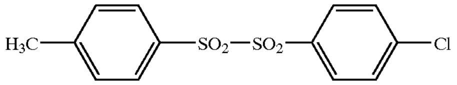

(PAG5-5)

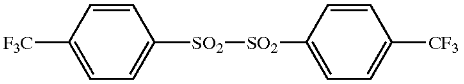

(PAG5-6)

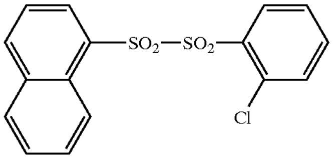

(PAG5-7)

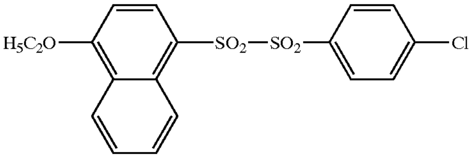

(PAG5-8)

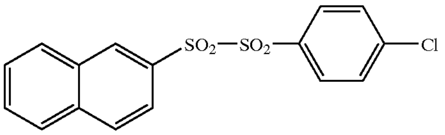

(PAG5-9)

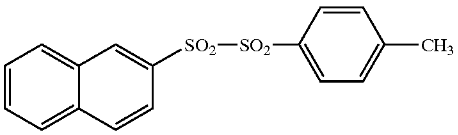

-continued (PAG5-10)

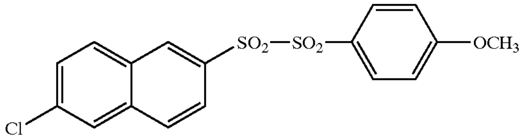

(PAG5-11)

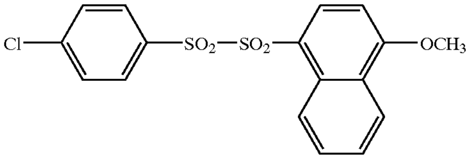

(PAG5-12)

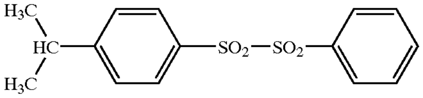

(PAG5-13)

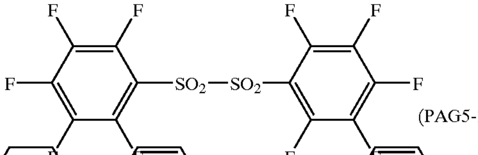

(PAG5-14)

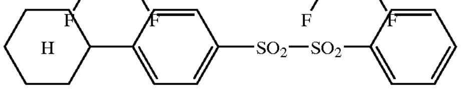

(PAG5-15)

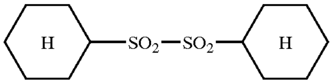

(PAG6-1)

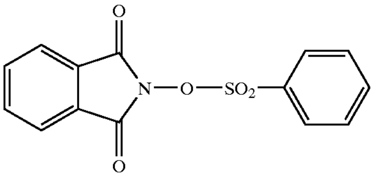

(PAG6-2)

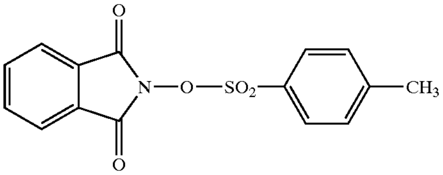

(PAG6-3)

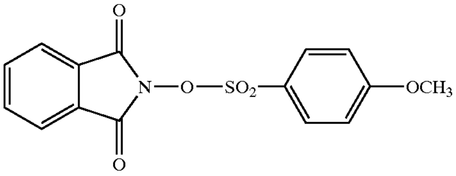

(PAG6-4)

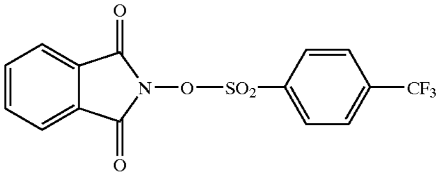

-continued
(PAG6-5)
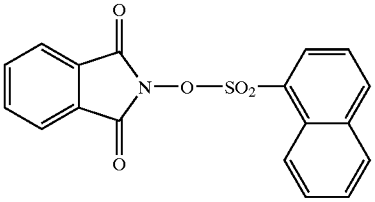
(PAG6-6)
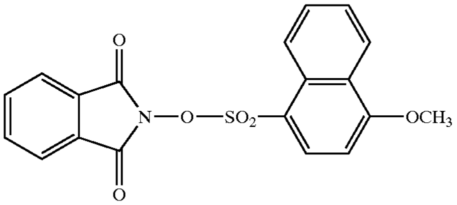
(PAG6-7)
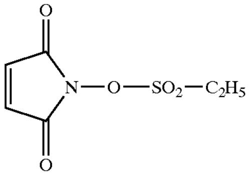
PAG6-8)
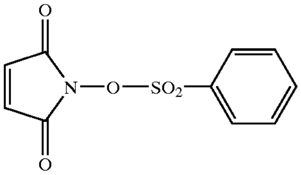
(PAG6-9)
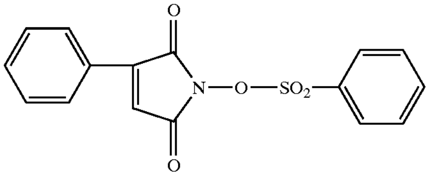
(PAG6-10)
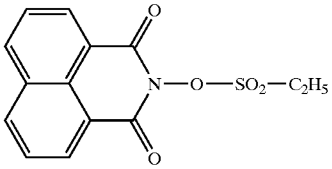
(PAG6-11)
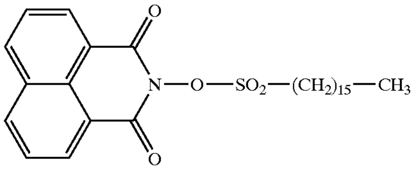
(PAG6-12)
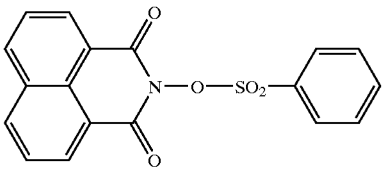
-continued
(PAG6-13)
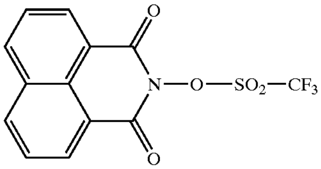
(PAG6-14)
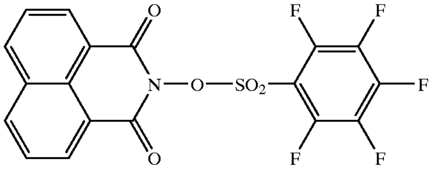
(PAG6-15)
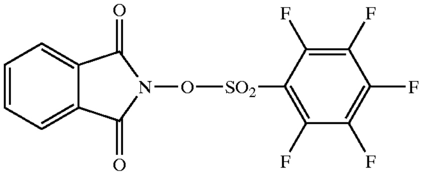
(PAG6-16)
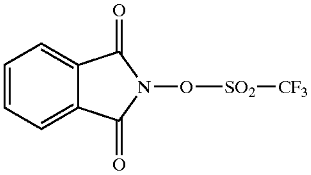
(PAG6-17)
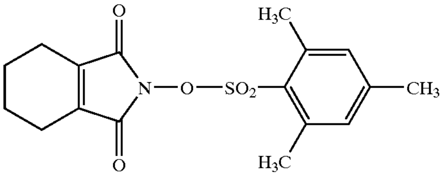
(PAG6-18)
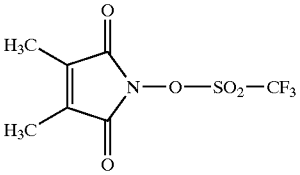
(PAG6-19)
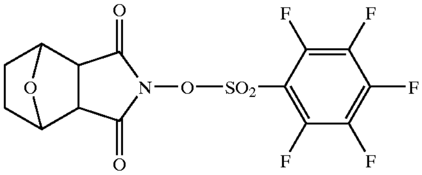
(PAG6-20)
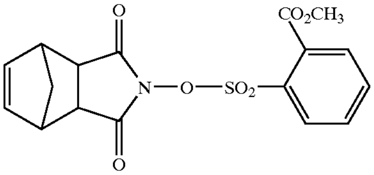
(4) Diazodisulfone derivatives represented by the following general formula (PAG7):

(PAG7)

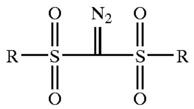

wherein R represents a straight-chain, branched or cyclic alkyl group, or an aryl group which may be substituted.

Specific examples thereof include but are not limited to the following compounds:

(PAG7-1)

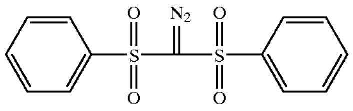

(PAG7-2)

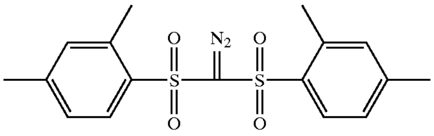

(PAG7-3)

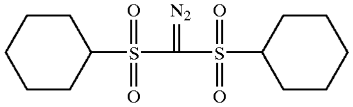

(PAG7-4)

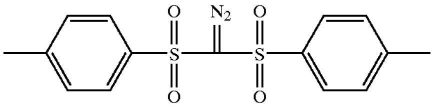

(PAG7-5)

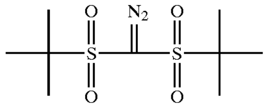

The acid generating agents used in the invention are preferably fluorine atom-containing onium salt compounds generating organic acids are preferred, and particularly preferred are onium salt compounds represented by the above-mentioned general formulas (I) to (III).

$R_1$ to $R_{37}$ in general formulas (I) to (III) each represents a hydrogen atom, an alkyl group, an alkoxyl group, a hydroxyl group, a halogen atom or a group indicated by —S—$R_{38}$.

The alkyl groups represented by $R_1$ to $R_{37}$ may be straight-chain, branched or cyclic. The straight-chain or branched alkyl groups include, for example, an alkyl group having from 1 to 4 carbon atoms such as methyl, ethyl, propyl, n-butyl, sec-butyl or t-butyl. The cyclic alkyl groups include, for example, an alkyl group having from 3 to 8 carbon atoms such as cyclopropyl, cyclopentyl or cyclohexyl.

The alkoxyl groups represented by $R_1$ to $R_{37}$ may be straight-chain, branched or cyclic. The straight-chain or branched alkoxyl groups include, for example, an alkoxyl group having from 1 to 8 carbon atoms such as methoxy, ethoxy, hydroxyethoxy, propoxy, n-butoxy, isobutoxy, sec-butoxy, t-butoxy or octyloxy. The cyclic alkoxyl groups include, for example, cyclopentyloxy and cyclohexyloxy.

The halogen atoms represented by $R_1$ to $R_{37}$ include a fluorine atom, a chlorine atom, a bromine atom and an iodine atom.

$R_{38}$ in —S—$R_{38}$ represented by $R_1$ to $R_{37}$ is an alkyl group or an aryl group. The alkyl groups represented by $R_{38}$ include, for example, ones already enumerated as the alkyl groups represented by $R_1$ to $R_{37}$.

The aryl groups represented by $R_{38}$ include an aryl group having 6 to 14 carbon atoms such as phenyl, tolyl, methoxyphenyl or naphthyl.

Any one of the alkyl, alkoxyl and aryl groups represented by $R_1$ to $R_{38}$ may further be combined with a substituent to increase the carbon number, or have no substituent. Preferred examples of the substituents with which the groups may further be combined include an alkoxyl group having from 1 to 4 carbon atoms, an aryl group having from 6 to 10 carbon atoms and an alkenyl group having from 2 t 6 carbon atoms and also include cyano, hydroxyl, carboxyl, alkoxycarbonyl and nitro. In addition, the substituents may be halogen atoms such as fluorine, chlorine and iodine.

Two or more of the groups represented by $R_1$ to $R_{15}$ in general formula (I) may be combined to form a ring. The groups represented by $R_1$ to $R_{15}$ may be combined with each other directly at their ends, or indirectly through at least one atom selected from carbon, oxygen, sulfur and nitrogen to form the ring. The ring structures formed by combination of two or more of $R_1$ to $R_{15}$ include the same structures as the ring structures seen in furan, dihydrofuran, pyran, trihydropyran, thiophene and pyrrole rings. $R_{16}$ to $R_{27}$ in general formula (II) are similar to the above. Two or more of them may be combined directly or indirectly with each other to form a ring. $R_{28}$ to $R_{37}$ in general formula (III) are also similar thereto.

General formulas (I) to (III) have $X^-$ which is an anion of an acid. The acid forming the anion is an acid selected from benzenesulfonic acid, naphthalenesulfonic acid and anthracenesulfonic acid. More preferably, the acid is substituted by at least one fluorine atom. Alternately, the acid has at least one organic group selected from the group consisting of an alkyl group, an alkoxyl group, an acyl group, an acyloxy group, a sulfonyl group, a sulfonyloxy group, a sulfonylamino group, an aryl group, an aralkyl group and an alkoxycarbonyl group. More preferably, the organic group is further substituted by at least one fluorine atom. The above-mentioned benzenesulfonic acid, naphthalenesulfonic acid or anthracenesulfonic acid may be substituted by a halogen atom other than a fluorine atom, a hydroxyl group or a nitro group.

The alkyl groups combined with benzenesulfonic acid or the like which forms the $X^-$ anion include, for example, an alkyl group having from 1 to 12 carbon atoms. The alkyl groups may be straight-chain,branched or cyclic. They are each preferably substituted by 1 to 25 fluorine atoms. Specific examples thereof include trifluoromethyl, pentafluoroethyl, 2,2,2-tri-fluoroethyl, heptafluoropropyl, heptafluoroisopropyl, perfluorobutyl, perfluorooctyl, perfluorododecyl and perfluorocyclohexyl. A perfluoroalkyl group having from 1 to 4 carbon atoms in which all are substituted by fluorine atoms is preferred among others.

The alkoxyl groups combined with benzenesulfonic acid or the like described above, together with or independently of the alkyl groups, are an alkoxyl group having from 1 to 12 carbon atoms. The alkoxyl groups may be straight-chain, branched or cyclic. Preferably, they are each substituted by 1 to 25 fluorine atoms. Specific examples thereof include trifluoromethoxy, pentafluoroethoxy, heptafluoroisopropyloxy, perfluorobutoxy, perfluorooctyloxy, perfluorododecyloxy and perfluorocyclohexyloxy. A perfluoroalkoxyl group having from 1 to 4 carbon atoms in which all are substituted by fluorine atoms is preferred among others.

The acyl groups combined with benzenesulfonic acid or the like described above, together with or independently of the alkyl groups, are preferably an acyl group having from 2 to 12 carbon atoms and substituted by 1 to 23 fluorine atoms. Specific examples thereof include trifluoroacetyl, fluoroacetyl, pentafluoropropionyl and pentafluorobenzoyl.

The acyloxy groups combined with benzenesulfonic acid or the like described above, together with or independently of the alkyl groups, are preferably an acyloxy group having from 2 to 12 carbon atoms and substituted by 1 to 23 fluorine atoms. Specific examples thereof include trifluoroacetoxy, fluoroacetoxy, pentafluoropropionyloxy and pentafluorobenzoyloxy.

The sulfonyl groups combined with benzenesulfonic acid or the like described above, together with or independently of the alkyl groups, are preferably a sulfonyl group having from 1 to 12 carbon atoms and substituted by 1 to 25 fluorine atoms. Specific examples thereof include trifluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl.

The sulfonyloxy groups combined with benzenesulfonic acid or the like described above, together with or independently of the alkyl groups, are preferably a sulfonyloxy group having from 1 to 12 carbon atoms and substituted by 1 to 25 fluorine atoms. Specific examples thereof include trifluoromethanesulfonyloxy, perfluorobutanesulfonyloxy and 4-trifluoromethylbenzenesulfonyloxy.

The sulfonylamino groups combined with benzenesulfonic acid or the like described above, together with or independently of the alkyl groups, are preferably a sulfonylamino group having from 1 to 12 carbon atoms and substituted by 1 to 25 fluorine atoms. Specific examples thereof include trifluoromethanesulfonylamino, perfluorobutanesulfonylamino, perfluorooctanesulfonylamino and pentafluorobenzenesulfonylamino.

The aryl groups combined with benzenesulfonic acid or the like described above, together with or independently of the alkyl groups, are preferably an aryl group having from 6 to 14 carbon atoms and substituted by 1 to 9 fluorine atoms. Specific examples thereof include pentafluorophenyl, 4-trifluoromethylphenyl, heptafluoronaphthyl, nonafluoroanthranyl, 4-fluorophenyl and 2,4-difluorophenyl.

The aralkyl groups combined with benzenesulfonic acid or the like described above, together with or independently of the alkyl groups, are preferably an aralkyl group having from 7 to 10 carbon atoms and substituted by 1 to 15 fluorine atoms. Specific examples thereof include pentafluorophenylmethyl, pentafluorophenylethyl, perfluorobenzyl and perfluorophenethyl.

The alkoxycarbonyl groups combined with benzenesulfonic acid or the like described above, together with or independently of the alkyl groups, are preferably an alkoxycarbonyl group having from 2 to 13 carbon atoms and substituted by 1 to 25 fluorine atoms. Specific examples thereof include trifluoromethoxycarbonyl, pentafluoroethoxycarbonyl, pentafluorophenoxycarbonyl, perfluorobutoxycarbonyl and perfluorooctyloxycarbonyl.

Of such $X^-$ anions, most preferred is a fluorine-substituted benzenesulfonic acid anion, and a pentafluorobenzenesulfonic acid anion is particularly preferred among others.

In addition, benzenesulfonic acid, naphthalenesulfonic acid or anthracenesulfonic acid having the above-mentioned fluorine-containing substituent may be further substituted by a straight-chain, branched or cyclic alkoxyl group, an acyl group, an acyloxy group, a sulfonyl group, a sulfonyloxy group, a sulfonylamino group, an aryl group, an aralkyl group, an alkoxycarbonyl group (the carbon number range of these groups is the same as described above), a halogen atom (excluding fluorine), a hydroxyl group or a nitro group.

Specific examples of these compounds represented by general formulas (I) to (III) are shown below,but are not limited thereto.

(I-1)

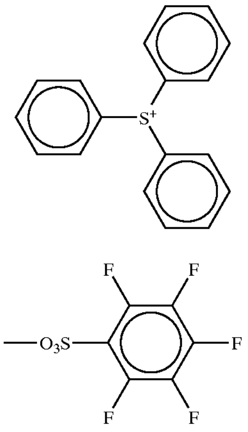

(I-2)

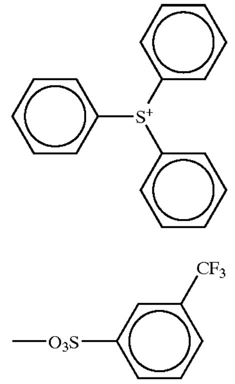

(I-3)

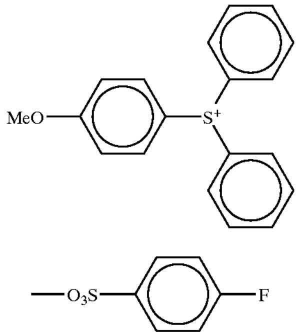

-continued
(I-4)
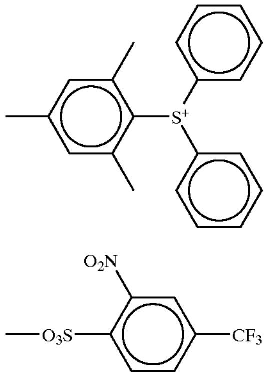
(I-5)
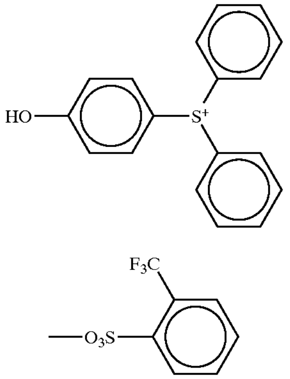
(I-6)
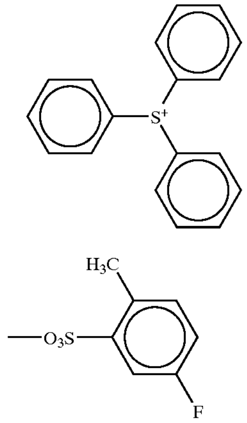
-continued
(I-7)
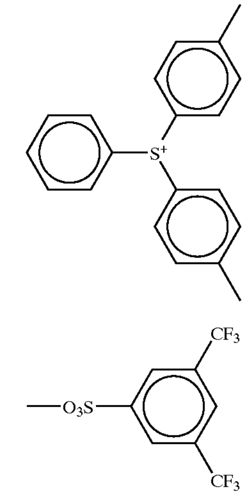
(I-8)
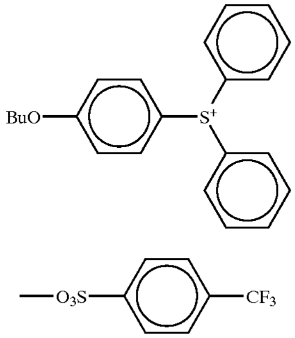
(I-9)
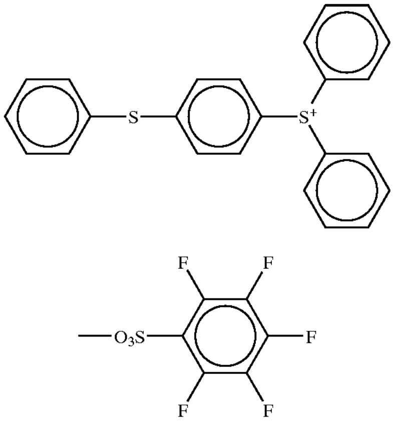
(I-10)
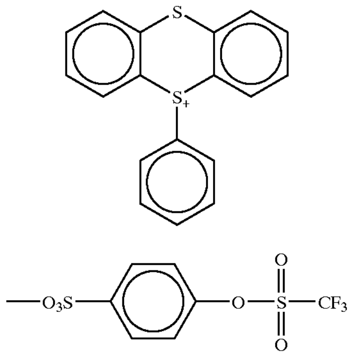

-continued
(I-11)
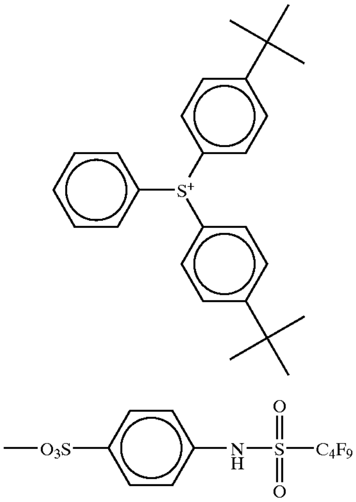
(I-12)
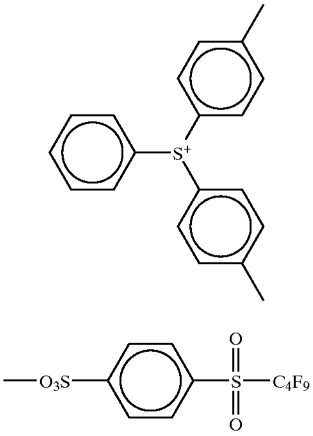
(I-13)
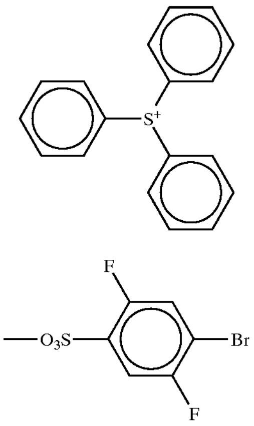
-continued
(I-14)
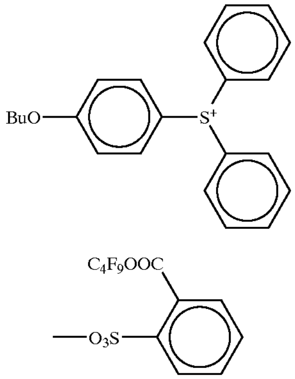
(II-1)
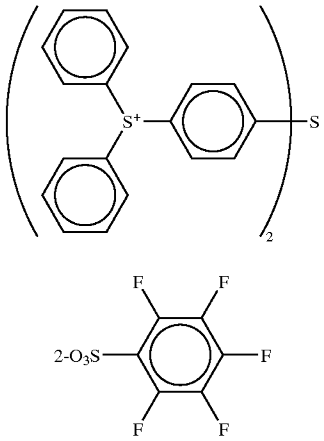
(II-2)
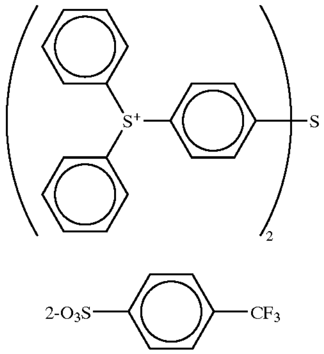
(II-3)
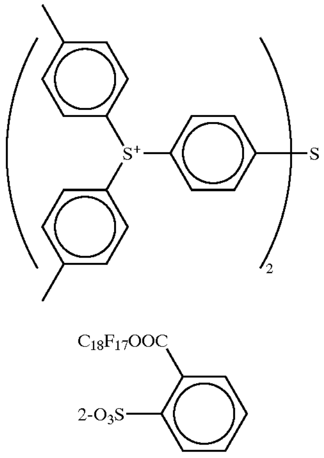

-continued (II-4)

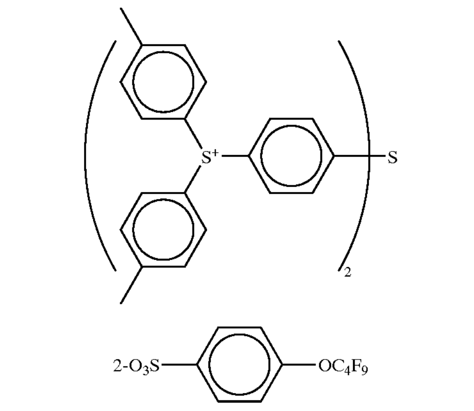

(II-5)

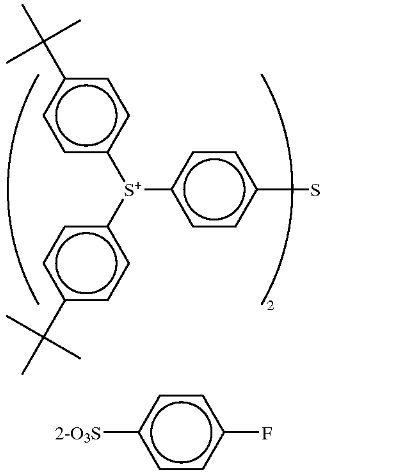

(III-1)

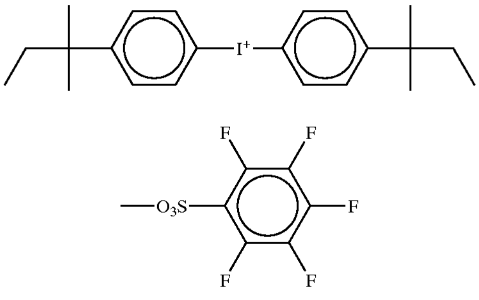

(III-2)

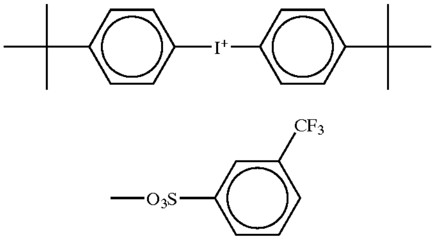

(III-3)

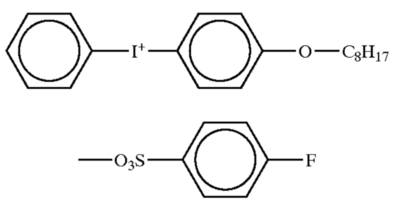

-continued (III-4)

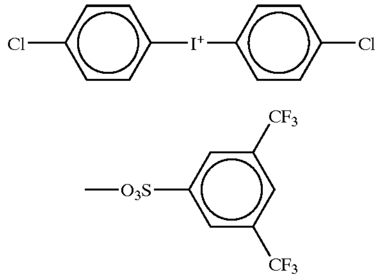

(III-5)

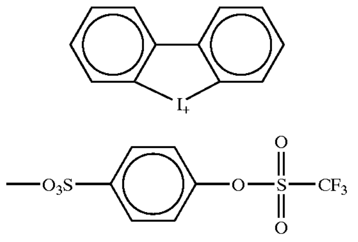

(III-6)

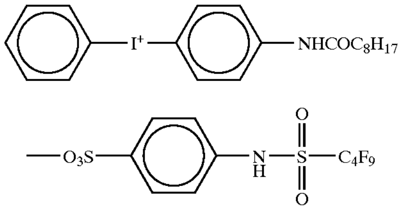

(III-7)

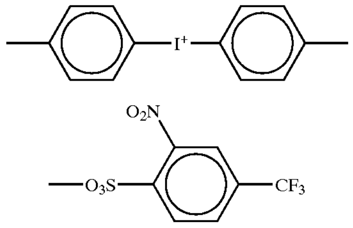

(III-8)

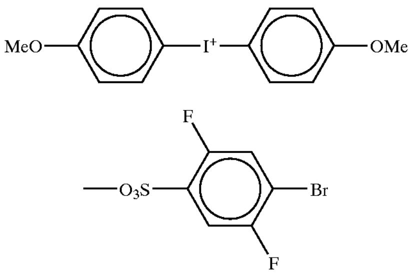

The compounds of general formulas (I) and (II) can be synthesized by the following processes. For example, aryl Grignad reagents such as arylmagnesium bromides are reacted with phenyl sulfoxides to obtain triarylsulfonium halides, and the salt interchange thereof with sulfonic acids corresponding thereto is conducted. As another process, there is, for example, a process of conducting the condensation and salt interchange of phenyl sulfoxides with aromatic compounds corresponding thereto using acid catalysts such as methanesulfonic acid/diphosphorus pentaoxide or aluminum chloride. Further, the compounds can be synthesized by a process in which the condensation and salt interchange of diaryliodonium salts with diaryl sulfides are conducted using catalysts such as copper acetate. In any one of the above-mentioned processes, the phenyl sulfoxides may have substituents on benzene rings, or may not have such substituents.

The compounds of general formula (III) can be synthesized by reacting aromatic compounds using periodates.

The amount of the acid generating agents used in the invention is suitably from 0.1% to 20% by weight, preferably from 0.5% to 10% by weight, and more preferably from 1% to 7% by weight, based on the total solid content of negative-working resist composition.

(Other Photo Acid Generators)

In the invention, other compounds which are decomposed by radiation irradiation to generate acids can be used, except or together with the above-described compounds (e.g., the compounds represented by general formulas (I) to (III)). When the other compounds which are decomposed by radiation irradiation to generate acids are used except or together with the above-described compounds, the ratio of the other compounds which are decomposed by radiation irradiation to generate acids to the compounds is from 100/0 to 20/80, preferably from 90/10 to 40/60, and more preferably from 80/20 to 50/50, in molar ratio.

(3) Crosslinking Agents Used in the Invention

In the negative-working resist compositions of the invention, compounds crosslinking by acids (hereinafter referred to as acid-crosslinking agents or briefly crosslinking agents) are used together with the acid generating agents.

(3)-1. As the crosslinking agents, phenol derivatives can be used. Preferably, they include a phenol derivative having a molecular weight of 1,200 or less, containing from 3 to 5 benzene rings in its molecule and having two or more of hydroxymethyl groups or alkoxymethyl groups in all, in which the hydroxymethyl groups or alkoxymethyl groups are bonded collectively to at least any one of the benzene rings, or divisionally to the benzene rings. The use of such phenol derivatives allows the effect of the invention to become more significant.

The alkoxymethyl groups bonded to the benzene rings are preferably an alkoxymethyl group having 6 or less carbon atoms. Preferred examples thereof include methoxymethyl, ethoxymethyl, n-propoxymethyl, i-propoxymethyl, n-butoxymethyl, i-butoxymethyl, sec-butoxymethyl and t-butoxymethyl. Further, alkoxy-substituted alkoxyl groups such as 2-methoxyethoxy and 2-methoxy-1-propyl are also preferred.

Of these phenol derivatives, particularly preferred ones are shown below:

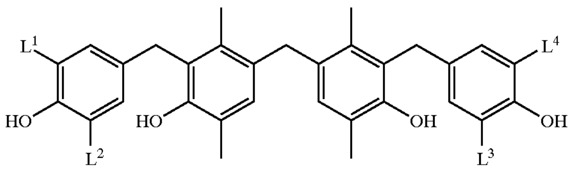

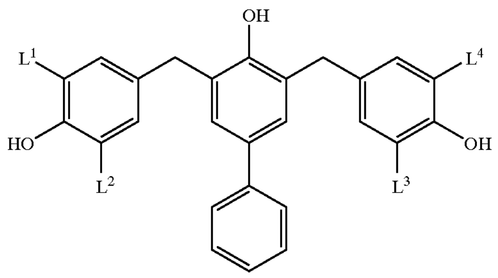

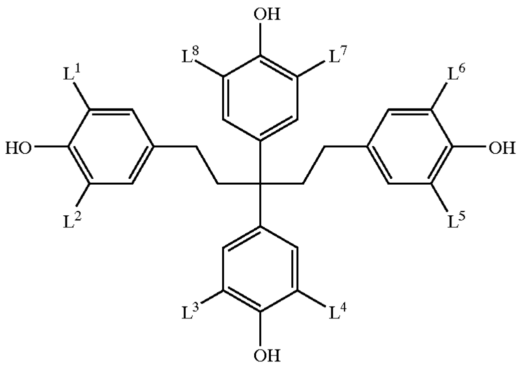

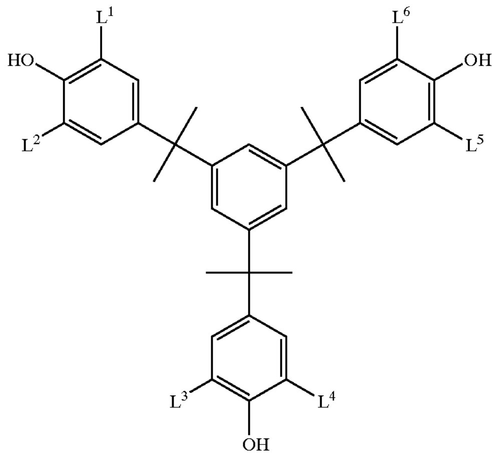

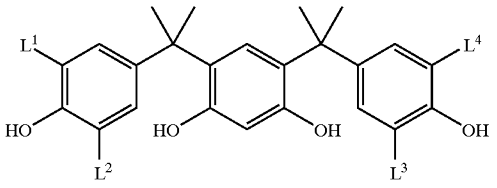

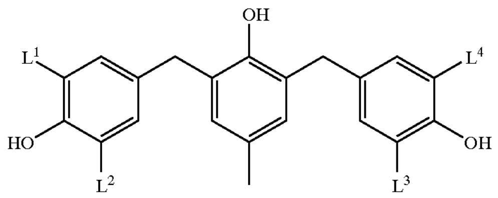

-continued
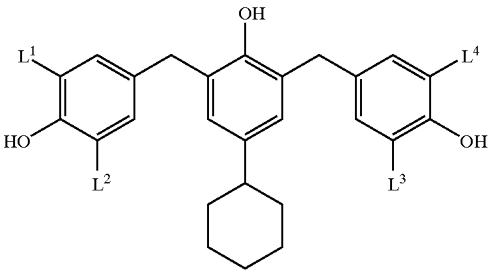
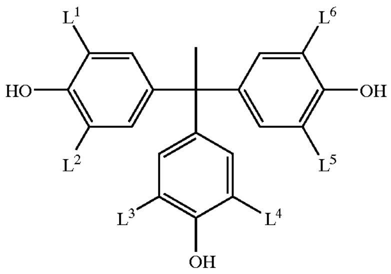
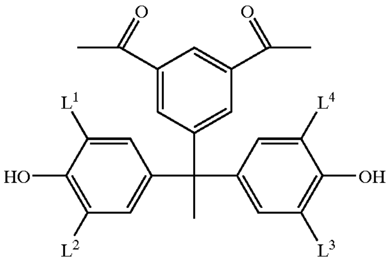
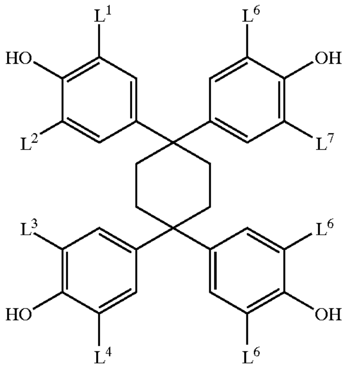
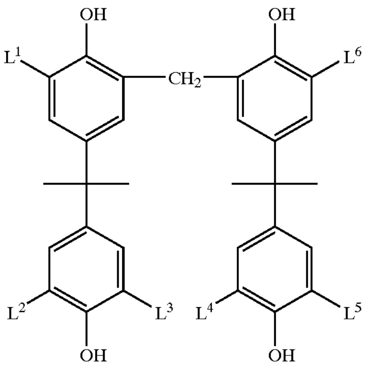
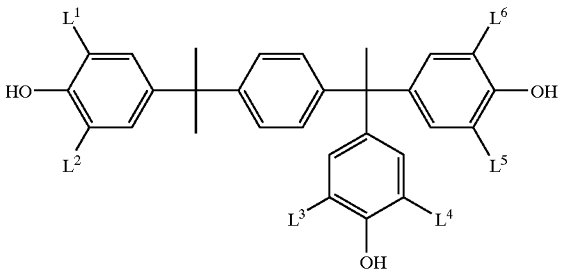
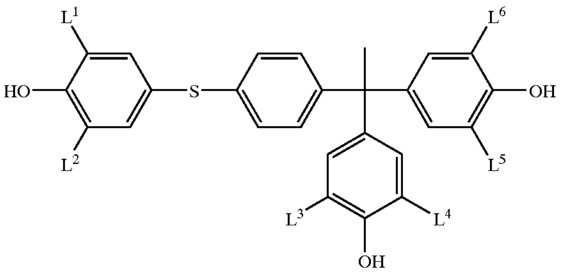
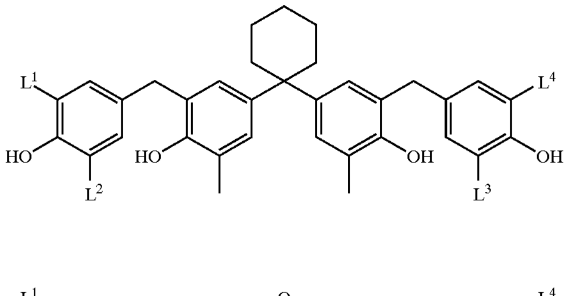
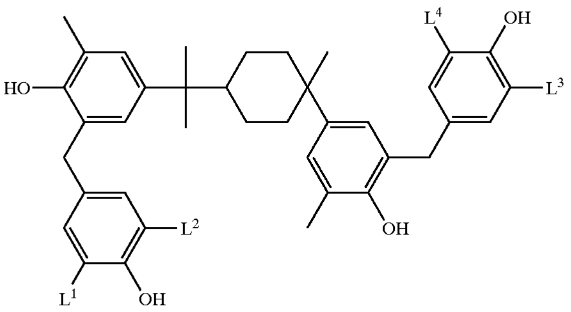
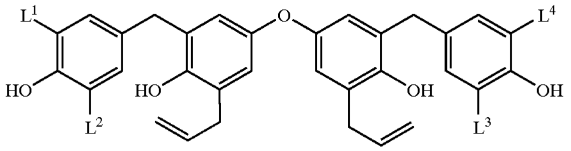

-continued

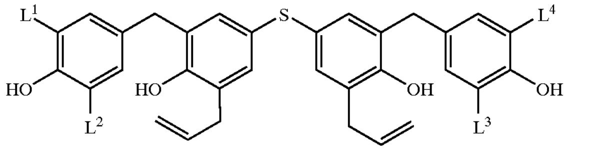

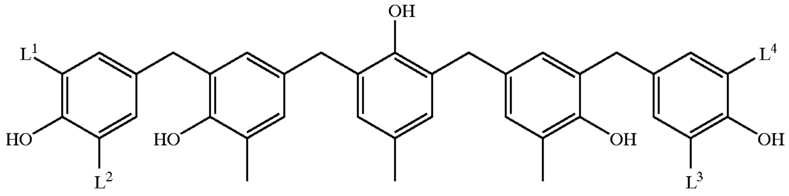

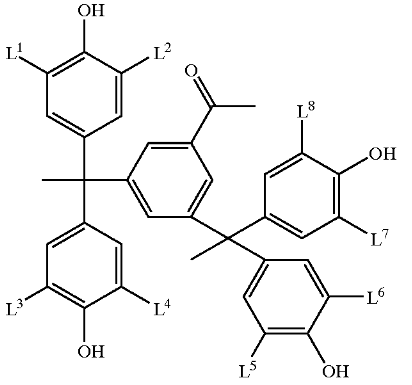

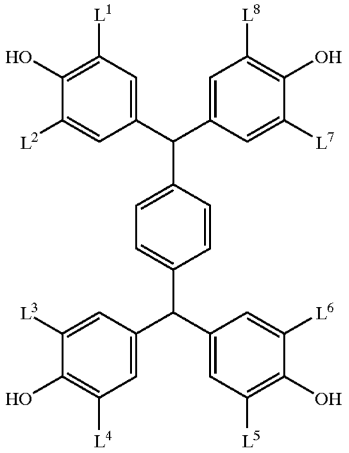

wherein $L^1$ to $L^8$, which may be the same or different, each represents a hydroxymethyl group, a methoxymethyl group or an ethoxymethyl group.

The phenol derivatives having hydroxymethyl groups can be obtained by reacting corresponding phenol compounds having no hydroxymethyl groups (compounds in which $L^1$ to $L^8$ are hydrogen atoms in the above formulas) with formaldehyde in the presence of base catalysts. In this case, the reaction is preferably conducted at a temperature of 60° C. or less, for preventing resinification and gelation. Specifically, they can be synthesized by methods described in JP-A-6-282067 and JP-A-7-64285.

The phenol derivatives having alkoxymethyl groups can be obtained by reacting corresponding phenol compounds having hydroxymethyl groups with alcohols in the presence of acid catalysts. In this case, the reaction is preferably conducted at a temperature of 100° C. or less, for preventing resinification and gelation. Specifically, they can be synthesized by methods described in EP-A-632,003 (the term "EP-A" as used herein means an "unexamined published European patent application".

The hydroxymethyl group- or alkoxymethyl group-containing phenol derivatives thus synthesized are preferred in respect to stability in storage, and the alkoxymethyl group-containing phenol derivatives are particularly preferred from the viewpoint of stability in storage.

These phenol derivatives each having two or more of hydroxymethyl groups or alkoxymethyl groups in all, in which the hydroxymethyl groups or alkoxymethyl groups are bonded collectively to at least any one of the benzene rings, or divisionally to the benzene rings, may be used either alone or as a combination of two or more of them.

(3)-2. In addition to the above-mentioned phenol derivatives, compounds of (i) and (ii) described below can be used as crosslinking agents.

(i) Compounds having N-hydroxymethyl groups, N-alkoxymethyl groups or N-acyloxymethyl groups; and (ii) Epoxy compounds.

These crosslinking agents are described in detail below.

(i) The compounds having N-hydroxymethyl groups, N-alkoxymethyl groups or N-acyloxymethyl groups include monomer/oligomer-melamine-formaldehyde condensation products and urea-formaldehyde condensation products disclosed in EP-A-0,133,216, West German Patents 3,634,671 and3,711,264, alkoxy-substituted compounds disclosed in EP-A-0,212,482 and benzoguanamine-formaldehyde condensation products disclosed in JP-A-8-109314.

More preferred examples thereof include melamine-formaldehyde derivatives each having at least two free N-hydroxymethyl groups, N-alkoxymethyl groups or N-acyloxymethyl groups, and the N-alkoxymethyl derivatives are particularly preferred among others.

(ii) The epoxy compounds include monomers, dimers, oligomers and polymers of epoxy compounds each having at least one epoxy group. Examples thereof include reaction products of bisphenol A and epichlorohydrin, reaction products of low molecular weight phenol-formaldehyde resins and epichlorohydrin, and further epoxy resins described and used in U.S. Pat. No. 4,026,705 and British Patent 1,539,192.

In the invention, the above-mentioned phenol derivatives are preferred.

In addition to the phenol derivatives, for example, the other crosslinking agents (i) and (ii) described above can be used in combination with them.

The ratio of the other crosslinking agents to the phenol derivatives is from 100/0 to 20/80, preferably from 90/10 to 40/60, and more preferably from 80/20 to 50/50, in molar ratio.

The phenol derivatives are used in an amount of 3% to 70% by weight, and preferably in an amount of 5% to 50% by weight, based on the total solid content of resist composition. When the amount of the crosslinking agents added is less than 3% by weight, the residual film rate is decreased. On the other hand, exceeding 70% by weight results in reduced resolution, and further unfavorably leads to deteriorated stability in storage of resist solutions.

(4) Other Components Used in Compositions of the Invention

The negative-working resist compositions of the invention can further contain organic basic compounds, dyes and surfactants as needed.

(4)-1 Dyes

The suitable dyes are oil dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Kagaku Kogyo Co., Ltd.), Crystal Violet (CI42555), Methyl Violet (CI42535), Rhodamine B (CI45170B), Malachite Green (CI42000) and Methylene Blue (CI52015).

(4)-2 Organic Basic Compounds

The organic basic compounds which can be used in the invention are preferably compounds stronger in basicity than phenol, and nitrogen-containing basic compounds are preferred among others.

Preferred examples thereof include compounds having structures represented by the following formulas (A) to (E):

(A)

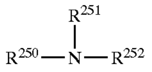

(B)

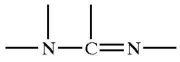

(C)

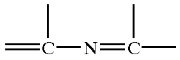

(D)

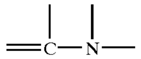

(E)

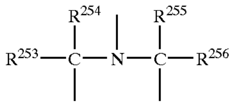

wherein $R^{250}$, $R^{251}$ and $R^{252}$ which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, and $R^{251}$ and $R^{252}$ may combine with each other to form a ring.

$R^{253}$, $R^{254}$, $R^{255}$ and $R^{256}$, which may be the same or different, each represents an alkyl group having 1 to 6 carbon atoms.

More preferred are nitrogen-containing basic compounds each having two or more nitrogen atoms different in chemical environment in one molecule, and particularly preferred are compounds each having both a substituted or unsubstituted amino group and a nitrogen atom-containing ring structure, or alkylamino group-containing compounds.

Preferred examples thereof include substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstitutedpyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines. Preferred substituents are amino, aminoalkyl, alkylamino, aminoaryl, arylamino, alkyl, alkoxyl, acyl, acyloxy, aryl, aryloxy, nitro, hydroxyl and cyano.

Particularly preferred examples of the compounds include but are not limited to guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(amino-methyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

These nitrogen-containing basic compounds are used either alone or as a combination of two or more of them. The molar ratio of the acid generating agent to the organic basic compound used in the composition is preferably from 2.5 to 300. When the molar ratio is less than 2.5, the sensitivity is decreased to cause a reduction in resolution in some cases. On the other hand, when the ratio exceeds 300, the resist pattern grows thick with an elapse of time from exposure to heat treatment to cause a reduction in resolution in some cases. The molar ratio of the acid generating agent to the organic basic compound is preferably from 5.0 to 200, and more preferably from 7.0 to 150. The addition of these nitrogen-containing basic compounds gives the effect of improving aging stability (PCD stability and PED stability) of resist films.

The term "PCD (post coating delay) stability" as used herein means stability of a coating film formed by applying a resist composition onto a substrate and allowed to stand inside or outside an irradiation apparatus. The term "PED (post exposure delay) stability" as used herein means stability of a coating film allowed to stand inside or outside an irradiation apparatus during a period from irradiation to heating operation.

(4)-3 Solvents

The compositions of the invention are dissolved in solvents which can dissolve the above-mentioned respective components, and applied onto supports. Preferred examples of the solvents used herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. These solvents are used either alone or as a mixture thereof.

(4)-4 Surfactants

Surfactants can also be added to the negative-working resist compositions of the invention. Specific examples of such surfactants include nonionic surfactants such as polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine surfactants such as Eftop EF301, EF303 and EF352 (manufactured by Shin-Akita Kasei Co., Ltd.), Megafac F171 and F173 (manufactured by Dainippon Ink & Chemicals, Inc.), Florad FC430 and FC431 (manufactured by Sumitomo 3M Ltd.), and Asahiguard AG710, Surflon S-382, SC101, SC102, SC103, SC104, SC105 and SC106 (manufactured by Asahi Glass Co., Ltd.); Organopolysiloxane Polymer KP-341 (manufactured by Shin-Etsu Chemical Co., Ltd.); acrylic or methacrylic (co) polymers, Polyflow No. 75 and No. 95 (manufactured by Kyoeisha Yushi Kagaku Kogyo Co., Ltd.); and Troy Sol S-366 (manufactured by Troy Chemical Co., Ltd.).

It is preferred that at least one kind of surfactant of the fluorine and silicon surfactants is added. It is also preferred that a surfactant having both fluorine and silicon atoms is added. Examples of these surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-59881 U.S. Pat. Nos. 5,405,720, 5,360,692, 5,529,881, 5,296,330, 5,436,098, 5,576,143, 5,296,143, 5,294,511 and 5,824,451. The following commercially available surfactants can also be used as such. The commercially available surfactants include, for example, fluorine or silicon surfactants such as Eftop EF301 and EF303 (manufactured by Shin-Akita Kasei Co., Ltd.), Megafack F171, F173, F176, F189 and R08 (manufactured by Dainippon Ink & Chemicals, Inc.), Surflon S-382, SC101, SC102, SC103, SC104, SC105 and SC106 (manufactured by Asahi Glass Co., Ltd.), and Troy Sol S-366 (manufactured by Troy Chemical Co., Ltd.). Polysiloxane Polymer KP-341 (manufactured by Shin-Etsu Chemical Co., Ltd.) can also be used as the silicon surfactant.

The amount of these surfactants compounded is usually from 0.001 to 2 parts by weight, and preferably from 0.01 to 1 part by weight, per 100 parts by weight of solid matter contained in the composition of the invention. These surfactants can be added either alone or as a combination of some of them. The addition of these surfactants gives the effects of increasing the in-plane uniformity of resist films and improving the resolution.

In the pattern formation process on resist films in the production of precision integrated circuit elements, the negative-working photoresist compositions of the invention are applied onto substrates (e.g., transparent substrates such as silicon/silicon dioxide coatings, glass substrates and ITO substrates), and then irradiated using an electron beam or X-ray lithography system, followed by heating, development, rinsing and drying, thereby being able to form good resist patterns.

Developing solutions which can be used for developing the negative-working photoresist compositions of the invention include aqueous solutions of inorganic alkalis such as sodium hydroxide, potassium hydroxide, sodium carbonate, sodium silicate, sodium metasilicate and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide and choline; and cyclic amines such as pyrrole and piperidine. Further, alcohols such as isopropyl alcohol and/or surfactants such as nonionic surfactants can also be added in appropriate amounts to the aqueous solutions of the above-mentioned alkalis.

Of these developing solutions, preferred are the quaternary ammonium salts, and more preferred are tetramethylammonium hydroxide and choline.

The present invention will hereinafter be described in more detail by reference to examples, which are, however, not to be construed as limiting the invention.

1. Synthesis Examples of Constituent Materials (1) Alkali-Soluble Resins 1) 3-t-Butoxystyrene (17.6 g) was added to 27 g of dry THF, followed by heating at 70° C. in a stream of nitrogen. When the reaction temperature was stabilized, an azo radical initiator (V-601, manufactured by Wako Pure Chemical Industries, Ltd. was added in an amount of 2 mol % based on the above-mentioned monomer to initiate the reaction. After the reaction was continued for 3 hours, 2 mol % of V-601 was added again, and the reaction was further continued for 3 hours. The reaction mixture was diluted with THF, and the diluted mixture was poured into a large amount of methanol to precipitate a polymer. The resulting polymer was decomposed by a conventional method in an acidic hydrochloric acid solution, and the resulting product was precipitated in hexane. Purification by reprecipitation was further repeated twice, followed by drying under reduced pressure to obtain polymer (P-1). The molecular weight (Mw: converted to polystyrene) and the molecular weight distribution were determined by the GPC measurement.

2) Polymers (P-2) to (P-4), (P-6), (P-7) and (P-11) were obtained in the same manner as described above with the exception that the monomer was changed.

3) 3-Acetoxystyrene (16.2 g) was added to 24 g of dry THF, followed by heating at 70° C. in a stream of nitrogen. When the reaction temperature was stabilized, an azo radical initiator (V-60, manufactured by Wako Pure Chemical Industries, Ltd.) was added in an amount of 2 mol % based on the above-mentioned monomer to initiate the reaction. After the reaction was continued for 3 hours, 2 mol % of V-60 was added again, and the reaction was further continued for 3 hours. The reaction mixture was diluted with THF, and the diluted mixture was poured into a large amount of methanol to precipitate a polymer. The resulting polymer was hydrolyzed by a conventional method in a basic solution, and the resulting product was precipitated in hexane. Purification by reprecipitation was further repeated twice, followed by drying under reduced pressure to obtain polymer (P-5).

4) In dry propylene glycol monomethyl ether acetate, 12 g of polymer (P-1) obtained in 1) described above was dissolved, and 1.0 g of β-cyclohexyl ethyl vinyl ether and 10 mg of p-toluenesulfonic acid were added thereto, followed by stirring at room temperature for 1 hour. Then, triethylamine was added thereto.

The reaction solution was poured into water, and the precipitated powder was collected by filtration, followed by drying under reduced pressure to obtain polymer (P-9)

5) Polymer (P-8) and (P-10) were normally obtained by methods similar to that described in 4), according to reagents used.

6) 3-Hydroxystyrene (11.3 g) and 4-t-butoxystyrene (5.3 g) were added to 30 g of dry THF, followed by heating at 70° C. in a stream of nitrogen. When the reaction temperature was stabilized, an azo radical initiator (V-601, manufactured by Wako Pure Chemical Industries, Ltd.) was added in an amount of 2 mol % based on the above-mentioned monomer to initiate the reaction. After the reaction was continued for 3 hours, 2 mol % of V-601 was added again, and the reaction was further continued for 3 hours. The reaction mixture was diluted with THF, and the diluted mixture was poured into a large amount of methanol to precipitate a polymer. Purification by reprecipitation was further repeated twice, followed by drying under reduced pressure to obtain polymer (P-12).

7) Polymer (p-13) was obtained in a manner similar to that of 6) described above.

8) 3-t-Butoxystyrene (17.6 g) was subjected to living anion polymerization in deaerated dry THF at −78° C. using s-butyllithium as an initiator. After the reaction for 3 hours, the reaction was terminated with deaerated methanol. The reaction product was poured into a large amount of methanol, and the precipitated powder was collected by filtration. Purification by reprecipitation was further repeated twice, followed by drying under reduced pressure to obtain a resin. The t-butoxy groups of the resin were decomposed by a conventional method under acidic hydrochloric acid conditions to obtain polymer (P-21).

9) Polymer (P-22) was obtained in the same manner as with 8) described above with the exception that the amount of the initiator was adjusted.

10) Polymers (P-23) to (P-28) were each obtained in the same manner as with 8) with the exception that 10%, 20% and 30% by weight of the monomer were each replaced by 4-t-butoxystyrene and the amount of the initiator was adjusted.

11) A polymer was obtained in the same manner as with 1) with the exception that a mixture of 3-t-butoxystyrene/4-t-butoxystyrne (60/40 by weight ratio) was used as monomer materials. The resulting polymer was fractionally precipitated from a dilute acetone solution to obtain polymer (P-29).

12) Polymer (P-30) was obtained in the same manner as with 11) described above with the exception that the amount of the initiator was adjusted.

13) Polymers (P-31) and (P-32) were each obtained in the same manner as with 8) with exception that 20 mol % of the monomer was replaced by 3,4-di-t-butoxystyrene and the amount of the initiator was adjusted.

14) Polymers obtained in the same manner as with 8) with the exception that the amount of the initiator was adjusted were each protected by a conventional method to produce polymers (P-33), (P-34) and (P-37) to (P-40), respectively.

15) Polymers (P-35), (P-36) and (P-41) to (P-44) were each obtained in the same manner as with 10) described above with the exception that the monomer was partially replaced and the amount of the initiator was adjusted.

(2) Acid Generating Agents

1) Synthesis of Tetramethylammonium Pentafluorobenzenesulfonate

Pentafluorobenzenesulfonyl chloride (25 g) was dissolved in 100 ml of methanol under ice cooling, and 100 g of a 25% aqueous solution of tetramethylammonium hydroxide was slowly added thereto, followed by stirring at room temperature for 3 hours. Thus, a solution of tetramethylammonium pentafluorobenzenesulfonate was obtained. This solution was used for salt interchange with a sulfonium salt and an iodonium salt.

2) Synthesis of Triphenylsulfonium Pentafluorobenzenesulfonate

Diphenyl sulfoxide (50 g) was dissolved in 800 ml of benzene, and 200 g of aluminum chloride was added thereto, followed by reflux for 24 hours. The reaction solution was slowly poured on 2 liters of ice, and 400 ml of concentrated hydrochloric acid was added thereto, followed by heating at 70° C. for 10 minutes. The resulting aqueous solution was washed with 500 ml of ethyl acetate, and filtered. Then, a solution of 200 g of ammonium iodide in 400 ml of water was added thereto. The powder precipitated was collected by filtration and washed with water, followed by washing with ethyl acetate and drying. Thus, 70 g of triphenylsulfonium iodide was obtained.

Triphenylsulfonium iodide (30.5 g) was dissolved in 1,000 ml of methanol, and 19.1 g of silver oxide was added thereto, followed by stirring at room temperature for 4 hours. The resulting solution was filtered, and a solution of tetramethylammonium pentafluorobenzenesulfonate was added thereto in excess. The reaction solution was concentrated, and dissolved in 500ml of dichloromethane. The resulting solution was washed with a 5% aqueous solution of tetramethylammonium hydroxide and water. The organic phase was dried over anhydrous sodium sulfate, and then concentrated to obtain triphenylsulfonium pentafluorobenzenesulfonate (I-1).

3) Synthesis of Di(4-t-amylphenyl)iodonium Pentafluorobenzenesulfonate t-Amylbenzene (60 g), 39.5 g of potassium iodate, 81 g of acetic anhydride and 170 ml of dichloromethane were mixed, and 66.8 g of concentrated sulfuric acid was slowly added dropwise thereto under ice cooling. After stirring for 2 hours under ice cooling, the mixture was stirred at room temperature for 10 hours. Then, 500 ml of water was added to the reaction solution under ice cooling, and the resulting solution was extracted with dichloromethane. The organic phase was washed with sodium hydrogencarbonate and water, and then concentrated to obtain di(4-t-amylphenyl) iodonium sulfate. The sulfate was added to an excess amount of a solution of tetramethylammonium pentafluorobenzenesulfonate. Then, 500 ml of water was added to the reacting solution, extracted with dichloromethane. The organic phase was washed with a 5% aqueous solution of tetramethylammonium hydroxide and water, and then concentrated to obtain di(4-t-amylphenyl)iodonium pentafluorobenzenesulfonate (III-1).

Other compounds can be synthesized by methods similar to the above.

(3) Crosslinking Agents

Synthesis of Crosslinking Agent [HM-1]

1-[α-Methyl-α-(4-hydroxyphenyl)ethyl]-4-[α,α-bis(4-hydroxyphenyl)ethyl]benzene (Trisp-PA, manufactured by Honshu Chemical Industry Co., Ltd.) (20 g) was added to a 10% aqueous solution of potassium hydroxide, and dissolved by stirring. Then, 60 ml of a 37% aqueous solution of formalin was slowly added to the solution with stirring at room temperature for 1 hour. After further stirring at room temperature for 6 hours, the solution was poured into a diluted aqueous solution of sulfuric acid. The precipitate was filtered and thoroughly washed with water, followed by recrystallization from 30 ml of methanol, thereby obtaining 20 g of a white powder of hydroxymethyl group-containing phenol derivative [HM-1] having the following structure. The purity thereof was 92% (measured by liquid chromatography).

(HM-1)

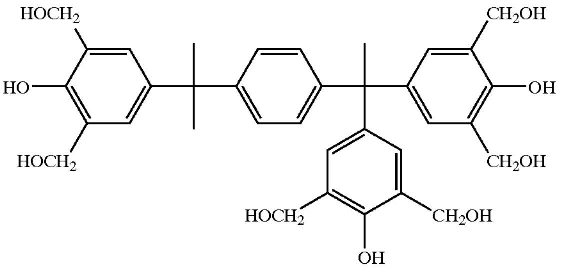

Synthesis of Crosslinking Agent [MM-1]

Hydroxymethyl group-containing phenol derivative [HM-1] (20 g) obtained in the above-mentioned synthesis example was added to 1 liter of methanol, and dissolved by heat stirring. Then, 1 ml of concentrated sulfuric acid was added to the resulting solution, followed by heat reflux for 12 hours. After the reaction was terminated, the reaction solution was cooled, and 2 g of potassium carbonate was added thereto. The resulting mixture was sufficiently concentrated, followed by addition of 300 ml of ethyl acetate. The solution was washed with water, and then concentrated to dryness, thereby obtaining 22 g of white solid of methoxymethyl group-containing phenol derivative [MM-1] having the following structure. The purity thereof was 90% (measured by liquid chromatography).

(MM-1)

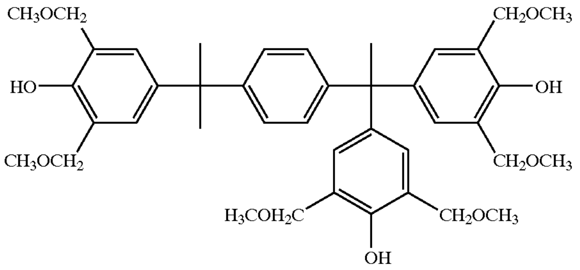

Further, phenol derivatives shown below were synthesized similarly.

(HM-2)

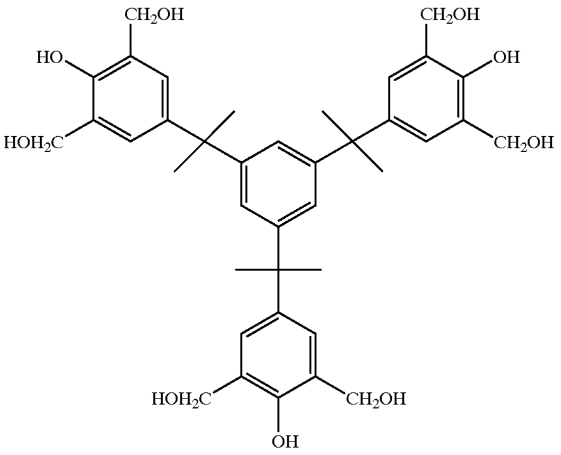

(MM-2)

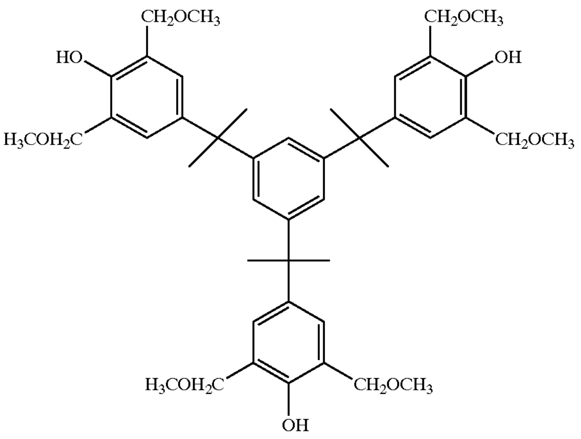

-continued (HM-3)

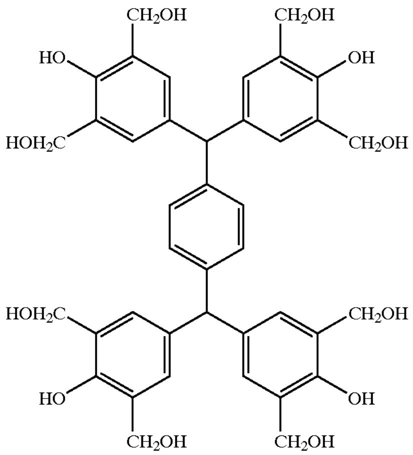

(MM-3)

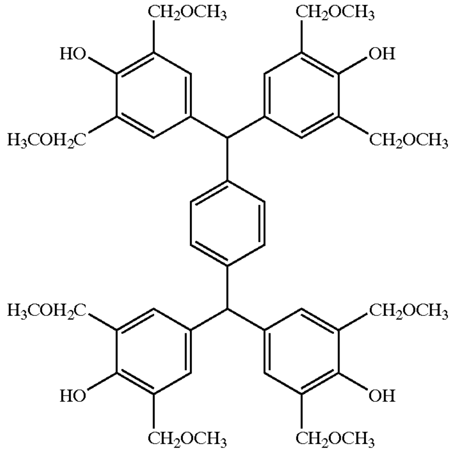

(HM-4)

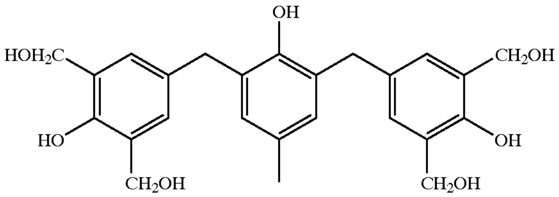

(MM-4)

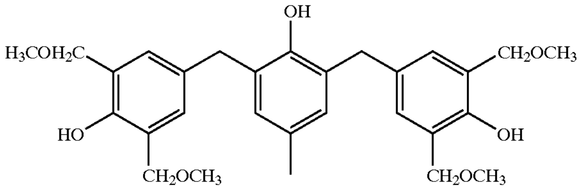

(MM-5)

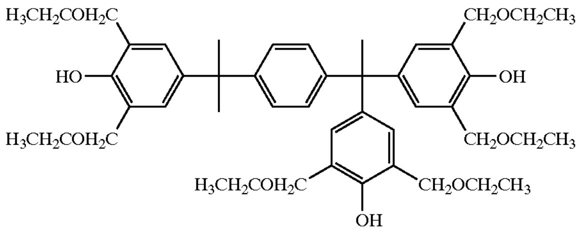

EXAMPLES

Examples 1 to 3

(1) Coating of Resists

Solutions of photoresist compositions shown in Tables 1 to 4 were prepared by using the compounds of the invention selected from the above-mentioned synthesis examples and compounds for comparison.

Each sample solution was filtered through a 0.1-μm filter, and then, applied onto a silicon wafer by use of a spin coater, followed by drying at 110° C. for 90 seconds on a vacuum suction type hot plate to obtain a resist film having a thickness of 0.3 μm. Thus, samples of Example 1 (Examples 1-1 to 1-18 and Comparative Examples 1 and 2) shown in Table 1, samples of Example 2 (Examples 2-1 to 2-18 containing organic basic compounds and fluorine or silicon surfactants) shown in Table 2, and samples of Example 3 (Examples 3-1 to 3-36 containing monodisperse alkali-soluble resins) shown in Tables 3 and 4 were obtained.

TABLE 1

<EXAMPLE 1>

| | Resin (1.05 g) | Acid Generating Agent (0.07 g) | Crosslinking Agent (0.28 g) | Solvent (8.5 g) |
|---|---|---|---|---|
| Example 1-1 | P-1 | I-1 | MM-1 | PGME |
| 1-2 | P-2 | I-4 | HM-1 | PGME |
| 1-3 | P-3 | I-7 | MM-2 | PGME |
| 1-4 | P-4 | I-9 | MM-3 | PGMEA |
| 1-5 | P-5 | II-1 | MM-4 | PGMEA |
| 1-6 | P-6 | II-3 | MM-1 | PGMEA |
| 1-7 | P-7 | II-5 | MM-5 | PGME |
| 1-8 | P-8 | III-1 | MM-2 | PGME |
| 1-9 | P-9 | III-3 | HM-1 | PGME |
| 1-10 | P-10 | III-7 | MM-3 | PGMEA |
| 1-11 | P-11 | I-1 | MM-4 | PGMEA |
| 1-12 | P-12 | I-4 | MM-1 | PGMEA |
| 1-13 | P-13 | I-7 | MM-3 | PGME |
| 1-14 | P-1 | PAG-1 | MM-4 | PGME |
| 1-15 | P-2 | PAG-2 | MM-1 | PGMEA |
| 1-16 | P-3 | I-4 | CL-1 | PGME |
| 1-17 | P-4 | III-1 | CL-2 | PGMEA |
| 1-18 | P-5 | PAG-2 | CL-2 | PGME |
| Comparative Example 1 | P-101 | PAG-1 | CL-2 | PGME |
| 2 | P-102 | PAG-2 | CL-1 | PGME |

TABLE 2

<EXAMPLE 2>

| Example | Resin (1.05 g) | Acid Generating Agent (0.07 g) | Cross-linking Agent (0.28 g) | Solvent (8.5 g) | Organic Basic Compound (0.002 g) | Surfactant (100 PPM*) |
|---|---|---|---|---|---|---|
| 2-1 | P-1 | I-1 | MM-1 | PGME | B-1 | W-1 |
| 2-2 | P-2 | I-4 | HM-1 | PGME | B-1 | W-1 |
| 2-3 | P-3 | I-7 | MM-2 | PGME | B-1 | W-1 |
| 2-4 | P-4 | I-9 | MM-3 | PGMEA | B-1 | W-1 |
| 2-5 | P-5 | II-1 | MM-4 | PGMEA | B-1 | W-1 |
| 2-6 | P-6 | II-3 | MM-1 | PGMEA | B-1 | W-1 |
| 2-7 | P-7 | II-5 | MM-5 | PGME | B-1 | W-1 |
| 2-8 | P-6 | III-1 | MM-2 | PGME | B-1 | W-1 |
| 2-9 | P-9 | III-3 | HM-1 | PGME | B-1 | W-1 |
| 2-10 | P-10 | III-7 | MM-3 | PGMEA | B-1 | W-1 |
| 2-11 | P-11 | I-1 | MM-4 | PGMEA | B-1 | W-1 |
| 2-12 | P-12 | I-4 | MM-1 | PGMEA | B-1 | W-1 |
| 2-13 | P-13 | I-7 | MM-3 | PGME | B-1 | W-1 |
| 2-14 | P-1 | PAG-1 | MM-4 | PGME | B-1 | W-1 |
| 2-15 | P-2 | PAG-2 | MM-1 | PGMEA | B-1 | W-1 |

TABLE 2-continued

<EXAMPLE 2>

| Example | Resin (1.05 g) | Acid Generating Agent (0.07 g) | Cross-linking Agent (0.28 g) | Solvent (8.5 g) | Organic Basic Compound (0.002 g) | Surfactant (100 PPM*) |
|---|---|---|---|---|---|---|
| 2-16 | P-3 | I-4 | CL-1 | PGME | B-1 | W-1 |
| 2-17 | P-4 | III-1 | CL-2 | PGMEA | B-1 | W-1 |
| 2-18 | P-5 | PAG-2 | CL-2 | PGME | B-1 | W-1 |

*Based on solid content.

TABLE 3

<EXAMPLE 3>

| Example | Resin (1.05 g) | Acid Generating Agent (0.07 g) | Cross-linking Agent (0.28 g) | Solvent (8.5 g) | Organic Basic Compound (0.002 g) | Surfactant (100 PPM*) |
|---|---|---|---|---|---|---|
| 3-1 | P-21 | I-1 | MM-1 | PGME | B-1 | W-1 |
| 3-2 | P-23 | I-4 | HM-1 | PGME | B-1 | W-1 |
| 3-3 | P-25 | I-7 | MM-2 | PGME | B-1 | W-1 |
| 3-4 | P-27 | I-9 | MM-3 | PGMEA | B-1 | W-1 |
| 3-5 | P-29 | II-1 | MM-4 | PGMEA | B-1 | W-1 |
| 3-6 | P-31 | II-3 | MM-1 | PGMEA | B-1 | W-1 |
| 3-7 | P-33 | II-5 | MM-5 | PGME | B-1 | W-1 |
| 3-9 | P-35 | III-1 | MM-2 | PGME | B-1 | W-1 |
| 3-9 | P-37 | III-3 | HM-1 | PGME | B-1 | W-1 |
| 3-10 | P-39 | III-7 | MM-3 | PGMEA | B-1 | W-1 |
| 3-11 | P-41 | I-1 | MM-4 | PGMEA | B-1 | W-1 |
| 3-12 | P-43 | I-4 | MM-1 | PGMEA | B-1 | W-1 |
| 3-13 | P-21 | I-7 | MM-3 | PGME | B-1 | W-1 |
| 3-14 | P-21 | PAG-1 | MM-4 | PGME | B-1 | W-1 |
| 3-15 | P-23 | PAG-2 | MM-1 | PGMEA | B-1 | W-1 |
| 3-16 | P-25 | I-4 | CL-1 | PGME | B-1 | W-1 |

TABLE 3-continued

<EXAMPLE 3>

| Example | Resin (1.05 g) | Acid Generating Agent (0.07 g) | Cross-linking Agent (0.28 g) | Solvent (8.5 g) | Organic Basic Compound (0.002 g) | Surfactant (100 PPM*) |
|---|---|---|---|---|---|---|
| 3-17 | P-27 | III-1 | CL-2 | PGMEA | B-1 | W-1 |
| 3-18 | P-29 | PAG-2 | CL-2 | PGME | B-1 | W-1 |

*Based on solid content.

TABLE 4

<EXAMPLE 3>

| Example | Resin (0.90 g) | Acid Generating Agent (0.07 g) | Cross-linking Agent (0.43 g) | Solvent (8.5 g) | Organic Basic Compound (0.002 g) | Surfactant (100 PPM*) |
|---|---|---|---|---|---|---|
| 3-19 | P-22 | I-1 | MM-1 | PGME | B-1 | W-1 |
| 3-20 | P-24 | I-4 | HM-1 | PGME | B-1 | W-1 |
| 3-21 | P-26 | I-7 | MM-2 | PGME | B-1 | W-1 |
| 3-22 | P-28 | I-9 | MM-3 | PGMEA | B-1 | W-1 |
| 3-23 | P-30 | II-1 | MM-4 | PGMEA | B-1 | W-1 |
| 3-24 | P-32 | II-3 | MM-1 | PGMEA | B-1 | W-1 |
| 3-25 | P-34 | II-5 | MM-5 | PGME | B-1 | W-1 |
| 3-26 | P-36 | III-1 | MM-2 | PGME | B-1 | W-1 |
| 3-27 | P-38 | III-3 | HM-1 | PGME | B-1 | W-1 |
| 3-28 | P-40 | III-7 | MM-3 | PGMEA | B-1 | W-1 |
| 3-29 | P-42 | I-1 | MM-4 | PGMEA | B-1 | W-1 |
| 3-30 | P-44 | I-4 | MM-1 | PGMEA | B-1 | W-1 |
| 3-31 | P-22 | I-7 | MM-3 | PGME | B-1 | W-1 |
| 3-32 | P-22 | PAG-1 | MM-4 | PGME | B-1 | W-1 |
| 3-33 | P-24 | PAG-2 | MM-1 | PGMEA | B-1 | W-1 |
| 3-34 | P-26 | I-4 | CL-1 | PGME | B-1 | W-1 |
| 3-35 | P-28 | III-1 | CL-2 | PGMEA | B-1 | W-1 |
| 3-36 | P-30 | PAG-2 | CL-2 | PGME | B-1 | W-1 |

*Based on solid content.

Abbreviations used in Tables 1 to 4 are as follows. Further, the resin compositions are represented by molar ratios.

<Resins>

| | | Mw | Mw/Mn |
|---|---|---|---|
| P-1 | 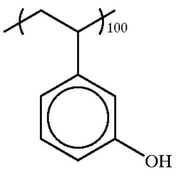 | 10,000 | 1.7 |
| P-2 | 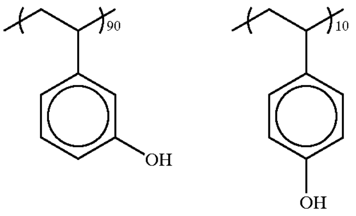 | 8,000 | 1.8 |

-continued
| | | Mw | Mw/Mn |
|---|---|---|---|
| P-3 | 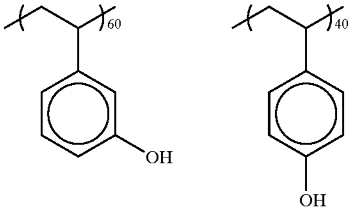 | 12,000 | 2.0 |
| P-4 | 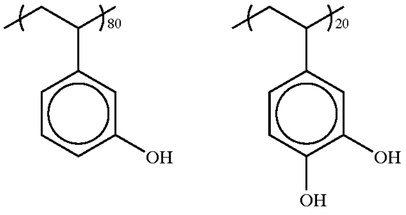 | 9,000 | 2.2 |
| P-5 | 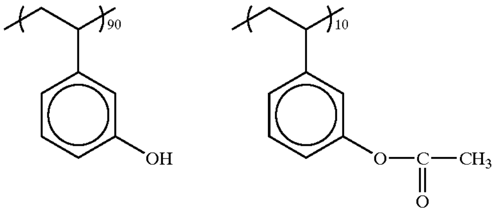 | 10,000 | 1.9 |
| P-6 | 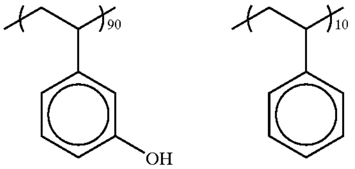 | 13,000 | 2.3 |
| P-7 | 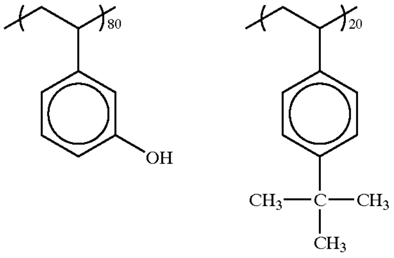 | 15,000 | 2.3 |
| P-8 | 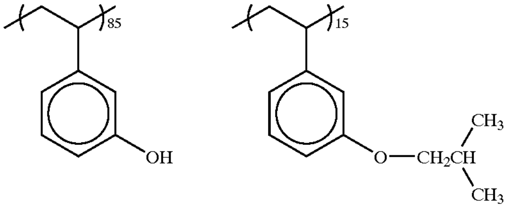 | 11,000 | 1.8 |
| P-9 | 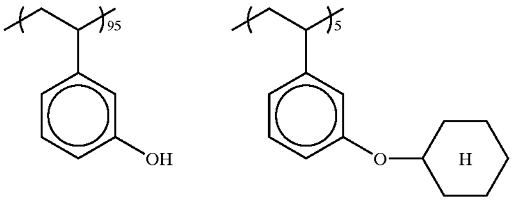 | 10,000 | 2.0 |

-continued
| | | Mw | Mw/Mn |
|---|---|---|---|
| P-10 | 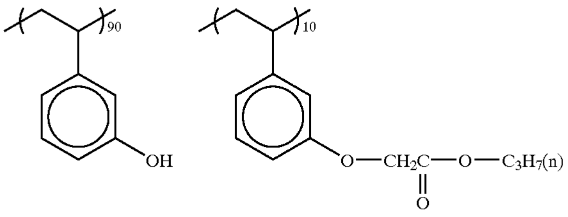 | 18,000 | 2.1 |
| P-11 | 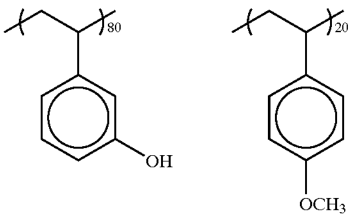 | 20,000 | 1.9 |
| P-12 | 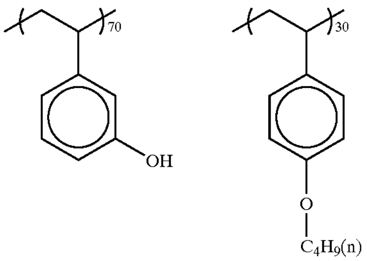 | 16,000 | 1.6 |
| P-13 | 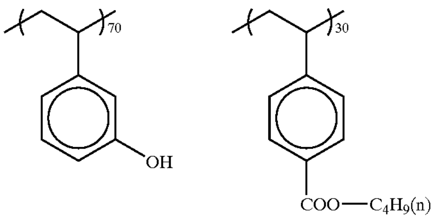 | 14,000 | 1.8 |
| P-21 | 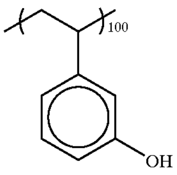 | 5,500 | 1.1 |
| P-22 | 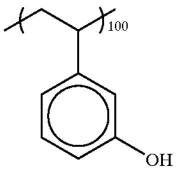 | 11,000 | 1.1 |
| P-23 | 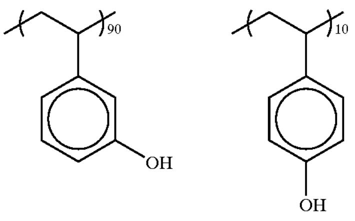 | 7,000 | 1.1 |

-continued
| | | | Mw | Mw/Mn |
|---|---|---|---|---|
| P-24 | 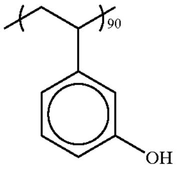 | 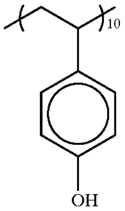 | 13,000 | 1.1 |
| P-25 | 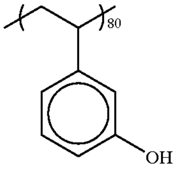 | 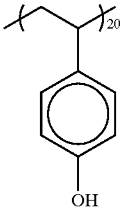 | 8,000 | 1.2 |
| P-26 | 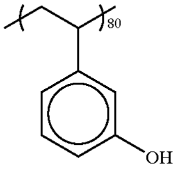 | 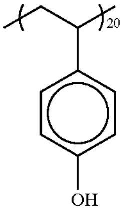 | 15,000 | 1.2 |
| P-27 | 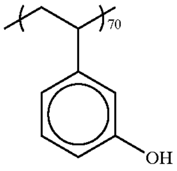 | 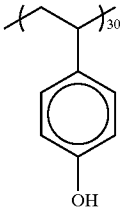 | 8,500 | 1.3 |
| P-28 | 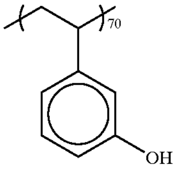 | 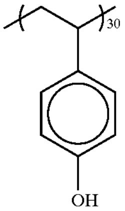 | 16,000 | 1.3 |
| P-29 | 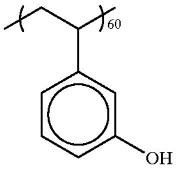 | 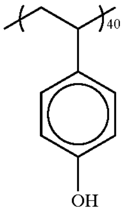 | 9,000 | 1.35 |
| P-30 | 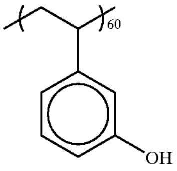 | 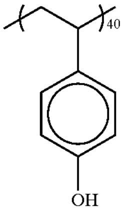 | 17,000 | 1.35 |

-continued
| | | Mw | Mw/Mn |
|---|---|---|---|
| P-31 | 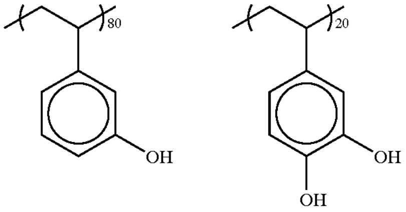 | 4,500 | 1.1 |
| P-32 | 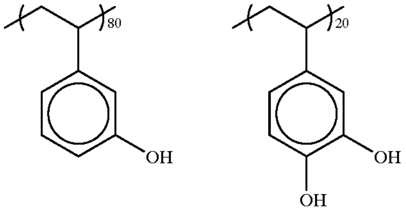 | 10,000 | 1.1 |
| P-33 | 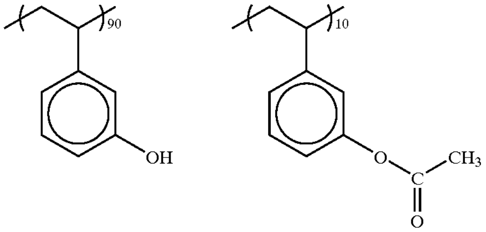 | 3,000 | 1.1 |
| P-34 | 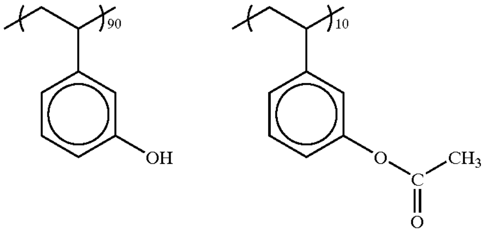 | 6,000 | 1.1 |
| P-35 | 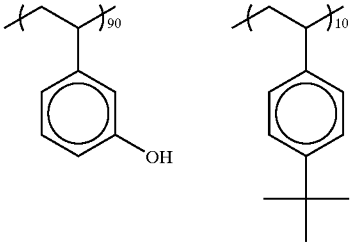 | 3,200 | 1.2 |
| P-36 | 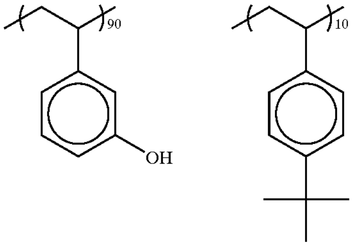 | 6,500 | 1.2 |

-continued
| | | Mw | Mw/Mn |
|---|---|---|---|
| P-37 | 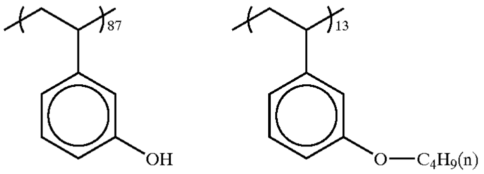 | 2,700 | 1.1 |
| P-38 | 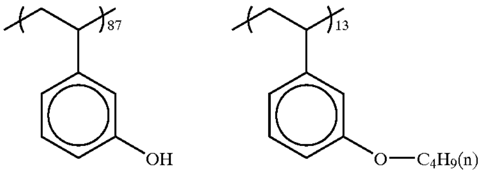 | 5,500 | 1.1 |
| P-39 | 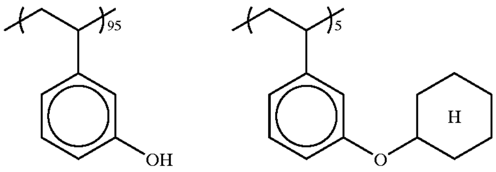 | 2,300 | 1.1 |
| P-40 | 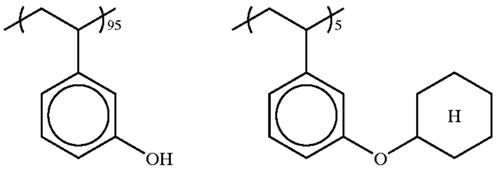 | 4,800 | 1.1 |
| P-41 | 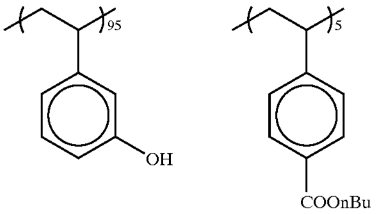 | 2,100 | 1.2 |
| P-42 | 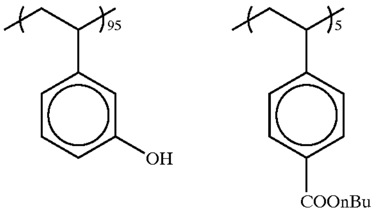 | 4,300 | 1.2 |
| P-43 | 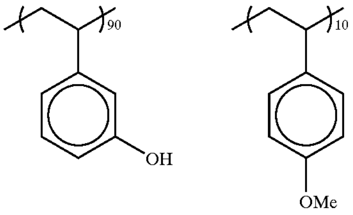 | 3,800 | 1.1 |

-continued

| | | Mw | Mw/Mn |
|---|---|---|---|
| P-44 | 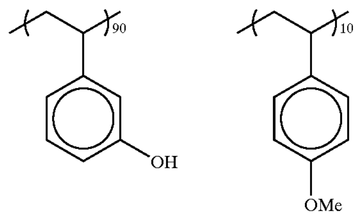 | 7,700 | 1.1 |

P-101:

Poly-(p-hydroxystyrene), Mw: 10,000, Mw/Mn: 1.4

P-102:

Novolak resin m-Cresol/p-cresol: 45/55 (molar ratio), Mw: 6500

<Photo Acid Generators>

PAG-1:

$Ph_3S^+$ $CF_3SO_3^-$

PAG-2:

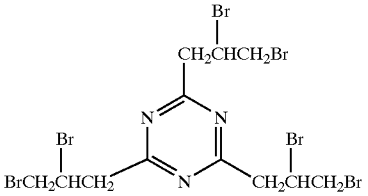

<Crosslinking Agents>

CL-1:

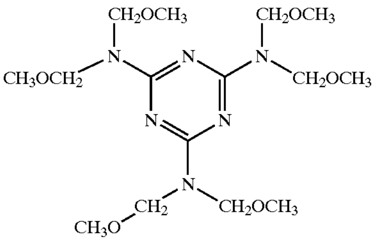

CL-2:

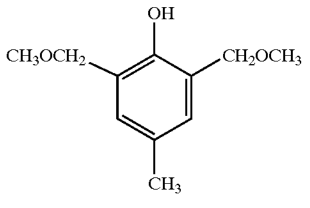

<Solvents>

PGME: Propylene glycol monomethyl ether

PGMEA: Propylene glycol monomethyl ether acetate

<Organic Basic Compounds>

B-1: 2,4,5-Triphenylimidazole

B-2: 1,5-Diazabicyclo[4.3.0]nona-5-ene

B-3: 4-Dimethylaminopyridine

B-4: 1,8-Diazabicyclo[5.4.0]undeca-7-ene

B-5: N-Cyclohexyl-N'-morpholinoethylthiourea

<Surfactants>

W-1: Troy Sol S-366 (manufactured by Troy Chemical Co., Ltd.)

W-2: Megafac F-176 (manufactured by Dainippon Ink & Chemicals, Inc.)

W-3: Megafac R08 (manufactured by Dainippon Ink & Chemicals, Inc.)

W-4: Polysiloxane Polymer KP-341 (manufactured by Shin-Etsu Chemical Co., Ltd.)

W-5: Surflon S-382 (manufactured by Asahi Glass Co., Ltd.)

(2) Preparation of Resist Patterns

The resist films were each irradiated using an electron beam lithography system (acceleration voltage: 50 KeV). After the irradiation, the resist films were each heated for 60 seconds on a vacuum suction type hot plat of 110° C., immersed in a 2.38% by weight aqueous solution of tetramethylammonium hydroxide (TMAH) for 60 seconds, rinsed with water for 30 seconds, and dried. The cross-sectional shape of the patterns thus obtained was observed under a scanning electron microscope.

(3) Evaluation of Sensitivity, Resolution, PCD Stability and PED Stability

The minimum dose in resolving 0.20-μm lines (line:space=1:1) was taken as the sensitivity, and the resolution limit at a dose at that time (lines were separated from spaces to resolve the lines) was taken as the resolution. When the 0.20-μm lines (line:space=1:1) were not resolved, the resolution limit was taken as the resolution, and the dose at that time was taken as the sensitivity.

A resist film formed by the method of the above (1) was allowed to stand in an electron beam lithography system for 60 minutes, and then, a resist pattern was formed by the method of (2). The minimum pattern size was determined which can be resolved at a dose identical to the minimum dose determined by the method of (3) (in this case, irradiation was conducted immediately after the formation of the resist film). When the difference between this size and the resolution limit obtained in (3) was within 3%, the resist film was evaluated as it passed the PCD stability test.

Further, a resist pattern was formed in the same manner as with (2) with the exception that a process of allowing a resist film to stand in an electron beam lithography system for 60 minutes was added after irradiation. The minimum pattern size was determined which can be resolved at a dose identical to the minimum dose determined by the method of (3) (in this case, irradiation was conducted immediately after the formation of the resist film). When the difference between this size and the resolution limit obtained in (3) was within 3%, the resist film was evaluated as it passed the PED stability test.

A resist which passed both the PCD stability test and the PED stability test was evaluated as A, a resist which passed only one of the PCD stability test and the PED stability test was evaluated as B, and a resist which did not pass both the PCD stability test and the PED stability test was evaluated as C.

Evaluation results of the resists shown in Tables 1 to 4 are shown in Tables 5 to 8, respectively.

TABLE 5

<EXAMPLE 1>

| | Sensitivity ($\mu C/cm^2$) | Resolution ($\mu m$) | Profile |
|---|---|---|---|
| Example 1-1 | 7 | 0.10 | Rectangular |
| 1-2 | 10 | 0.09 | Ditto |
| 1-3 | 12 | 0.12 | Ditto |
| 1-4 | 10 | 0.11 | Ditto |
| 1-5 | 14 | 0.11 | Ditto |
| 1-6 | 15 | 0.13 | Ditto |
| 1-7 | 13 | 0.12 | Ditto |
| 1-8 | 12 | 0.11 | Ditto |
| 1-9 | 15 | 0.11 | Ditto |
| 1-10 | 14 | 0.12 | Ditto |
| 1-11 | 16 | 0.13 | Ditto |
| 1-12 | 17 | 0.11 | Ditto |
| 1-13 | 14 | 0.11 | Ditto |
| 1-14 | 19 | 0.16 | slightly reverse tapered |
| 1-15 | 22 | 0.15 | Ditto |
| 1-16 | 20 | 0.16 | Ditto |
| 1-17 | 25 | 0.16 | Ditto |
| 1-18 | 26 | 0.18 | Ditto |
| Comparative Example 1 | 45 | 0.26 | Reverse tapered |
| 2 | 40 | 0.25 | Ditto |

TABLE 6

<EXAMPLE 2>

| | Sensitivity ($\mu C/cm^2$) | Resolution ($\mu m$) | Profile | PCD, PED Stability |
|---|---|---|---|---|
| Example 2-1 | 13 | 0.08 | Rectangular | A |
| 2-2 | 19 | 0.07 | Ditto | A |
| 2-3 | 23 | 0.10 | Ditto | A |
| 2-4 | 19 | 0.09 | Ditto | A |
| 2-5 | 27 | 0.09 | Ditto | A |
| 2-6 | 29 | 0.10 | Ditto | A |
| 2-7 | 25 | 0.10 | Ditto | A |
| 2-8 | 23 | 0.09 | Ditto | A |
| 2-9 | 29 | 0.09 | Ditto | A |
| 2-10 | 27 | 0.10 | Ditto | A |
| 2-11 | 30 | 0.10 | Ditto | A |
| 2-12 | 32 | 0.09 | Ditto | A |
| 2-13 | 27 | 0.09 | Ditto | A |
| 2-14 | 36 | 0.13 | Slightly reverse tapered | A |
| 2-15 | 42 | 0.12 | Ditto | A |
| 2-16 | 38 | 0.13 | Ditto | A |
| 2-17 | 48 | 0.13 | Ditto | A |
| 2-18 | 49 | 0.14 | Ditto | A |

TABLE 7

<EXAMPLE 3>

| | Sensitivity ($\mu C/cm^2$) | Resolution ($\mu m$) | Profile | PCD, PED Stability |
|---|---|---|---|---|
| Example 3-1 | 7 | 0.08 | Rectangular | A |
| 3-2 | 10 | 0.07 | Ditto | A |
| 3-3 | 12 | 0.10 | Ditto | A |
| 3-4 | 11 | 0.09 | Ditto | A |
| 3-5 | 12 | 0.09 | Ditto | A |
| 3-6 | 10 | 0.10 | Ditto | A |
| 3-7 | 13 | 0.10 | Ditto | A |
| 3-8 | 11 | 0.09 | Ditto | A |
| 3-9 | 10 | 0.09 | Ditto | A |
| 3-10 | 9 | 0.10 | Ditto | A |
| 3-11 | 10 | 0.10 | Ditto | A |
| 3-12 | 11 | 0.09 | Ditto | A |
| 3-13 | 12 | 0.09 | Ditto | A |
| 3-14 | 10 | 0.13 | Slightly reverse tapered | A |
| 3-15 | 9 | 0.12 | Ditto | A |
| 3-16 | 11 | 0.13 | Ditto | A |
| 3-17 | 12 | 0.13 | Ditto | A |
| 3-18 | 13 | 0.14 | Ditto | A |

TABLE 8

<EXAMPLE 3>

| | Sensitivity ($\mu C/cm^2$) | Resolution ($\mu m$) | Profile | PCD, PED Stability |
|---|---|---|---|---|
| Example 3-19 | 8 | 0.08 | Rectangular | A |
| 3-20 | 10 | 0.07 | Ditto | A |
| 3-21 | 12 | 0.10 | Ditto | A |
| 3-22 | 12 | 0.09 | Ditto | A |
| 3-23 | 11 | 0.09 | Ditto | A |
| 3-24 | 10 | 0.10 | Ditto | A |
| 3-25 | 12 | 0.10 | Ditto | A |
| 3-26 | 11 | 0.09 | Ditto | A |
| 3-27 | 10 | 0.09 | Ditto | A |
| 3-28 | 12 | 0.10 | Ditto | A |
| 3-29 | 11 | 0.10 | Ditto | A |
| 3-30 | 13 | 0.09 | Ditto | A |
| 3-31 | 9 | 0.09 | Ditto | A |
| 3-32 | 11 | 0.13 | Slightly reverse tapered | A |
| 3-33 | 13 | 0.12 | Ditto | A |
| 3-34 | 12 | 0.13 | Ditto | A |
| 3-35 | 11 | 0.13 | Ditto | A |
| 3-36 | 10 | 0.14 | Ditto | A |

(4) Description of Evaluation Results

The results of Tables 5 to 8 show that the resist composition using the alkali-soluble resin according to the invention, the crosslinking agent other than the preferred embodiments of the invention and the acid generating agent other than the agents represented by general formulas (I) to (III) [Example 1–18] is higher in sensitivity and resolution than the compositions using the alkali-soluble resins other than the resins of the invention, and the crosslinking agents and acid generating agents other than the preferred embodiments of the invention [Comparative Examples 1 and 2], and exhibits a rectangular profile, which shows that the resist composition of the invention has excellent properties. These effects are achieved under the conditions that the negative-working resist composition having the alkali-soluble resin according to the invention is irradiated with an electron beam or an X-ray, and have hitherto been unknown at all.

The compositions further containing the acid generating agents represented by general formulas (I) to (III) together with the alkali-soluble resins according to the invention [Examples 1-16 and 1-17] , or the compositions further containing the preferred embodiments of the crosslinking agents together with the alkali-soluble resins according to the invention [Examples 1-14 and 1-15] show more excellent sensitivity, resolution and profiles.

Further, it should be mentioned specially that the compositions each containing three of the alkali-soluble resin according to the invention, the preferred crosslinking agent and the preferred acid generating agent together [Examples 1-1 to 1-13] show particularly excellent sensitivity, resolution and profile performance. These reveal that the compositions each containing all of the alkali-soluble resin, acid generating agent and crosslinking agent according to the invention are particularly preferred, and exhibit extremely excellent performance.

Furthermore, Examples 2-1 to 2-18 show that the addition of the organic basic compounds and the surfactants achieves improvements in performance (PCD stability, PED stability and resolution).

In addition, Examples 3-1 to 3-36 indicate that the use of the monodisperse alkali-soluble resins significantly improves sensitivity, and that in that case, a molecular weight of 2,000 to 9,000 gives more excellent effects.

In Examples 1, 2 and 3, the organic basic compound B-1 was changed to B-2, B-3, B-4 and B-5. As a result, similar performance was obtained.

Further, in Examples 1, 2 and 3, the surfactant W-1 was changed to W-2, W-3, W-4 and W-5. As a result, similar performance was obtained.

Furthermore, in Examples 1, 2 and 3, the solvent was changed to propylene glycol monomethyl ether acetate/propylene glycol monomethyl ether (80/20 by weight ratio), leading to similar results.

Example 4

Each resist solution of Example 2 was applied onto an 8-inch silicon wafer and treated in the same manner as described above to obtain a resist coating film for measuring inplane uniformity. The thickness of this coating film was measured with Lambda A manufactured by Dainippon Screen Mfg. Co., Ltd. uniformly at 36 positions so as to form a cross along a diametric direction of the wafer. The case that three times the standard deviation of the measurements was less than 50 was evaluated as A, and 50 or more as C. Results thereof were all A.

Example 5

<Patterning by Equimultiple X-Ray Exposure>

Using the respective resist compositions of Example 2-1, and Comparative Examples 1 and 2, 0.40-μm thick resist films were obtained in the same manner as with Example 1. Then, patterning was carried out in the same manner as with Example 1 with the exception that an equimultiple X-ray exposure apparatus (gap value: 20nm) was used, and the resist performance (sensitivity, resolution and pattern shape) was evaluated in the same manner as with Example 1. Results of the evaluation are shown in Table 9.

TABLE 9

| Resist Composition | Sensitivity ($mJ/cm^2$) | Resolution (μm) | Pattern Shape |
|---|---|---|---|
| Example 2-1 | 100 | 0.09 | Rectangular |
| Comparative Example 1 | 170 | 0.20 | Tapered |
| Comparative Example 2 | 200 | 0.18 | Tapered |

The results shown in Table 9 reveal that the resist composition of the invention also exhibits extremely excellent performance in X-ray exposure.

[Synthesis Example 1 (Synthesis of Resin Example (1))]

n-Butyl lithium (0.004 mol)was added as a polymerization catalyst to 500 ml of dehydrated tetrahydrofuran. After cooling to −78° C., a solution of 35 g (0.20 mol) of 3-t-butoxystyrene in 20 ml of tetrahydrofuran, which was cooled to the same temperature, −78° C., was added thereto, followed by stirring for 1 hour. Then, 10 ml of methanol was added to the reaction solution to terminate the polymerization reaction. The resulting reaction solution was poured into methanol with stirring, thereby precipitating a white resin. After filtered and dried, the resin precipitated was dissolved in 300 ml of acetone, and 3 ml of 36% hydrochloric acid was added thereto, followed by heating and stirring at 60° C. for 8 hours. Then, the resulting solution was poured into 2 liters of ion-exchanged water with stirring, thereby precipitating a white resin. After washing with ion-exchanged water and drying under reduced pressure, 19.2 g of resin (1) of the invention. It was confirmed by NMR measurement that the structure of the resin corresponds to compound example (1). The measurement of the molecular weight by GPC gave a weight average molecular weight (Mw: converted to polystyrene) of 5,100 and a molecular weight distribution (Mw/Mn) of 1.1.

[Synthesis Example 2 (Synthesis of Resin Example (19))]

Resin (19) of the invention (18.6 g) was synthesized in the same manner as with Synthesis Example 1 with exception that 24.7 g (0.14 mol) of 3-t-butoxystyrene and 10.6 g (0.06 mol) of 4-t-butoxystyrene were used instead of 35 g of 3-t-butoxystyrene used in Synthes is Example 1. It was confirmed by NMR measurement that the structure of the resin corresponds to compound example (1). The measurement of the molecular weight by GPC gave a weight average molecular weight (Mw: converted to polystyrene) of 4,900 and a molecular weight distribution (Mw/Mn) of 1.1.

[Synthesis Example 3 (Synthesis of Resin Example (24))]

Resin (24) of the invention (19.6 g) was synthesized in the same manner as with Synthesis Example 1 with exception that 30 g (0.17 mol) of 3-t-butoxystyrene and 4.9 g (0.03 mol) of 3,4-dimethoxystyrene were used instead of 35 g of 3-t-butoxy-styrene used in Synthesis Example 1. It was confirmed by NMR measurement that the structure of the resin corresponds to compound example (1). The measurement of the molecular weight by GPC gave a weight average molecular weight (Mw: converted to polystyrene) of 4,500 and a molecular weight distribution (Mw/Mn) of 1.2.

[Synthesis Example 4 (Synthesis of Resin Example (35))]

Thirty grams (0.17 mol) of 3-t-butoxystyrene, 4.6 g (0.03 mol) of 1-vinylnaphthalene and 50 mg of a polymerization initiator, 2,2'-azobis(2,4-dimethylvaleronitrile (trade name: V-65, manufactured by Wako Pure Chemical Industries, Ltd.) were dissolved in 80 ml of 1-methoxy-2-propanol. The resulting solution was added dropwise to 20 ml of 1-methoxy-2-propanol heated at 70° C. with stirring in a stream of nitrogen for 2 hours. After 2 hours, 50 mg of the initiator was further added thereto, followed by further reaction for 2 hours. Then, the temperature of the reaction solution was elevated to 90° C., and stirring was continued for 1 hour. After allowed to cool, the reaction solution was poured into 1 liter of ion-exchanged water with vigorous stirring, thereby precipitating a white resin. After filtered and dried, the resin precipitated was dissolved in 300 ml of acetone, and 3 ml of 36% hydrochloric acid was added thereto, followed by heating and stirring at 60° C. for 8 hours. Then, the resulting solution was poured into 2 liters of ion-exchanged water with stirring, thereby precipitating a white resin. After washing with ion-exchanged water and drying under reduced pressure, the resin was dissolved in methanol, and reprecipitation with hexane was repeated twice to obtain 15.8 g of resin (35) of the invention. It was confirmed by NMR measurement that the structure of the resin corresponds to compound example (35). The measurement of the molecular weight by GPC gave a weight average molecular weight (Mw: converted to polystyrene) of 6,800 and a molecular weight distribution (Mw/Mn) of 1.3.

Examples 6 to 20 and Comparative Examples 3 and 4

(1) Coating of Resists

Resist compositions of the invention were prepared by dissolving components shown in Table 10 given below in 6.8 g of propylene glycol monomethyl ether acetate/1.7 g of propylene glycol monomethyl ether, and adding 0.01 g of triphenylimidazole and 0.01 g of Megafac R08 (manufactured by Dainippon Ink & Chemicals, Inc. as a surfactant.

Each sample solution was filtered through a 0. 1-μm teflon filter, and then, applied onto a silicon wafer treated with hexamethyldisilazane by use of a spin coater, followed by drying at 110° C. for 90 seconds on a vacuum close contact type hot plate to obtain a resist film having a thickness of 0.3 μm.

TABLE 10

| | Resin (1.05 g) | Acid Generating Agent (0.07 g) | Crosslinking Agent (0.18 g) |
|---|---|---|---|
| Example 6 | (1) | (PAG3-22) | MM-1 |
| Example 7 | (1) | (PAG4-7) | MM-2 |
| Example 6 | (1) | (PAG4-5)/(PAG4-7)=1/1 | MM-3 |
| Example 9 | (4) | (PAG3-21) | HM-1 |
| Example 10 | (8) | (PAG4-6) | MM-1 |
| Example 11 | (19) | (PAG4-7)/(PAG6-15)=1/1 | MM-1 |
| Example 12 | (20) | (PAG3-21)/(PAG4-7)=1/1 | MM-1 |
| Example 13 | (24) | (PAG3-21) | MM-4 |
| Example 14 | (25) | (PAG4-7)/(PAG5-7)=1/1 | MM-2 |
| Example 15 | (35) | (PAG4-7) | MM-4 |
| Example 16 | (40) | (PAG3-22) | MM-1 |
| Example 17 | (44) | (PAG4-7) | MM-1 |
| Example 18 | (52) | (PAG4-5)/(PAG4-7)=1/1 | HM-1 |
| Example 19 | (1) | (PAG4-7) | CL-1 |
| Example 20 | (1) | (PAG4-7)/(PAG6-15)=1/1 | CL-2 |
| Comparative Example 3 | Resin (a) | (PAG4-4) | MM-1 |
| Comparative Example 4 | Resin (b) | (PAG4-5) | CL-1 |

In Table 10, the composition (molar ratio) and the molecular weight of resins (4), (8), (19) (20), (24), (25), (35), (40), (44) and (52) are as follows, and resin (a) and resin (b) used in Comparative Examples 3 and 4 are as follows:

(4) : Mw = 5,500, Mw/Mn = 1.2
(8) : Mw = 6,400, Mw/Mn = 1.2
(19) : x/y = 70/30, Mw = 4,900, MW/Mn = 1.1
(20) : x/y = 85/15, Mw = 5,800, Mw/Mn = 1.1
(24) : x/y = 85/15, Mw = 4,500, Mw/Mn = 1.2
(25) : x/y = 85/15, Mw = 5,200, Mw/Mn = 1.2
(35) : x/y = 85/15, Mw = 6,800, Mw/Mn = 1.3
(40) : x/y = 80/20, Mw = 6,300, Mw/Mn = 1.1
(44) : x/y/z = 85/10/5, Mw = 4,600, Mw/Mn = 1.2
(52) : x/y = 80/20, Mw = 7,200, Mw/Mn = 1.3

Resin (a) in Comparative Example 3: Poly(3-hydroxystyrene) (structure example (1)), Mw=9,700, Mw/Mn=1.8

Resin (b) in Comparative Example 4: Poly(4-hydroxystyrene), Mw=5,900, Mw/Mn=1.1

When two kinds of acid generating agents are used in Table 10, ratios are by weight. The crosslinking agents MM-1 to MM-4, HM-1, CL-1 and CL-2 are described above.

(2) Preparation of Resist Patterns

The resist films were each irradiated using an electron beam lithography system (acceleration voltage: 50 KeV). After the irradiation, the resist films were each heated for 60 seconds on a vacuum suction type hot plat of 110° C., immersed in a 2.38% aqueous solution of tetramethylammonium hydroxide (TMAH) for 60 seconds, rinsed with water for 30 seconds, and dried. The cross-sectional shape of the patterns thus obtained was observed under a scanning electron microscope.

The irradiation energy in resolving 0.20-μm lines (line:space=1:1) was taken as the sensitivity, and the resolution limit at a dose at that time (lines were separated from spaces to resolve the lines) was taken as the resolution. When the 0.20-μm lines (line:space=1:1) were not resolved, the resolution limit was taken as the resolution, and the irradiation energy at that time was taken as the sensitivity.

Evaluation results thereof are shown in Table 11.

TABLE 11

| | Sensitivity (μC/cm$^2$) | Resolution (μm) | Profile |
|---|---|---|---|
| Example 6 | 6 | 0.09 | Rectangular |
| Example 7 | 6 | 0.09 | Ditto |
| Example 8 | 4 | 0.09 | Ditto |
| Example 9 | 6 | 0.10 | Ditto |
| Example 10 | 5 | 0.09 | Ditto |
| Example 11 | 5 | 0.09 | Ditto |
| Example 12 | 5 | 0.09 | Ditto |
| Example 13 | 4 | 0.09 | Ditto |
| Example 14 | 5 | 0.09 | Ditto |
| Example 15 | 4 | 0.10 | Ditto |
| Example 16 | 5 | 0.10 | Ditto |
| Example 17 | 5 | 0.10 | Ditto |
| Example 18 | 7 | 0.10 | Ditto |
| Example 19 | 5 | 0.10 | Ditto |
| Example 20 | 6 | 0.10 | Ditto |
| Comparative Example 3 | 15 | 0.12 | Slightly tapered |
| Comparative Example 4 | 24 | 0.25 | Tapered |

The results shown in Table 11 reveal that the negative-working resist compositions in which the compositions of the invention are combined are greatly excellent in sensitivity, and also improved in resolution and profiles, compared with the compositions of Comparative Examples.

Examples 21 to 25 and Comparative Example 5

Resist films prepared in the same manner as described above using the compositions of Examples 7, 12, 13, 15 and 16, and Comparative Example 4 were each irradiated at an acceleration voltage of 100 KeV using an electron beam lithography system. After the irradiation, the resist films were each heated, developed and rinsed in the same manner as with the above-mentioned example. The patterns thus obtained were observed under a scanning electron microscope. Results of the evaluation made in the same manner as with the above-mentioned example are shown in Table 12.

TABLE 12

| | Sensitivity ($\mu C/cm^2$) | Resolution ($\mu m$) | Profile |
|---|---|---|---|
| Example 21 | 10 | 0.07 | Rectangular |
| Example 22 | 9 | 0.08 | Ditto |
| Example 23 | 9 | 0.08 | Ditto |
| Example 24 | 9 | 0.08 | Ditto |
| Example 25 | 10 | 0.09 | Ditto |
| Comparative Example 5 | 42 | 0.22 | Tapered |

The results shown in Table 12 indicate that the negative-working resist compositions of the invention also exhibit good sensitivity and resolution in electron beam irradiation at high acceleration voltage, compared with the composition of Comparative Example 5.

According to the invention, the negative-working resist compositions for electron beams or X-rays excellent in sensitivity and resolution and having rectangular profiles even at high acceleration voltage can be provided.

While the invention has been described in detail and with reference to specific embodiments thereof, it will be apparent to one skilled in the art that various changes and modifications can be made therein without departing from the spirit and scope thereof.

What is claimed is:

1. A chemical amplification system negative-working resist composition for an electron beam and/or an X-ray comprising an alkali-soluble resin having structural units represented by the following general formula (a), a compound generating an acid by irradiation of the electron beam or the X-ray, a crosslinking agent which initiates crosslinking by the acid, and an organic basic compound:

(a)

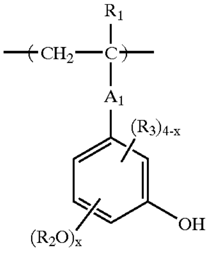

wherein $R_1$ represents a hydrogen atom, a halogen atom, a cyano group, or an alkyl, oxyalkyl or haloalkyl group which may have a substituent; X represents an integer of from 0 to 3; $R_2$ represents a hydrogen atom, or an alkyl, cycloalkyl, alkenyl, aralkyl, aryl or acyl group which may have a substituent, wherein when a plurality of $R_2$'s are present, they may be the same or different; $R_3$ represents a hydrogen atom, a halogen atom, a cyano atom, or an alkyl, cycloalkyl, alkenyl, aralkyl or aryl group which may have a substituent, wherein when a plurality of $R_3$'s are present, they may be the same or different; two of the plurality of $R_2$'s, two of the plurality of $R_3$'s, or $R_2$ and $R_3$ may combine with each other to form a ring; $A_1$ represents a single bond, or a divalent alkylene, alkenylene, cycloalkylene or arylene group which may have a substituent, or —O—, —$SO_2$—, —O—CO—$R_5$—, —CO—O—$R_6$— or —CO—N($R_7$)—$R_8$—, wherein $R_5$, $R_6$ and $R_8$, which may be the same or different, each represents a single bond, or a divalent alkylene, alkenylene, cycloalkylene or arylene group which may have an ether group, an ester group, an amido group, a urethane group or a ureido group and may further have a substituent, and $R_7$ represents a hydrogen atom, or an alkyl, cycloalkyl, aralkyl or aryl group which may have a substituent, wherein said crosslinking agent which initiates crosslinking by the acid is a phenol derivative having from 3 to 5 benzene ring atomic groups in its molecule and a molecular weight of 1200 or less, each of the benzene ring atomic groups having two or more hydroxymethyl groups and/or alkoxymethyl groups.

2. The negative-working resist composition according to claim 1, wherein the alkali-soluble resin is a resin containing structural units represented by the following general formula (1):

(1)

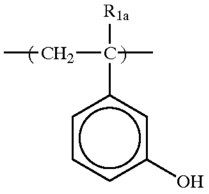

wherein $R_{1a}$ represents a hydrogen atom or a methyl group.

3. The negative-working resist composition according to claim 1, wherein the alkali-soluble resin is a resin represented by the following general formula (2):

(2)

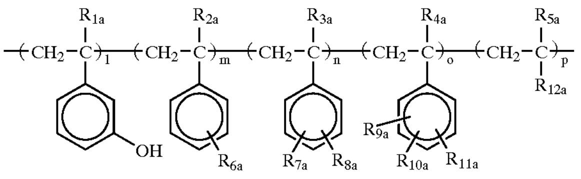

wherein $R_{1a}$ to $R_{5a}$ each independently represents a hydrogen atom or a methyl group; $R_{6a}$ to $R_{11a}$ each represents a hydrogen atom, an alkyl or alkoxyl group having from 1 to 4 carbon atoms, a hydroxyl group or —C(=O)O—$R_{14a}$, wherein $R_{14a}$ represents a hydrogen atom or an alkyl group having from 1 to 4 carbon atoms; $R_{12a}$ represents —$COOR_{15a}$, wherein $R_{15a}$ represents a hydrogen atom or an alkyl group having from 1 to 4 carbon atoms; and $0<l\leq 100$, $0\leq m,n,o,p<100$ and $l+m+n+o+p=100$.

4. The negative-working resist composition according to claim 1, wherein the radiation-sensitive acid generating agent contains at least one of compounds represented by the following general formulas (I) to (III):

(I)

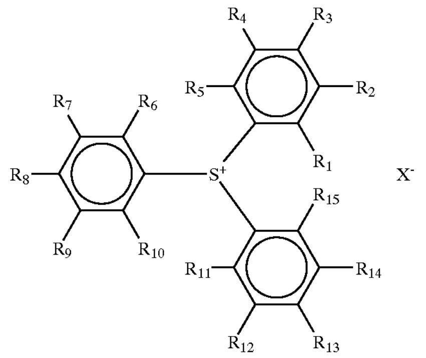

(II)

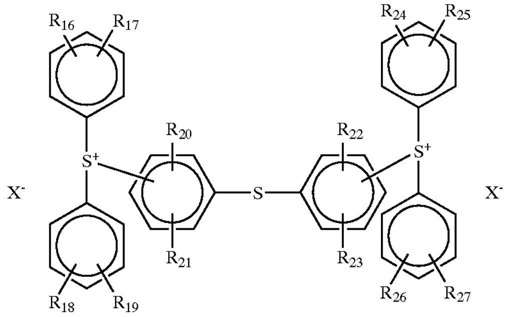

(III)

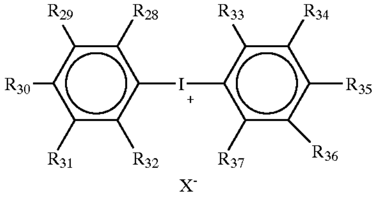

wherein $R_1$ to $R_{37}$ each represents a hydrogen atom, an alkyl group, an alkoxyl group, a hydroxyl group, a halogen atom or a group indicated by —S—$R_{38}$, wherein $R_{38}$ represents an alkyl group or an aryl group; $R_1$ to $R_{38}$ may be the same or different; for $R_1$ to $R_{15}$, two or more selected therefrom may be combined with each other directly at their ends or through an element selected from the group consisting of oxygen, sulfur and nitrogen to form a ring structure, for $R_{16}$ to $R_{27}$, a ring structure may also be formed similarly, and for $R_{28}$ to $R_{37}$, a ring structure may also be formed similarly; and $X^-$ represents an anion of an acid selected from the group consisting of benzenesulfonic acid, naphthalenesulfonic acid and anthracenesulfonic acid, or an acid having at least one organic group selected from the group consisting of an alkyl group, an alkoxyl group, an acyl group, an acyloxyl group, a sulfonyl group, a sulfonyloxy group, a sulfonylamino group, an aryl group, an aralkyl group and an alkoxycarbonyl group.

5. The chemical amplification system negative-working resist composition according to claim 4, wherein $X^-$ in the general formulas (I) to (III) is an anion of a benzenesulfonic acid, a naphthalenesulfonic acid or an anthracenesulfonic acid, each of which is substituted by at least one fluorine atom or a substituent containing at least one of fluorine atom.

6. The negative-working resist composition according to claim 1 which further comprises a fluorine and/or silicon surfactant.

7. The negative-working resist composition according to claim 1, wherein the alkali-soluble resin has a molecular weight distribution (Mw/Mn) of from 1.0 to 1.5.

8. The negative-working resist composition according to claim 1, wherein the alkali-soluble resin has a weight average molecular weight (Mw) of from 2000 to 9000.

9. The chemical amplification system negative-working resist composition according to claim 1, wherein the alkali-solution resin has a weight average molecular weight (Mw) of from 2,000 to 20,000.

10. The chemical amplification system negative-working resist according to claim 1, wherein the organic basic compound is a compound having a structure represented by the formulae (A), (B), (C), (D) or (E):

(A)

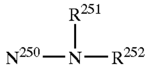

(B)

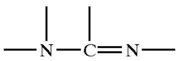

(C)

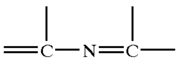

(D)

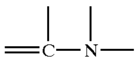

(E)

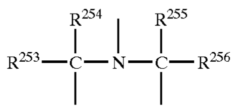

wherein $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, and $R^{251}$ and $R^{252}$ may combine with each other to form a ring, $R^{253}$, $R^{254}$, $R^{255}$ and $R^{256}$, which may be the same or different, each represents an alkyl group having 1 to 6 carbon atoms.

11. The chemical amplification system negative-working resist composition according to claim 1, wherein the organic basic compound is a nitrogen-containing basic compound that has two or more nitrogen atoms different in chemical environment in one molecule.

12. The chemical amplification system negative-working resist composition according to claim 1, wherein the organic basic compound is selected from the group consisting of (I) a compound comprising a substituted or unsubstituted amino group and a nitrogen atom-containing ring structure and (II) an alkylamino group-containing compound.

13. The chemical amplification system negative-working resist composition according to claim 1, wherein the organic basic compound is at least one compound selected from the group consisting of substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines.

14. The chemical amplification system negative-working resist composition according to claim 1, wherein the organic basic compound is at least one compound selected from the group consisting of guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methyl-pyridine, 3-aminoethylpyridine, 4-aminoethylpyridine, 3-aminopyrrolidine, piperazine, N-(2-aminoethyl)-piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)-morpholine.

15. The chemical amplification system negative-working resist composition according to claim 1, wherein the content of the structural unit represented by the formula (a) in the alkali-soluble resin is 60 mol % to 100 mol %.

16. A chemical amplification system negative-working resist composition for an electron beam and/or an X-ray comprising an alkali-soluble resin having structural units represented by the following general formula (a), a compound generating an acid by irradiation of the electron beam or the X-ray, a crosslinking agent which initiates crosslinking by the acid, and an organic basic compound:

(a)

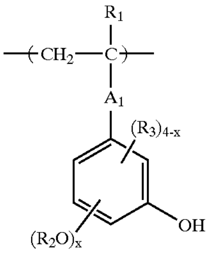

wherein $R_1$ represents a hydrogen atom, a halogen atom, a cyano group, or an alkyl, oxyalkyl or haloalkyl group which may have a substituent; X represents an integer of from 0 to 3; $R_2$ represents a hydrogen atom, or an alkyl, cycloalkyl, alkenyl, aralkyl, aryl or acyl group which may have a substituent, wherein when a plurality of $R_2$'s are present, they may be the same or different; $R_3$ represents a hydrogen atom, a halogen atom, a cyano atom, or an alkyl, cycloalkyl, alkenyl, aralkyl or aryl group which may have a substituent, wherein when a plurality of $R_3$'s are present, they may be the same or different; two of the plurality of $R_2$'s, two of the plurality of $R_3$'s, or $R_2$ and $R_3$ may combine with each other to form a ring; $A_1$ represents a single bond, or a divalent alkylene, alkenylene, cycloalkylene or arylene group which may have a substituent, or —O—, —$SO_2$—, —O—CO—$R_5$—, —CO—O—$R_6$— or —CO—N($R_7$)—$R_8$—, wherein $R_5$, $R_6$ and $R_8$, which may be the same or different, each represents a single bond, or a divalent alkylene, alkenylene, cycloalkylene or arylene group which may have an ether group, an ester group, an amido group, a urethane group or a ureido group and may further have a substituent, and $R_7$ represents a hydrogen atom, or an alkyl, cycloalkyl, aralkyl or aryl group which may have a substituent, wherein said organic basic compound is at least one compound selected from the group consisting of substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines.

17. The negative-working resist composition according to claim 16, wherein the alkali-soluble resin is a resin containing structural units represented by the following general formula (1):

(1)

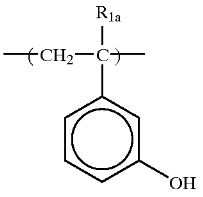

wherein $R_{1a}$ represents a hydrogen atom or a methyl group.

18. The negative-working resist composition according to claim 16, wherein the alkali-soluble resin is a resin represented by the following general formula (2):

(2)

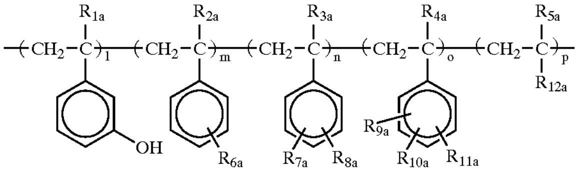

wherein $R_{1a}$ to $R_{5a}$ each independently represents a hydrogen atom or a methyl group; $R_{6a}$ to $R_{11a}$ each represents a hydrogen atom, an alkyl or alkoxyl group having from 1 to 4 carbon atoms, a hydroxyl group or —C(=O)O—$R_{14a}$, wherein $R_{14a}$ represents a hydrogen atom or an alkyl group having from 1 to 4 carbon atoms; $R_{12a}$ represents —$COOR_{15a}$, wherein $R_{15a}$ represents a hydrogen atom or an alkyl group having from 1 to 4 carbon atoms; and $0<l\leq 100$, $0\leq m,n,o,p<100$ and $l+m+n+o+p=100$.

19. The negative-working resist composition according to claim 16, wherein the radiation-sensitive acid generating agent contains at least one of compounds represented by the following general formulas (I) to (III):

(I)

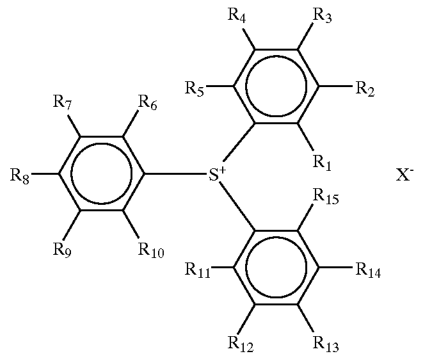

(II)

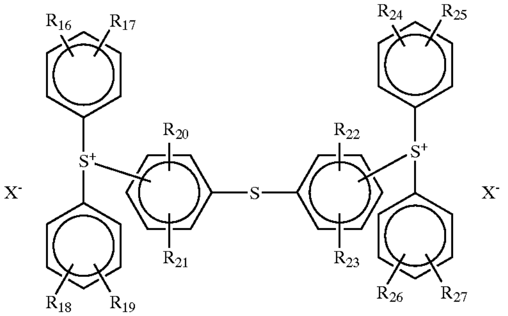

(III)

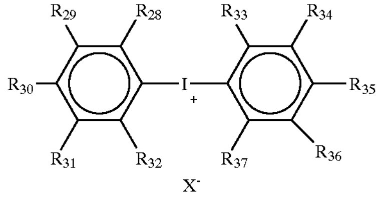

wherein $R_1$ to $R_{37}$ each represents a hydrogen atom, an alkyl group, an alkoxyl group, a hydroxyl group, a halogen atom or a group indicated by —S—$R_{38}$, wherein $R_{38}$ represents an alkyl group or an aryl group; $R_1$ to $R_{38}$ may be the same or different; for $R_1$ to $R_{15}$, two or more selected therefrom may be combined with each other directly at their ends or through an element selected from the group consisting of oxygen, sulfur and nitrogen to form a ring structure, for $R_{16}$ to $R_{27}$, a ring structure may also be formed similarly, and for $R_{28}$ to $R_{37}$, a ring structure may also be formed similarly; and $X^-$ represents an anion of an acid selected from the group consisting of benzenesulfonic acid, naphthalenesulfonic acid and anthracenesulfonic acid, or an acid having at least one organic group selected from the group consisting of an alkyl group, an alkoxyl group, an acyl group, an acyloxyl group, a sulfonyl group, a sulfonyloxy group, a sulfonylamino group, an aryl group, an aralkyl group and an alkoxycarbonyl group.

20. The chemical amplification system negative-working resist composition according to claim 19, wherein $X^-$ in the general formulas (I) to (III) is an anion of a benzenesulfonic acid, a naphthalenesulfonic acid or an anthracenesulfonic acid, each of which is substituted by at least one fluorine atom or a substituent containing at least one of fluorine atom.

21. The negative-working resist composition according to claim 16, wherein the crosslinking agent which initiates crosslinking by the acid is a phenol derivative having from 3 to 5 benzene ring atomic groups in its molecule and a molecular weight of 1200 or less, each of the benzene ring atomic groups having two or more hydroxymethyl groups and/or alkoxymethyl groups.

22. The negative-working resist composition according to claim 16, which further comprises a fluorine and/or silicon surfactant.

23. The negative-working resist composition according to claim 16 wherein the alkali-soluble resin has a molecular weight distribution (Mw/Mn) of from 1.0 to 1.5.

24. The negative-working resist composition according to claim 16, wherein the alkali-soluble resin has a weight average molecular weight (Mw) of from 2000 to 9000.

25. The chemical amplification system negative-working resist composition according to claim 16, wherein the alkali-solution resin has a weight average molecular weight (Mw) of from 2,000 to 20,000.

26. The chemical amplification system negative-working resist composition according to claim 16, wherein the organic basic compound is at least one compound selected from the group consisting of guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methyl-pyridine, 3-aminoethylpyridine, 4-aminoethylpyridine, 3-aminopyrrolidine, piperazine, N-(2-aminoethyl)-piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-i-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)-morpholine.

27. The chemical amplification system negative-working resist composition according to claim 16, wherein the content of the structural unit represented by the formula (a) in the alkali-soluble resin is 60 mol % to 100 mol %.

28. A chemical amplification system negative-working resist composition for an electron beam and/or an X-ray comprising an alkali-soluble resin having structural units represented by the following general formula (a), a compound generating an acid by irradiation of the electron beam or the X-ray, a crosslinking agent which initiates crosslinking by the acid, and an organic basic compound:

(a)

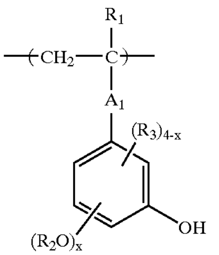

wherein $R_1$ represents a hydrogen atom, a halogen atom, a cyano group, or an alkyl, oxyalkyl or haloalkyl group which may have a substituent; X represents an integer of from 0 to 3; $R_2$ represents a hydrogen atom, or an alkyl, cycloalkyl, alkenyl, aralkyl, aryl or acyl group which may have a substituent, wherein when a plurality of $R_2$'s are present, they may be the same or different; $R_3$ represents a hydrogen atom, a halogen atom, a cyano atom, or an alkyl, cycloalkyl, alkenyl, aralkyl or aryl group which may have a substituent, wherein when a plurality of $R_3$'s are present, they may be the same or different; two of the plurality of $R_2$'s, two of the plurality of $R_3$'s, or $R_2$ and $R_3$ may combine with each other to form a ring; $A_1$ represents a single bond, or a divalent alkylene, alkenylene, cycloalkylene or arylene group which may have a substituent, or —O—, —$SO_2$—, —O—CO—$R_5$—, —CO—O—$R_6$— or —CO—$N(R_7)$—$R_8$—, wherein $R_5$, $R_6$ and $R_8$, which may be the same or different, each represents a single bond, or a divalent alkylene, alkenylene, cycloalkylene or arylene group which may have an ether group, an ester group, an amido group, a urethane group or a ureido group and may further have a substituent, and $R_7$ represents a hydrogen atom, or an alkyl, cycloalkyl, aralkyl or aryl group which may have a substituent, wherein said compound capable of generating an acid by irradiation of the electron beam or the X-ray is selected from the group consisting of the following general formulas (I), (II) and (III):

(I)

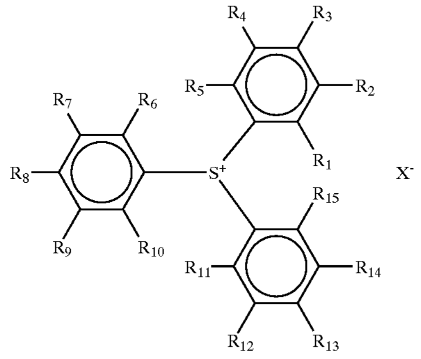

(II)

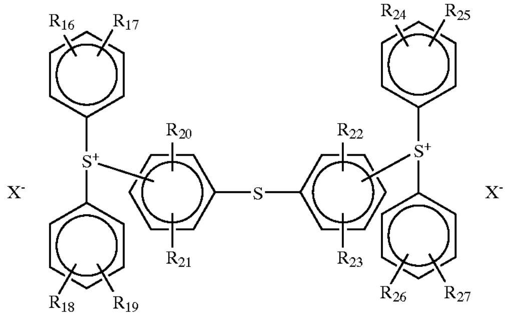

(III)

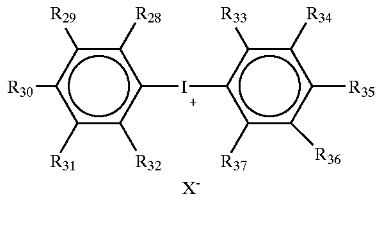

wherein $R_1$ to $R_{37}$ each represents a hydrogen atom, an alkyl group, an alkoxyl group, a hydroxyl group, a halogen atom or a group indicated by —S—$R_{38}$, wherein $R_{38}$ represents an alkyl group or an aryl group; $R_1$ to $R_{38}$ may be the same or different; for $R_1$ to $R_{15}$, two or more selected therefrom may be combined with each other directly at their ends or through an element selected from the group consisting of oxygen, sulfur and nitrogen to form a ring structure, for $R_{16}$ to $R_{27}$, a ring structure may also be formed similarly, and for $R_{28}$ to $R_{37}$, a ring structure may also be formed similarly; and $X^-$ represents an anion of a benzenesulfonic acid, a naphthalenesulfonic acid or an anthracenesulfonic acid, each of which is substituted by at least one fluorine atom or a substituent containing at least one of fluorine atom.

29. The negative-working resist composition according to claim 28, wherein the alkali-soluble resin is a resin containing structural units represented by the following general formula (1):

(1)

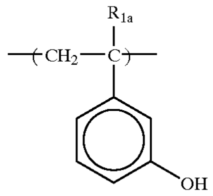

wherein $R_{1a}$ represents a hydrogen atom or a methyl group.

30. The negative-working resist composition according to claim 28, wherein the alkali-soluble resin is a resin represented by the following general formula (2):

(2)

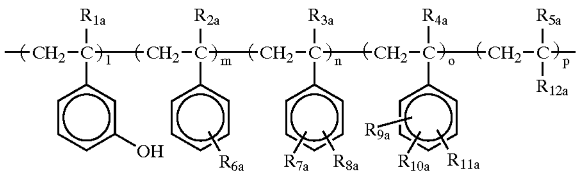

wherein $R_{1a}$ to $R_{5a}$ each independently represents a hydrogen atom or a methyl group; $R_{6a}$ to $R_{11a}$ each represents a hydrogen atom, an alkyl or alkoxyl group having from 1 to 4 carbon atoms, a hydroxyl group or —C(=O)O—$R_{14a}$, wherein $R_{14a}$ represents a hydrogen atom or an alkyl group having from 1 to 4 carbon atoms; $R_{12a}$ represents —$COOR_{15a}$, wherein $R_{15a}$ represents a hydrogen atom or an alkyl group having from 1 to 4 carbon atoms; and $0<l\leq 100$, $0\leq m,n,o,p<100$ and $l+m+n+o+p=100$.

31. The negative-working resist composition according to claim 28, wherein the crosslinking agent which initiates crosslinking by the acid is a phenol derivative having from 3 to 5 benzene ring atomic groups in its molecule and a molecular weight of 1200 or less, each of the benzene ring atomic groups having two or more hydroxymethyl groups and/or alkoxymethyl groups.

32. The negative-working resist composition according to claim 28 which further comprises a fluorine and/or silicon surfactant.

33. The negative-working resist composition according to claim 28, wherein the alkali-soluble resin has a molecular weight distribution (Mw/Mn) of from 1.0 to 1.5.

34. The negative-working resist composition according to claim 28, wherein the alkali-soluble resin has a weight average molecular weight (Mw) of from 2000 to 9000.

35. The chemical amplification system negative-working resist composition according to claim 28, wherein the alkali-solution resin has a weight average molecular weight (Mw) of from 2,000 to 20,000.

36. The chemical amplification system negative-working resist according to claim 28, wherein the organic basic compound is a compound having a structure represented by the formulae (A), (B), (C), (D) or (E):

(A)

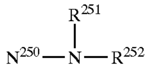

(B)

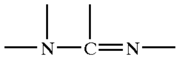

(C)

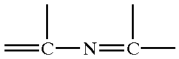

(D)

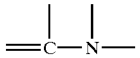

(E)

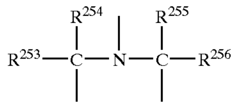

wherein $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, and $R^{251}$ and $R^{252}$ may combine with each other to form a ring, $R^{253}$, $R^{254}$, $R^{255}$ and $R^{256}$, which may be the same or different, each represents an alkyl group having 1 to 6 carbon atoms.

37. The chemical amplification system negative-working resist composition according to claim 28, wherein the organic basic compound is a nitrogen-containing basic compound that has two or more nitrogen atoms different in chemical environment in one molecule.

38. The chemical amplification system negative-working resist composition according to claim 28, wherein the organic basic compound is selected from the group consisting of (I) a compound comprising a substituted or unsubstituted amino group and a nitrogen atom-containing ring structure and (II) an alkylamino group-containing compound.

39. The chemical amplification system negative-working resist composition according to claim 28, wherein the organic basic compound is at least one compound selected from the group consisting of substituted or unsubstituted guanidine, substituted or unsubstituted aminopyridine, substituted or unsubstituted aminoalkylpyridines, substituted or unsubstituted aminopyrrolidine, substituted or unsubstituted indazole, imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholines.

40. The chemical amplification system negative-working resist composition according to claim 28, wherein the organic basic compound is at least one compound selected from the group consisting of guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methyl-pyridine, 3-aminoethylpyridine, 4-aminoethylpyridine, 3-aminopyrrolidine, piperazine, N-(2-aminoethyl)-piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)-morpholine.

41. The chemical amplification system negative-working resist composition according to claim 28, wherein the content of the structural unit represented by the formula (a) in the alkali-soluble resin is 60 mol % to 100 mol %.

* * * * *